(12) United States Patent
Shimanuki et al.

(10) Patent No.: US 7,459,347 B2
(45) Date of Patent: Dec. 2, 2008

(54) MANUFACTURING METHOD OF A SEMICONDUCTOR DEVICE

(75) Inventors: Yoshihiko Shimanuki, Nanyo (JP); Masayuki Suzuki, Nanyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/213,779

(22) Filed: Jun. 24, 2008

(65) Prior Publication Data

US 2008/0268578 A1    Oct. 30, 2008

Related U.S. Application Data

(63) Continuation of application No. 10/902,785, filed on Aug. 2, 2004, now Pat. No. 7,407,834, which is a continuation of application No. 10/091,302, filed on Mar. 6, 2002, now abandoned.

(30) Foreign Application Priority Data

May 11, 2001    (JP)    ............................ 2001-142164
Jan. 11, 2002    (JP)    ............................ 2002-004435

(51) Int. Cl.
*H01L 21/00*    (2006.01)
(52) U.S. Cl. .................. 438/123; 438/111; 257/E21.51
(58) Field of Classification Search .............. 438/121, 438/123, 111, 112; 257/E21.51
See application file for complete search history.

(56) References Cited

U.S. PATENT DOCUMENTS

| | | | |
|---|---|---|---|
| 5,547,530 | A | 8/1996 | Nakamura et al. |
| 5,587,392 | A | 12/1996 | Murakami et al. |
| 5,656,550 | A | 8/1997 | Tsuji et al. |
| 5,828,128 | A | 10/1998 | Higashiguchi et al. |
| 6,001,671 | A | 12/1999 | Fjelstad |
| 6,238,952 | B1 | 5/2001 | Lin |
| 6,245,490 | B1 | 6/2001 | Yoon et al. |
| 6,261,864 | B1 | 7/2001 | Jung et al. |
| 6,294,830 | B1 | 9/2001 | Fjelstad |
| 6,498,099 | B1 | 12/2002 | McLellan et al. |
| 6,498,393 | B2 | 12/2002 | Fujimoto et al. |

(Continued)

FOREIGN PATENT DOCUMENTS

JP    2000-216280    1/1999

(Continued)

*Primary Examiner*—David A Zarneke
(74) *Attorney, Agent, or Firm*—Reed Smith LLP; Stanley P. Fisher, Esq.; Juan Carlos A. Marquez, Esq.

(57) ABSTRACT

A non-leaded resin-sealed semiconductor device is manufactured by the steps of providing a conductive flat substrate (metal plate) of copper plate or the like, fixing semiconductor elements respectively to predetermined positions on the principal surface of the substrate by an insulating adhesive, electrically connecting electrodes on the surfaces of the semiconductor elements with predetermined partition parts of the substrate separate from the semiconductor elements by conductive wires, forming an insulating resin layer on the principal surface of the substrate to cover the semiconductor elements and wires, selectively removing the substrate from the rear of said substrate to form electrically independent partition parts whereof at least some are external electrode terminals, and selectively removing said resin layer to fragment the device into regions containing the semiconductor elements and the plural partition parts around the semiconductor elements. Thus, there is provided a compact non-leaded semiconductor device having a large number of electrode terminals.

4 Claims, 69 Drawing Sheets

U.S. PATENT DOCUMENTS

| | | |
|---|---|---|
| 6,531,370 B2 | 3/2003 | Sakamoto et al. |
| 6,548,328 B1 | 4/2003 | Sakamoto et al. |
| 6,562,660 B1 | 5/2003 | Sakamoto et al. |
| 6,667,541 B1 | 12/2003 | Minamio et al. |
| 6,812,552 B2 | 11/2004 | Islan et al. |
| 2001/0026014 A1 | 10/2001 | Sakamoto et al. |

FOREIGN PATENT DOCUMENTS

| | | |
|---|---|---|
| JP | 2000-286376 | 3/1999 |

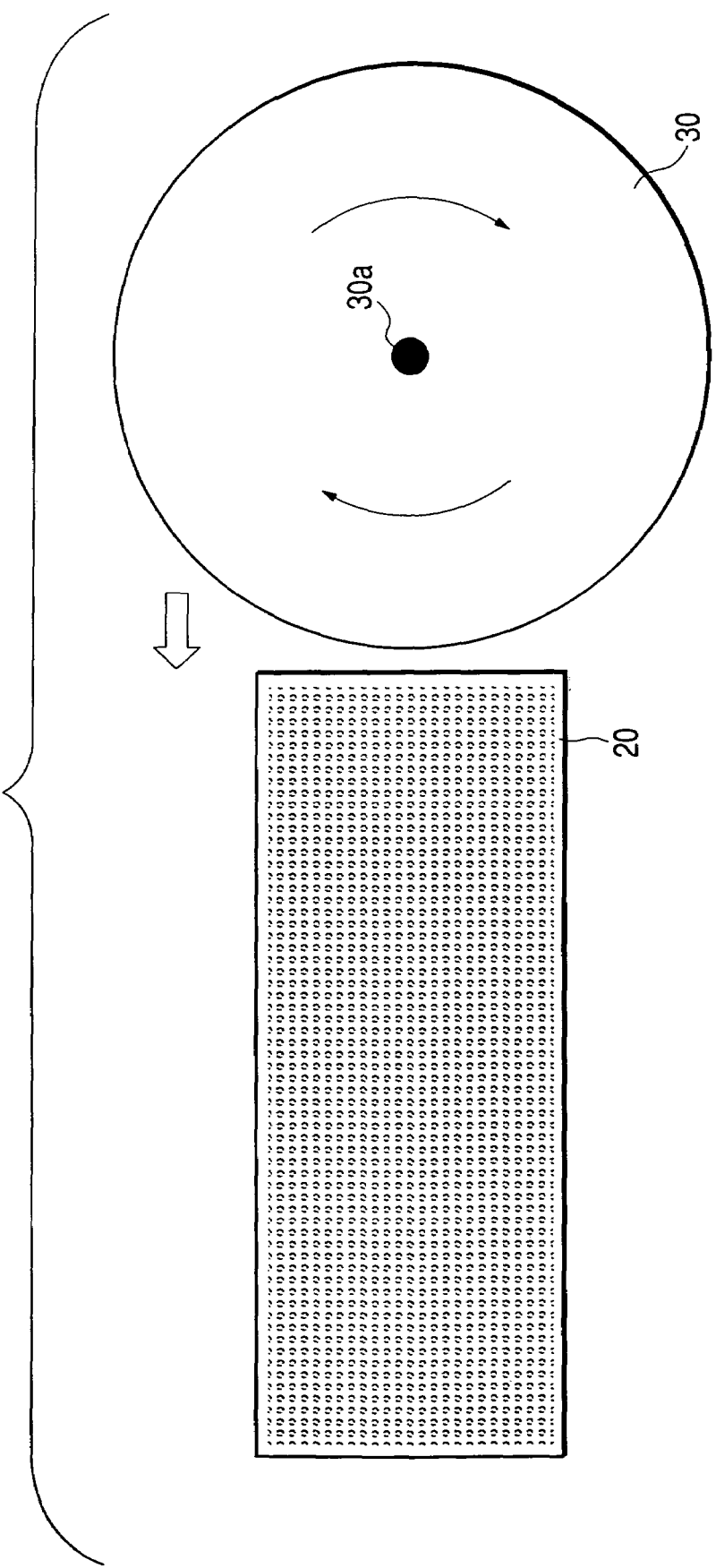

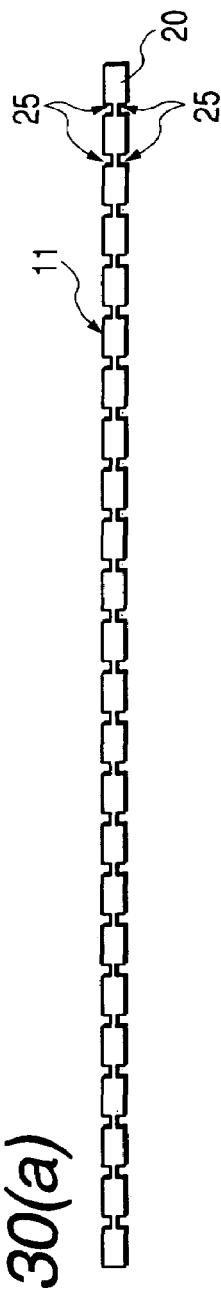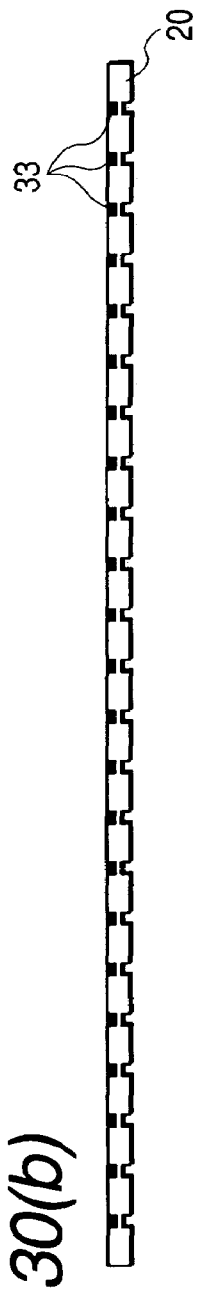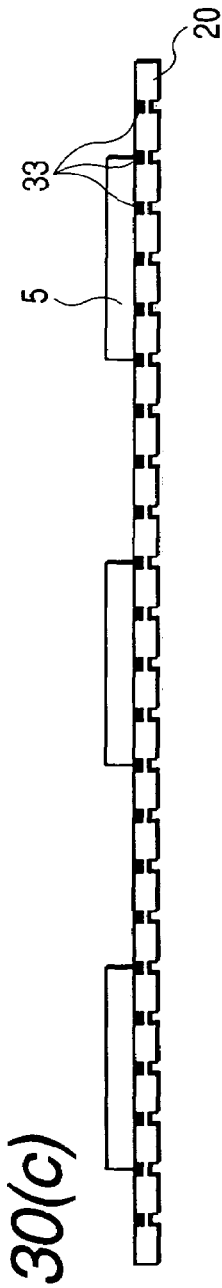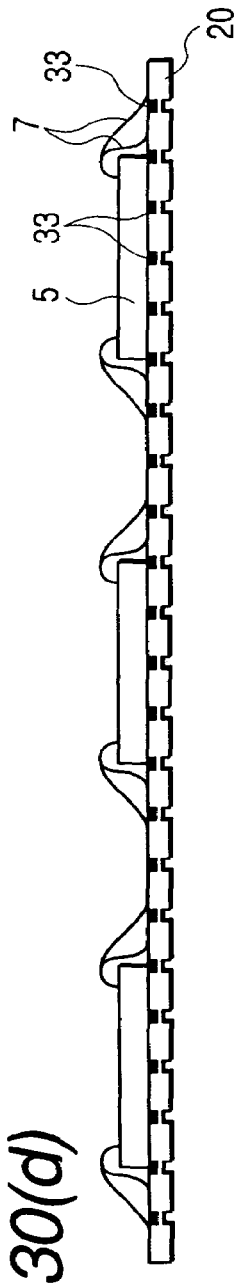
FIG. 30(a)
FIG. 30(b)
FIG. 30(c)
FIG. 30(d)

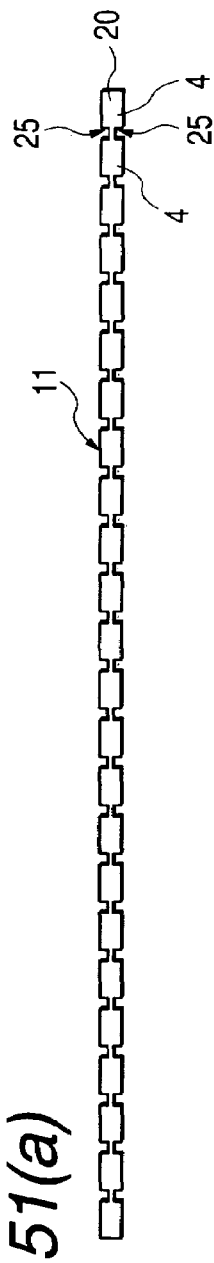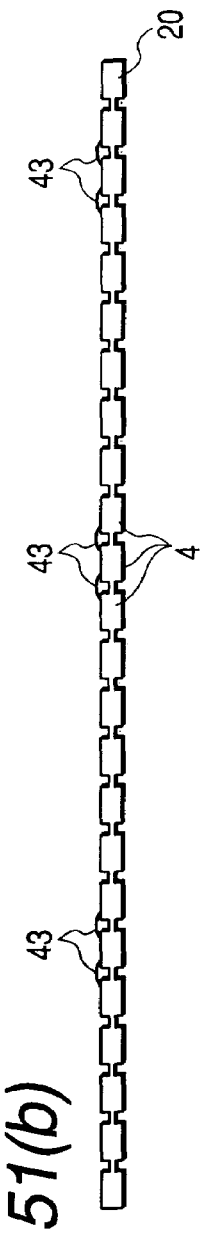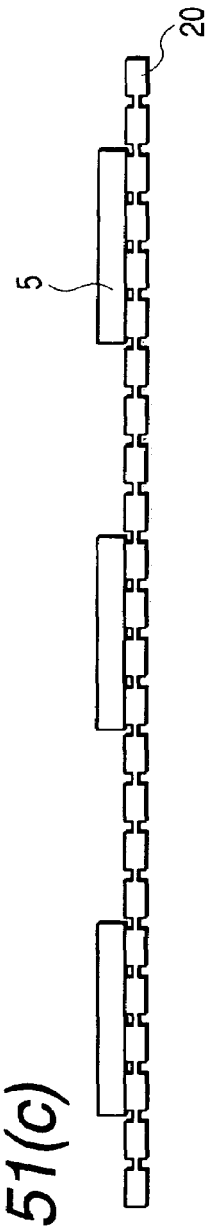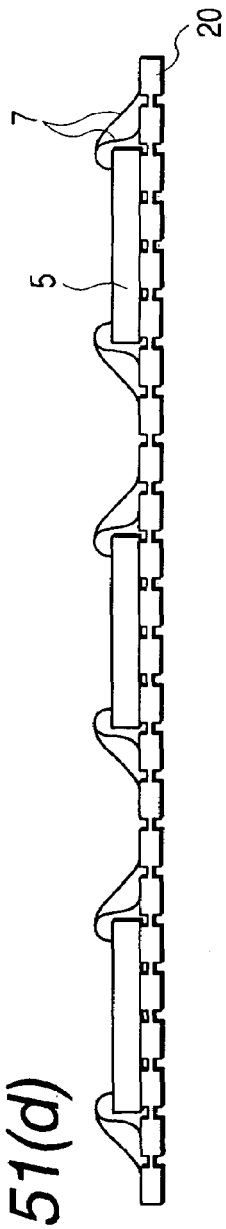

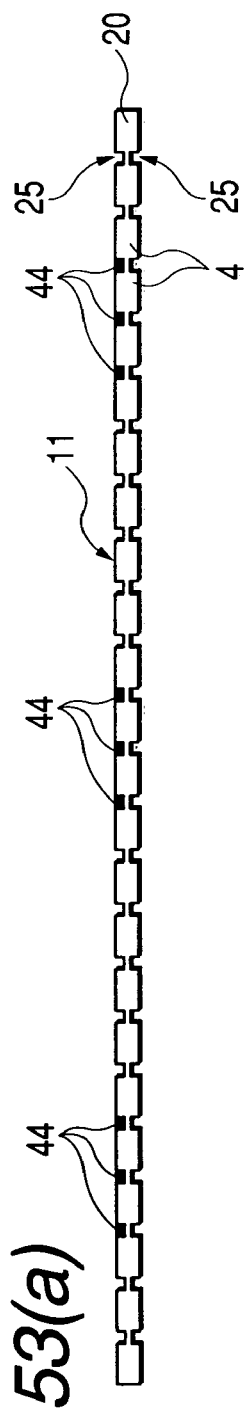
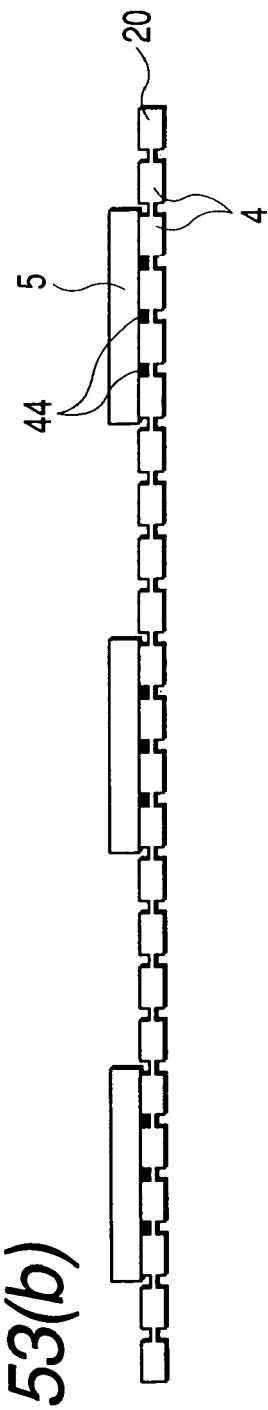
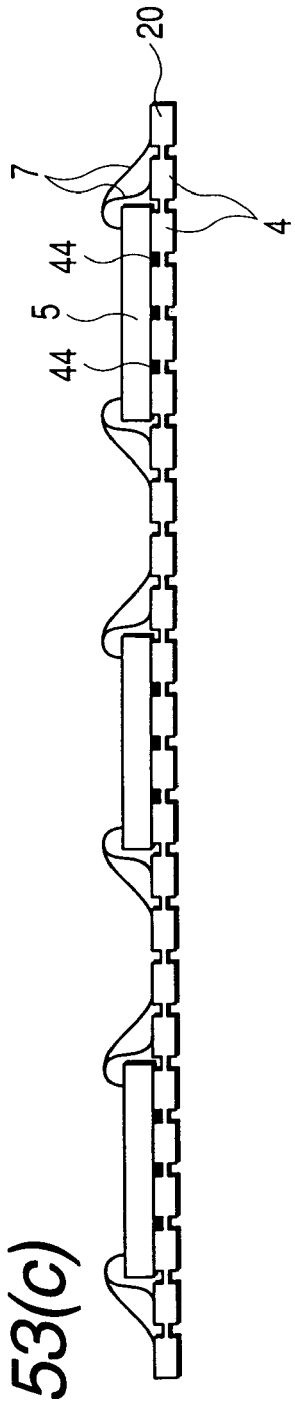
FIG. 53(a)
FIG. 53(b)
FIG. 53(c)

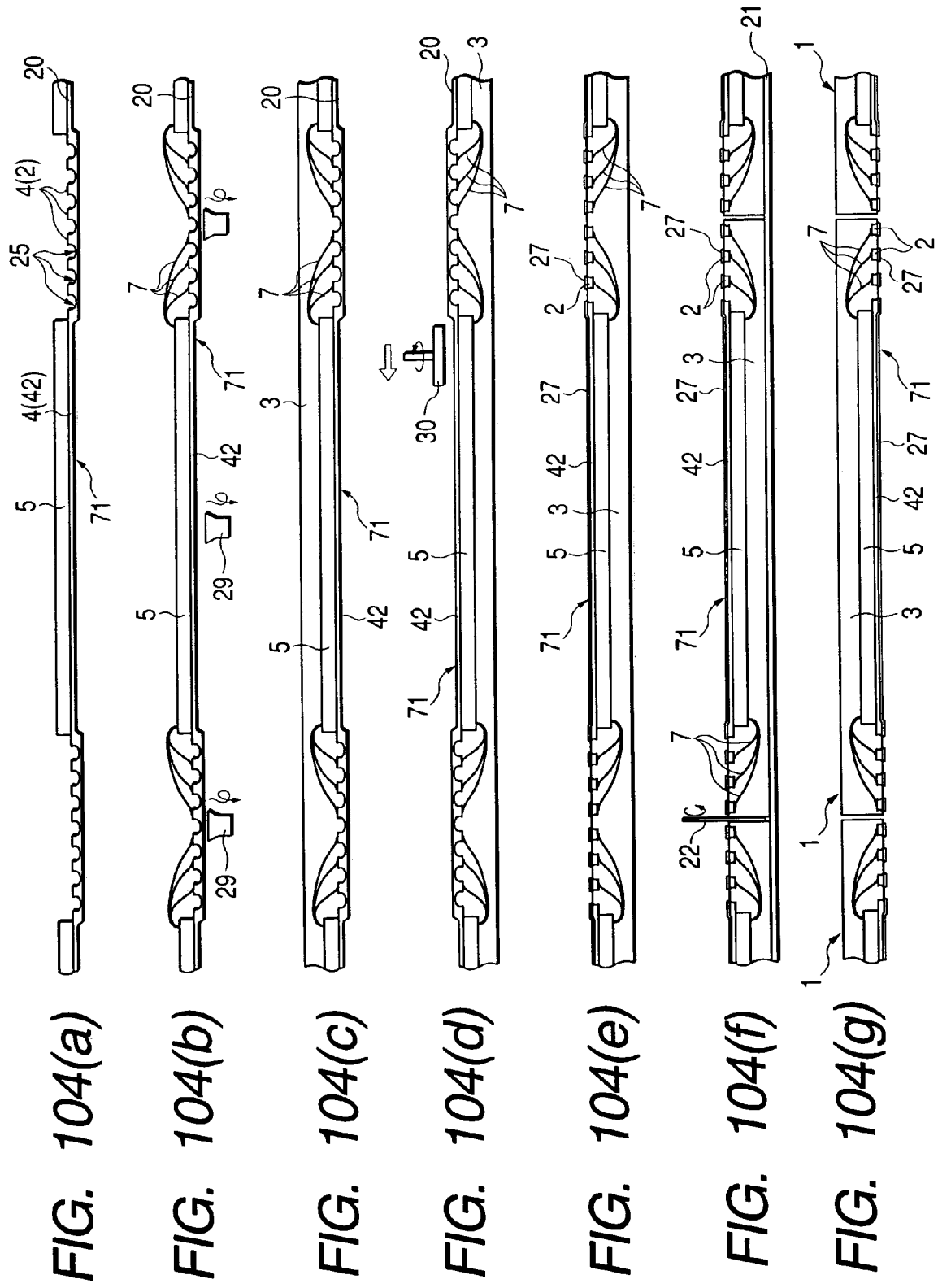

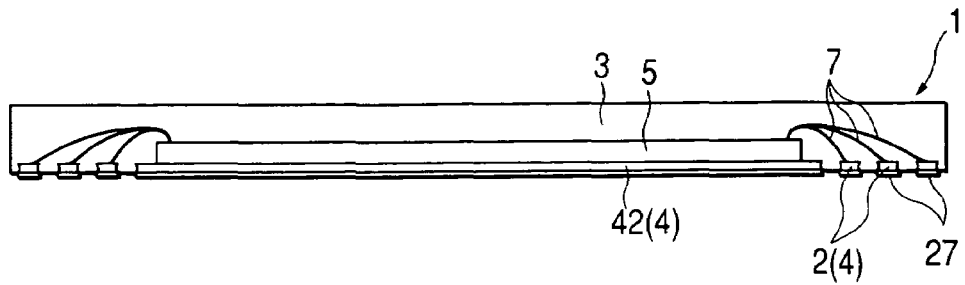
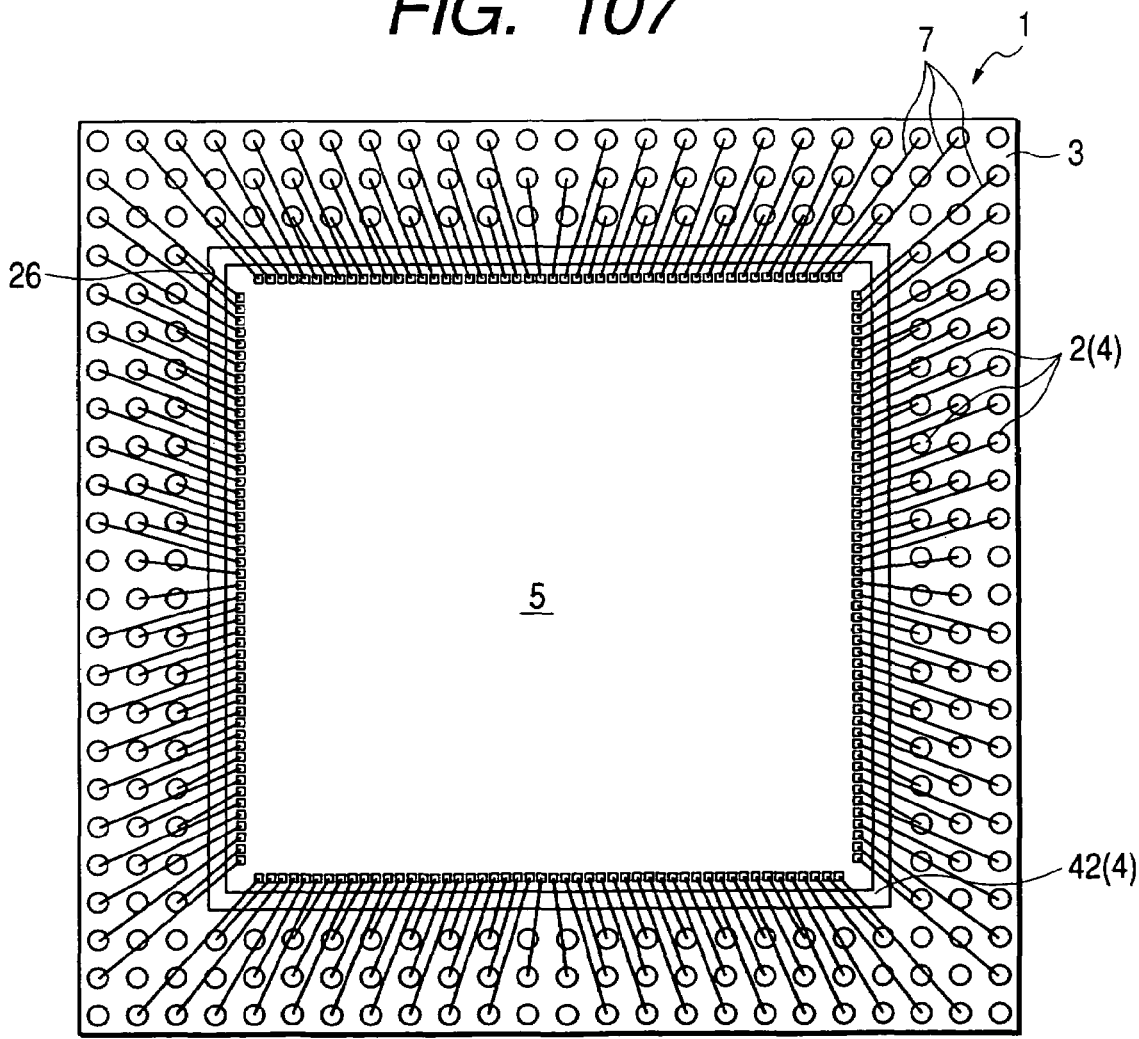

MANUFACTURING METHOD OF A SEMICONDUCTOR DEVICE

CROSS-REFERENCE TO RELATED APPLICATION

This application is a Continuation application of U.S. application Ser. No. 10/902,785 filed Aug. 2, 2004, now U.S. Pat. No. 7,407,834 which is a Continuation of U.S. application Ser. No. 10/091,302 filed on Mar. 6, 2002 now abandoned. Priority is claimed based on U.S. application Ser. No. 10/902,785 filed Aug. 2, 2004, which claims priority to U.S. application Ser. No. 10/091,302 filed on Mar. 6, 2002, which claims priority to Japanese Patent Application Nos. 2001-142164 and 2002-004435 filed on May 11, 2001 and Jan. 11, 2002, respectively, all of which is incorporated by reference.

BACKGROUND OF THE INVENTION

This invention relates to a method of manufacturing a semiconductor device such as a resin-sealed LSI (large-scale integrated circuit) using a metal substrate, and in particular to an effective technique which can be applied to the manufacture of a semiconductor device (non-leaded semiconductor device) wherein external electrode terminals are made to project from a mounting surface without deliberately making the external electrode terminals project from the side of the package, such as in a SON (Small Outline Non-Leaded Package) or QFN (Quad Flat Non-Leaded Package).

In the manufacture of resin-sealed semiconductor devices, a lead frame is used. The lead frame is manufactured by forming a predetermined pattern, by stamping a metal plate with a precision press or by etching. The lead frame comprises supporting members known as tabs or diepads for fixing semiconductor elements (semiconductor chips), and plural leads whereof the ends (inner ends) are brought to the periphery of the supporting members. The tabs are supported by hanging leads extending from the frame part of the lead frame.

When a resin-sealed semiconductor device is manufactured using this lead frame, semiconductor chips are fixed to the tabs of the lead frame, the electrodes of the semiconductor chips and ends of the leads are connected by conductive wires, the inner end side including the wires and semiconductor chips is sealed by an insulating resin to fill the gaps and form a sealing package (resin sealing package), unnecessary lead frame parts are removed by cutting, and the leads projecting from the package or hanging from the tabs are cut.

As one type of resin-sealed semiconductor device manufactured by lead frames, a semiconductor device structure (non-leaded semiconductor device) is known wherein one-side molding is performed on one surface (principal surface) of the lead frame to form the package, and the leads which are external electrode terminals are exposed on the surface of the package. Examples of this type of semiconductor device are SON wherein the leads are exposed on both edges of the surface of the package, and QFN wherein the leads are exposed on four sides of the surface of a rectangular package.

In Japanese Unexamined Patent Publication No. 2000-286376, a method is described for manufacturing a non-leaded semiconductor device using a lead frame wherein leads are suspended respectively from the four corners of a rectangular island, adjacent hanging leads are joined to surround the island to form a connecting member, first connecting pieces are made to project at equal intervals towards the island from the inside of the surrounding-connecting member, and second connecting pieces are made to project from the connecting member to the outside. The first connecting pieces and second connecting pieces are in a staggered footprint arrangement.

In the manufacture of semiconductor devices using this frame, a semiconductor chip is fixed to the island, a bonding pad on the front surface of the semiconductor chip is fixed to the first connecting pieces and second connecting pieces via metal filaments, the semiconductor chip and metal filaments are covered by a sealing package, the first connecting pieces and second connecting pieces are cut by dicing so as to remove the connecting member along the connecting member, the grooves are filled by resin if necessary, and the frame and sealing package are cut (full cut). This gives a non-leaded semiconductor device. The island may be formed larger or smaller than the chip.

In Japanese Unexamined Patent Publication No. 2000-216280, a technique is disclosed for manufacturing a non-leaded semiconductor device using a terminal land frame the wherein land structures projecting from one side of a frame body are arranged in a checkered pattern. The land structures are formed by forming projections by stamping the frame body, cutout step parts are broken off by applying a shear force in the stamping direction, and the land structures are separated from the frame body.

Groove parts are formed on the front surface of the projecting surface of the land structures, and projecting parts having a flat front surface are formed in the centers of depressions in the land structures. The flat surfaces of these projections form mounting surfaces for external electrode terminals of the semiconductor device. Further, a sealing resin is inlaid into the groove parts to improve the contact between the land structures forming the external electrode terminals and the resin.

In semiconductor devices using this terminal land frame, semiconductor elements are bonded to the projecting surfaces of one or more land structures by a conductive adhesive or insulating paste, the electrodes of the semiconductor elements and the land structures situated around the semiconductor elements are electrically connected by metal filaments, the principal surface of the terminal land frame is sealed by resin (one-side molding) so that the semiconductor elements and metal filaments are covered by a resin layer, resin layer parts are cut at predetermined positions to separate them, and with the terminal land frame fixed, the land structures are pressed out from the rear surface of the terminal land frame to break the land structures in the step parts. This gives a non-leaded semiconductor device.

SUMMARY OF THE INVENTION

From the viewpoint of compactness of the semiconductor device and preventing bending of leads which are the external electrode terminals, non-leaded semiconductor devices such as SON or QFN with one-side molding are used. In non-leaded semiconductor devices, the lead surfaces exposed on one surface of the package are mounting surfaces, so the mounting surface area is smaller than in the case of semiconductor devices such as SOP (Small Outline Package) or QFP where the leads project from the lateral surface of the package.

In non-leaded semiconductor devices such as QFN, the arrangement of external electrode terminals on the mounting surface is a one-row structure. For this reason, if the number of external electrode terminals (also referred to as the number of pins) increases, in a structure where the leads are located in a row along the circumference of the package), the size of the package increases as compared with the size of the semiconductor element (semiconductor chip). Therefore, the semiconductor device manufacturing technology shown in the above-mentioned references was developed for the purpose of making the package size more compact.

In the former example known from the art (Japanese Unexamined Patent Publication No. 2000-286376), there are hanging leads supporting the island (chip fixing part) to which the semiconductor chip is fixed, and there are connecting pieces (first connection pieces, second connection pieces) which are external electrode terminals alternately on the inside and outside of connection members connecting adjacent hanging leads. The connecting members are cut while moving a large dicing blade of larger width than the width of the connecting members in the extension direction of the connecting members.

However, the four corners of the frame which is separated from the connection members are vacant regions where there are no connection pieces, and effective use of the frame is not achieved.

From the viewpoint of effective use of this frame, there is the difficulty that the external electrode terminals cannot be formed in the regions wherein the hanging leads are provided.

On the other hand, the first connection piece which extends towards the island has a cantilever construction.

For this reason, when molding is performed by enclosing the frame in a molding die comprising upper and lower dies, it may occur that the tip of the first connection piece which has a cantilever construction does not adhere to the parting surface of the lower die. Resin enters into this poor adhesion part during molding, and resin adheres to the mounting surface of the external electrode terminals (resin burr). If this resin burr remains as it is, it causes mounting defects, so a resin burr removal process is also needed as a semiconductor device manufacturing step, and reduction of manufacturing cost is prevented. In a structure where the island is doubly surrounded by the connection members, all the connection pieces that project from the connection members have a cantilever construction, and the problem of resin burrs becomes still worse.

On the other hand, as the first connection piece and second connection piece are arranged in a staggered footprint shape, in the third and higher rows, as they occur in a part which is coaxial with the cutting location, it is difficult to use this part (in particular the fourth corner) as an external terminal.

In the latter example known in the art (Japanese Unexamined Patent Publication No. 2000-216280), the land structure formed by making the frame body project partially by stamping, was made an external electrode terminal of the semiconductor device. In the last manufacturing step of the semiconductor device wherein a sealing resin part at a predetermined location is separated by cutting, this external electrode terminal is again pressed in the stamping direction when the land structure is stamped out from the rear surface of the terminal land frame with the terminal land frame fixed when the land structure is formed, and fractured in the step part of the land structure to manufacture the non-leaded semiconductor device.

However, as the land structure used as an external electrode terminal is formed by stamping, its size cannot be controlled to a high precision and tends to vary. Moreover, as the dimensions of the external electrode terminal are determined by shear when the land structure is pressed to form the external electrode terminal by shear, the fracture position also cannot be controlled to a high precision. Consequently, the external form, dimensions and position of the external electrode terminal easily vary. Therefore, the mounting reliability is low.

Moreover, as the external electrode terminal is formed by a fracture (shear) by pressing, a projection (burr) easily occurs on the edge. Due to this projection (burr), not only is it impossible to perform reliable mounting by soldering the semiconductor device, but adjacent external electrode terminals come into electrical contact due to the projection which is undesirable.

It is therefore an object of this invention to provide a method of manufacturing a compact, non-leaded resin-sealed semiconductor device.

It is a further object of this invention to provide a method of manufacturing a non-leaded semiconductor device wherein the number of external electrode terminals can be increased.

It is a further object of this invention to provide a method of manufacturing a non-leaded semiconductor device wherein at least two rows of external electrode terminals can be provided along one edge of the semiconductor device.

It is a further object of this invention to provide a method of manufacturing a non-leaded semiconductor device wherein the external electrode terminals can be formed to a highly precise shape and dimensions.

It is a further object of this invention to provide a method of manufacturing a non-leaded semiconductor device which offers highly reliable mounting.

Other purposes and features of this invention will become apparent from the description of this specification and the appended drawings.

The essential features of the present invention may be summarized as follows.

(1) A non-leaded resin-sealed semiconductor device is manufactured by the steps of providing a conductive flat substrate (metal plate) such as copper or copper alloy, fixing semiconductor elements respectively to predetermined parts of a principal surface of the substrate, electrically connecting electrodes on the surface of the semiconductor elements with predetermined partition parts of the substrate separated from the semiconductor elements by conductive wires, forming an insulating resin layer over effectively the whole of a principal surface of the substrate to cover the semiconductor elements and the wires, selectively removing the substrate from the rear of the substrate to form electrically independent partition parts (partition regions) whereof at least some are external electrode terminals, and selectively removing the resin layer to fragment the device into the semiconductor elements and regions containing the plural partition parts surrounding the semiconductor elements.

For example, assuming that the partition parts (partition regions) on the substrate are like a grid pattern, rectangular regions formed by plural partition parts may be considered as unit substrate parts (unit substrate regions). These unit substrate parts are disposed transversely and longitudinally on the substrate. For example, a semiconductor element is fixed in the center of each unit substrate part, and the electrodes of this semiconductor element are connected to a predetermined partition part separate from the semiconductor element by wires. There are at least two rows of partition parts connected by wires outside the semiconductor element. Next, the resin layer covering the semiconductor element and wires is formed to a uniform thickness in a one-side mold by transfer molding. Next, a tape which is a supporting member is affixed to the whole of the front surface of the resin layer. Next, the substrate is cut transversely and longitudinally to electrically isolate the partition parts. Most of the isolated partition parts are used as external electrode terminals for mounting the non-leaded semiconductor device. Next, the resin layer is cut transversely and longitudinally so that the unit substrate regions are mutually independent. Next, plural non-leaded semiconductor devices are manufactured by peeling the tape off. The effective removal (isolation) of the substrate and resin layer is performed for example by check pattern cutting with a dicing blade.

Before fixing the semiconductor element, the partition parts underneath the semiconductor element which are closed by the semiconductor element, and the partition parts situated outside the semiconductor element connected by wires, are connected by conductive wires. When the semiconductor element is fixed, the semiconductor element is fixed by crushing the wire into the adhesive which bonds the semiconductor element to the substrate.

(2) In the aforesaid construction (1), plural grooves are provided transversely and longitudinally by etching one surface of the flat, conductive substrate to form partition parts (partition regions) surrounded by grooves in a grid pattern, and the rectangular regions containing the plural partition parts are considered as unit substrate parts (unit substrate regions) for forming the non-leaded semiconductor device. These unit substrate parts are aligned transversely and longitudinally on the substrate (matrix arrangement).

The method of manufacturing the non-leaded semiconductor device using this substrate is as follows. Semiconductor elements are fixed to the unit substrate parts on the surface where grooves are present and the surface where grooves are not present. For example, a semiconductor element is fixed to the center of a unit substrate part. The substrate is formed so that plural (two or more) rows of partition parts are situated outside the semiconductor element. Next, the electrodes of the semiconductor element and a predetermined partition part situated outside the semiconductor element or the rear surface of the predetermined partition part are connected by wires. Next, a resin layer is formed to a uniform thickness in a one-side mold by transfer molding so as to cover the semiconductor element and wires. Next, a tape is affixed over the whole of the front surface of the resin layer. Subsequently, the groove bases are cut by moving a dicing blade relatively along the extension direction of the groove so as to isolate the substrate, i.e., isolate the partition regions. Next, the resin layer is cut transversely and longitudinally so that the unit substrate parts are mutually independent. independent unit substrate parts are supported by tape. Next, plural non-leaded semiconductor devices are manufactured by peeling off the tape.

The partition parts in the region adjacent to the center of the semiconductor element are made thinner than the thickness of the partition part supporting the peripheral part of the semiconductor element, or eliminated completely, so as to generate a predetermined gap between the mounting surface of the lower part of the semiconductor element and the mounting board (standoff structure).

When the semiconductor element is fixed to the surface where grooves are present, isolation by removing the groove bases of the partition parts may be performed by removing the substrate by polishing or etching it to a fixed thickness. When the semiconductor element is fixed to the surface where grooves are not present, the grooves in the region to which the semiconductor element is fixed, are filled by a filling material, and the semiconductor element is fixed to the substrate using the aforesaid adhesive so as to eliminate the gap between the semiconductor element and the substrate. Also, through holes are provided at intersection points which divide the substrate transversely and longitudinally.

(3) In the aforesaid construction (2), plural grooves extending transversely and longitudinally which meet so that they mutually overlap are provided by etching the front and rear surfaces of the flat, conductive substrate, to form partition parts surrounded by grooves in a grid pattern, and the rectangular regions containing the plural partition parts are considered as unit substrate parts (unit substrate regions) for forming the non-leaded semiconductor device. These unit substrate parts are aligned transversely and longitudinally on the substrate. In the method of manufacturing the non-leaded semiconductor device using this substrate, and unlike the case of (2) above, the semiconductor element is always fixed to the surface where grooves are present.

(4) The pattern of unit substrate parts in the substrate is different from the above constructions (2) and (3). The unit substrate parts comprise tabs which fix the semiconductor elements, and plural leads which project parallel from the sides of these tabs. The leads are arranged in rows with the leads of other adjacent unit substrate parts or in the substrate frame. The unit substrate parts are aligned transversely and longitudinally in the substrate (matrix arrangement). In the manufacture of the semiconductor device, the tabs may be larger or smaller (small tabs) than the semiconductor element.

In a construction wherein the unit substrate parts comprise tabs and leads, the non-leaded semiconductor devices may be manufactured by the following steps.

Specifically, the non-leaded semiconductor device is manufactured by the steps of:

patterning a conductive substrate to form plural unit substrate parts comprising rectangular tabs for fixing semiconductor elements, and plural leads extending parallel from predetermined sides of these tabs and extending from adjacent tabs or connected to a substrate frame, the leads having two or more wire connection regions midway along their length, fixing the semiconductor elements to the tabs on the main surface of the substrate respectively via an adhesive, electrically connecting electrodes on the front surfaces of the semiconductor elements to the predetermined wire connection regions of the leads by conductive wires.

forming an insulating resin layer over effectively the whole of the main surface of the substrate to cover the semiconductor elements and wires, affixing a tape over the whole surface of the resin layer, selectively removing the leads over their whole length to electrically isolate the tabs, the substrate frame, the leads of adjacent unit substrate regions and adjacent wire connection regions so as to form external electrode terminals, and selectively removing the resin layer to fragment it into the unit substrate regions containing the unit substrate parts, and peeling off the tape.

The parts of the leads to be selectively removed are formed so that they are situated on straight lines in the transverse and longitudinal directions of the substrate, and are removed by dicing. When the leads are selectively removed, the front surface of the semiconductor element is not removed. The selective removal of the leads takes place at plural points in the length direction of the leads, so as to form two or more rows of external electrode terminals along the edge of the semiconductor device. The aforesaid resin layer is formed in a one-side mold by transfer molding. The transfer molding is performed by bringing the tab surfaces into adhesive contact with a mounting surface of the mold by vacuum suction so that the substrate is brought into adhesive contact with the mounting surface of the mold.

According to the above means (1), (a) Two or more rows of external electrode terminals are arranged along one side of the non-leaded semiconductor device, so the number of external electrode terminals can be increased.

(b) As two or more rows of external electrode terminals are arranged along one side of the non-leaded semiconductor device, the semiconductor device can be made compact.

(c) The external electrode terminals are formed by cutting metal plate transversely and longitudinally by a dicing blade, so the shape and dimensions of the external electrode terminals can be made very precise.

(d) As the external electrode terminals are formed by cutting a metal plate transversely and longitudinally by a dicing blade, long projections (manufacturing burrs) due to cutting do not easily occur on the periphery of the external electrode terminals, and the electrode flatness improves. As a result, when the non-leaded semiconductor device is mounted on a mounting board using solder or the like, faulty contacts of the external electrode terminals with the lands (interconnections) of the mounting board due to projections do not easily occur, so mounting strength is improved and mounting reliability is improved.

(e) In a structure wherein partition parts in a region enclosed by the semiconductor element are connected, by means of wires, to partition parts to which wires are connected outside the semiconductor element, external electrode terminals may also be formed in a region underneath the semiconductor element, so not only is there more flexibility in forming the interconnection pattern on the mounting board, but the mounting board can be made more compact by modifying the interconnection pattern.

(f) The partition parts (external electrode terminals) can easily be formed by cutting one metal plate, so the cost of manufacturing the semiconductor device can be reduced.

According to the above means (2), (a) At least two rows of external electrode terminals are disposed along one side of the non-leaded semiconductor device, so the number of external electrode terminals can be increased.

(b) As two or more rows of external electrode terminals are arranged along one side of the non-leaded semiconductor device, the semiconductor device can be made compact.

(c) The external electrode terminals are formed by cutting a metal plate transversely and longitudinally by a dicing blade, so the shape and dimensions of the external electrode terminals can be made very precise.

(d) As the external electrode terminals are formed by cutting a metal plate transversely and longitudinally by a dicing blade, long projections (manufacturing burrs) due to cutting do not easily occur on the periphery of the external electrode terminals, and the electrode flatness improves. As a result, when the non-leaded semiconductor device is mounted on a mounting board using solder or the like, faulty contacts of the external electrode terminals with the lands (interconnections) of the mounting board due to projections do not easily occur, so mounting strength is improved and mounting reliability is improved.

(e) As external electrode terminals can be formed for plural semiconductor devices simply by dicing with a dicing blade in the transverse and longitudinal directions of one metal plate, the cost of manufacturing semiconductor devices can be reduced.

(f) By providing grooves in the substrate and forming electrically isolated partition regions by removing the groove bases after forming the resin layer, the partition part isolation time is shorter and the time required to manufacture the semiconductor device is shortened. Due to this shortening of the cutting time, there is less wear of the dicing blade and the life of the blade is extended. Hence, the cost of manufacturing the semiconductor device is reduced.

(g) As the grooves are formed by etching, manufacturing burrs do not occur on the edges of the grooves. Therefore, in the manufacturing method where the semiconductor element is fixed to the surface where grooves are not present, the electrode flatness of the external electrode terminals formed by the partition parts is satisfactory, and the reliability of mounting the semiconductor device is increased.

(h) By adopting a stand-off construction, problems do not occur even if there are foreign bodies on the mounting board during mounting of devices.

(i) When the semiconductor element is fixed to the surface where grooves are present, isolation by removing the groove bases of the partition parts may be performed by removing the substrate by polishing or etching to a fixed thickness. In this case, the electrode flatness of the external electrode terminals can be made satisfactory.

(j) By providing through holes at intersection points which divide the substrate transversely and longitudinally, the cutting time by the dicing blade can be shortened and the life of the blade can be extended.

(k) When the semiconductor element is fixed to a surface where grooves are present, gaps between the semiconductor element and the substrate are prevented from occurring by filling the grooves in the region where the semiconductor element is fixed with a filling material, water does not collect on the fixing surfaces of the semiconductor element and substrate, and when the semiconductor device is mounted by solder reflow, mounting defects due to swelling of this water do not easily occur.

According to the above means (3), in addition to the effects of the above means (2), (a) grooves are provided facing each other on the front and rear surfaces of the substrate, and when the partition regions of the substrate are isolated, the groove bases of the grooves on the front and rear surfaces can be cut simply by moving the dicing blade relatively in the extension direction of the grooves, therefore the isolation time of the partition parts is shorter and the time required to manufacture the semiconductor device is shortened. Also, due to the shortening of cutting time, there is less wear on the dicing blade and the life of the blade is extended. Hence, the cost of manufacturing the semiconductor device is reduced. According to the above means (4), two or more rows of external electrode terminals are disposed along one side of the non-leaded semiconductor device, so the number of external electrode terminals can be increased.

(b) As two or more rows of external electrode terminals are arranged along one side of the non-leaded semiconductor device, the semiconductor device can be made compact.

(c) The external electrode terminals are formed by cutting a metal plate (leads) at plural points by a dicing blade, so the shape and dimensions of the external electrode terminals can be made very precise.

(d) As the external electrode terminals are formed by cutting a metal plate (leads) at plural points by the dicing blade, long projections (manufacturing burrs) due to cutting do not easily occur on the periphery of the external electrode terminals, and the electrode flatness improves. As a result, when the non-leaded semiconductor device is mounted on a mounting board using solder or the like, faulty contacts of the external electrode terminals with the lands (interconnections) of the mounting board due to projections do not easily occur, so mounting strength is improved and mounting reliability is improved.

(e) As external electrode terminals can be formed for plural semiconductor devices simply by dicing with a dicing blade in the transverse and longitudinal directions of one metal plate, the cost of manufacturing semiconductor devices can be reduced.

(f) The external electrode terminals can be formed by cutting the leads in their width direction with the dicing blade, so the cutting time can be shortened, and as the cutting time is short, there is less wear on the dicing blade and the life of the blade is extended. Hence, the cost of manufacturing the semiconductor device is reduced.

(g) When the resin layer is formed by transfer molding, the substrate is in adhesive contact with the mounting surface of the mold by vacuum suction, and as the lead surfaces are also in adhesive contact with the mounting surface, resin no longer seeps onto the rear surface of the tabs and the rear surface of the leads. Consequently, soiling of the mounting surface of the semiconductor element by the resin can be prevented, and a non-leaded semiconductor device having a high mounting reliability can be manufactured.

BRIEF DESCRIPTION OF THE DRAWINGS

FIG. 23 is a schematic plan view showing the state where the substrate front surface is polished in Modification 3 of Embodiment 3.

FIGS. 30A to 30D are cross-sectional views of some of the steps in the method of manufacturing the semiconductor device according to a Modification 2 of Embodiment 4.

FIGS. 51A to 51D are cross-sectional views of some of the steps in the method of manufacturing a semiconductor device according to Embodiment 11.

FIGS. 53A to 53C are cross-sectional views of some of the steps in the method of manufacturing a semiconductor device according to Embodiment 12.

FIGS. 104A to 104G are schematic cross-sectional views of the steps in the method of manufacturing the non-leaded semiconductor device of Embodiment 24.

FIG. 106 is a schematic cross-sectional view showing a non-leaded semiconductor device according to another embodiment (Embodiment 25) of this invention.

FIG. 107 is a perspective view showing the planar arrangement of external electrode terminals of the non-leaded semiconductor device of Embodiment 25.

DESCRIPTION OF THE PREFERRED EMBODIMENTS

Some embodiments of this invention will now be described in detail referring to the appended drawings. In all of the drawings used to describe the embodiments of the invention, parts having identical functions are assigned the same symbols and their description will not be repeated.

Embodiment 1

FIG. 1 to FIG. 13 are diagrams related to the method of manufacturing a non-leaded resin-sealed semiconductor device according to a first embodiment (Embodiment 1) of the invention. In Embodiment 1, in FIG. 1 to FIG. 4, an example is shown wherein the method of this invention is applied to the manufacture of a non-leaded semiconductor device 1 wherein external electrode terminals 2 comprising a conductive body (metal) are exposed on the rear surface of a square sealing package 33.

Figure 1:
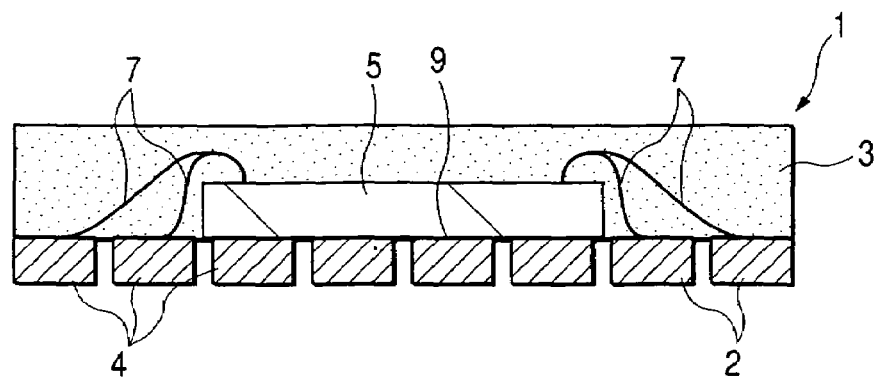
FIG. 1 is a schematic cross-sectional view of a non-leaded resin sealing package type semiconductor device according to a first embodiment (Embodiment 1) of this invention.
Figure 2:
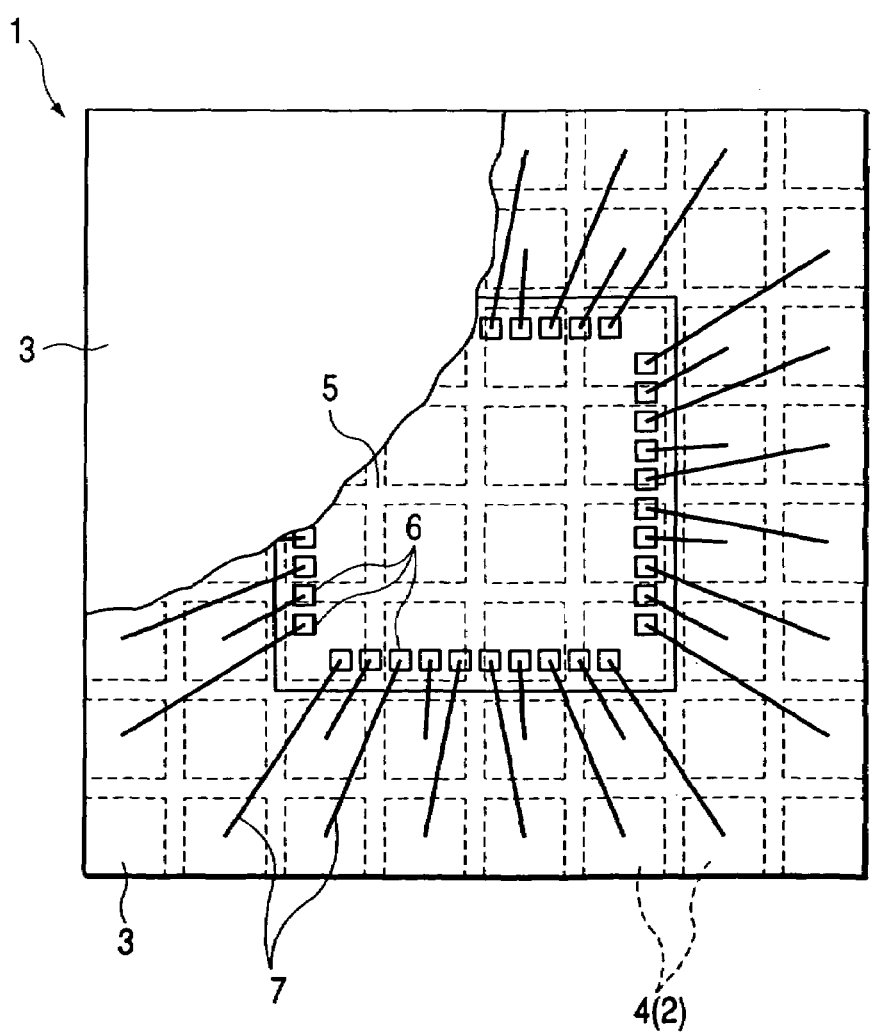
FIG. 2 is a plan view showing the semiconductor device with part of the resin sealing package removed leaving a thin sealing resin in the removed part.

In Embodiment 1, as shown in FIG. 1 and FIG. 2, electrically isolated partition parts 4 (partition regions) 2 are provided in a grid pattern on the rear surface (mounting surface side) of a sealing package 3 comprising a rectangle of predetermined thickness. In Embodiment 1, a semiconductor device will be described wherein two rows of the partition parts 4 are provided as the external electrode terminals 2 along each side of the square resin sealing package.

The partition parts (partition regions) 4 are squares wherein for example the horizontal and vertical sides are both 0.5 mm. The interval between the partition region 4 and partition region 4 may for example be approximately 0.15 mm. When the pitch of the external electrode terminals is 0.5 mm, the horizontal and vertical dimensions of the partition regions 4 are respectively 0.35 mm. A semiconductor element (semiconductor chip) 5 is situated inside the resin sealing package 3, and electrodes 6 of the semiconductor element 5 (FIG. 3) are electrically connected by means of conductive wires 7 to both sides of the predetermined partition parts 4 covered by the resin sealing package 3. The wires 7 are also covered by the resin sealing package 3.

The semiconductor element 5 is fixed to the plural partition parts 4 by an adhesive 9. The adhesive 9 may be conductive or insulating. In this example, a conductive adhesive is used, for example silver (Ag) paste. Therefore, if the substrate parts in contact with the partition parts 4 of the semiconductor chip are layers which are not used electrically, the partition parts 4 which are connected to the semiconductor element 5 via the conductive adhesive 9, are not used as external electrode terminals. However, in this case also they may be used as mounting terminals. Further, as shown in the other embodiments described later, by connecting the partition parts 4 to which the wires 7 situated outside the semiconductor element 5 are connected, and some of the partition parts 4 situated underneath covered by the semiconductor element 5, the partition parts 4 situated underneath the semiconductor element 5 may also be used as the external electrode terminals 2.

When the substrate parts in contact with the partition parts 4 of the semiconductor chip are used at ground potential, the partition parts 4 connected to the semiconductor element 5 via the adhesive 9 may be used as ground electrodes for the external electrode terminals 2.

If an insulating material is used for the adhesive 9, the partition parts 4 connected to the semiconductor element 5 via the adhesive 9 are all electrically isolated. In a structure wherein the partition parts 4 not used as the external electrode terminals 2 are also fixed to the interconnection board by a bonding material such as solder or the like during installation of the semiconductor device 1, the mounting strength can be increased. Further, heat dissipation is also improved. In this structure also, by connecting the partition parts 4 to which the wires 7 situated outside the semiconductor element 5 are connected, and some of the partition parts situated underneath covered by the semiconductor element 5, by wires or the material parts forming the partition parts 4, the partition parts 4 situated underneath the semiconductor element 5 may also be used as the external electrode terminals 2, as described above.

Figure 5:
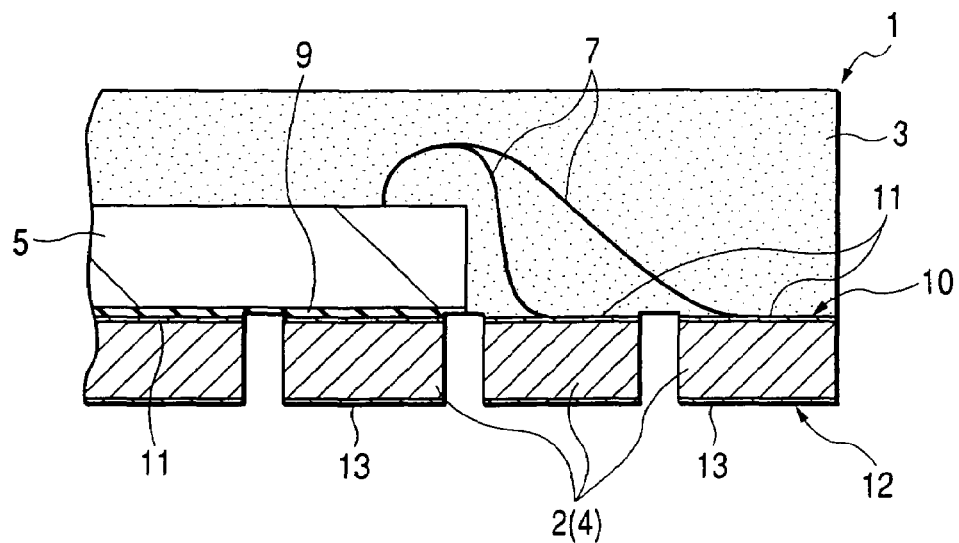
FIG. 5 is an enlarged cross-sectional view of part of the semiconductor device.

A plating film 11 as shown in FIG. 5 is provided on the surface (inner surface 10) to which the wires 7 of the partition members 4 are connected. This plating film 11 is provided to make good contact with the wires 7. For example, the wires 7 may be Au wires, and the plating film 11 may be an Ag plating film, Au plating film or Pd plating film.

An external mounting plating film 13 used for mounting is provided on the rear surfaces (mounting surfaces 12) of the partition parts 4. This external mounting plating film 13 is provided to make good contact (leak properties) with a bonding material when the semiconductor device 1 is mounted on an interconnection board such as a modular substrate or the like. When PbSn is used as the bonding material, the external mounting plating film 13 is preferably a PbSn solder plating film, and in Embodiment 1, a PbSn solder plating film is used.

Figure 3:
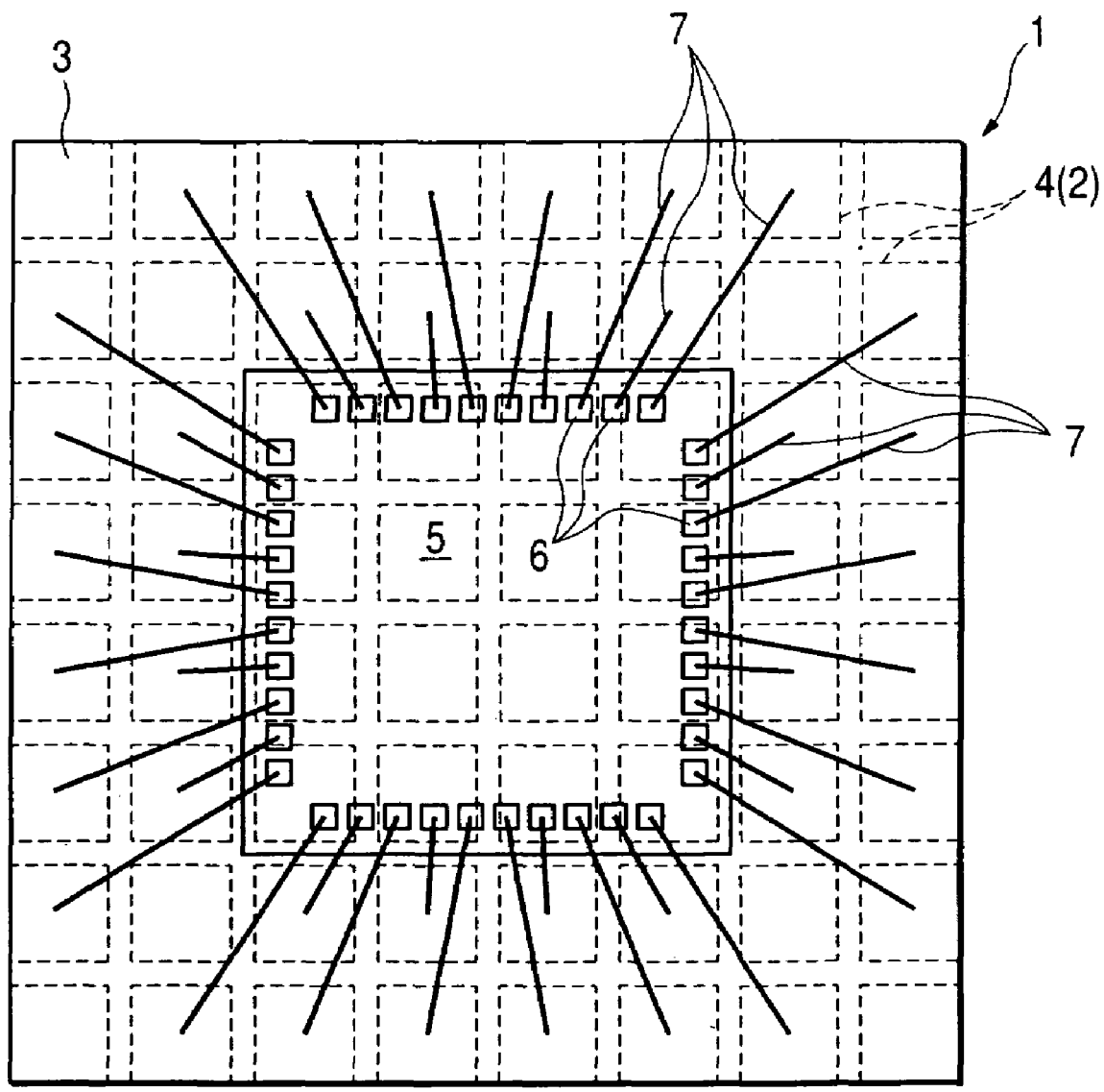
FIG. 3 is a perspective view showing the planar arrangement of the semiconductor device.

In Embodiment 1, there are two rows of the partition parts 4 situated outside the semiconductor element 5 along each side of the rectangular resin sealing package 3. In these two rows of partition parts 4, i.e., in the external electrode terminals 2, there are also external electrode terminals which are not connected by the wires 7, as shown in FIG. 2 and FIG. 3.

Figure 6:
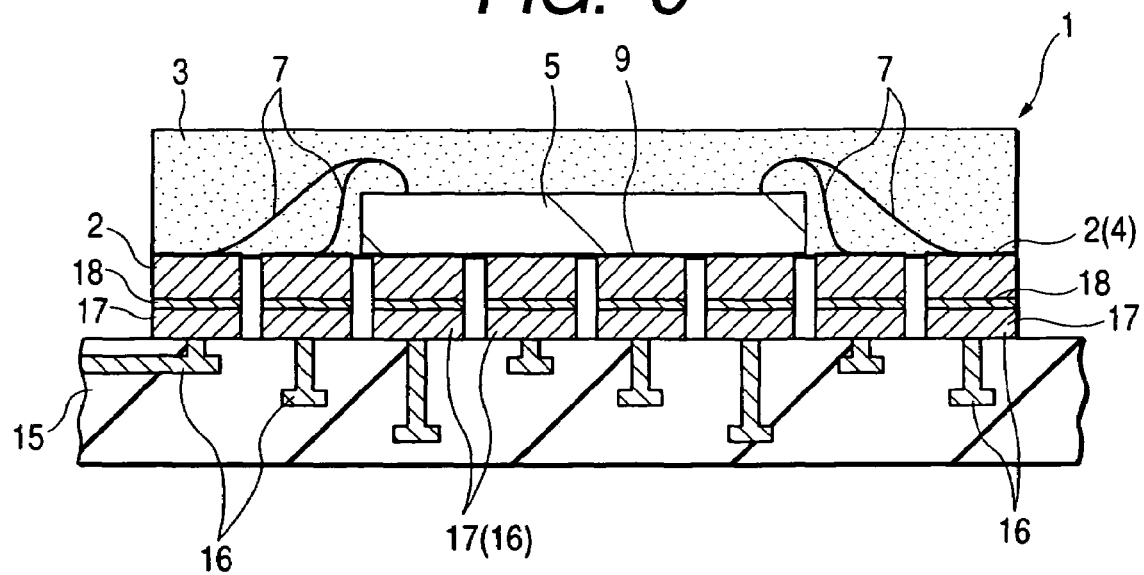
FIG. 6 is a cross-sectional view showing the mounting state of the non-leaded semiconductor device.

FIG. 6 is a cross-sectional view showing a state where the semiconductor device 1 of Embodiment 1 is incorporated in an electronic device, i.e., where it is mounted on an interconnection board 15 such as a motherboard or modular board of the electronic device. Lands 17 corresponding to the external electrode terminals 2 of the semiconductor device 1 are provided by some of interconnections 16 on the principal surface of the interconnection board 15 having a multilayer interconnection structure. The external electrode terminals 2 of the semiconductor device 1 are electrically connected to these lands 17 via solder (PbSn solder) 18.

Next, the method of manufacturing the above semiconductor device will be described. The semiconductor device is manufactured by first fixing the semiconductor element to one surface of the substrate leaving a predetermined gap. The electrodes of the semiconductor element are connected to predetermined substrate regions outside the semiconductor element by conductive wires, a resin layer of fixed thickness is formed by a one-side mold by transfer molding so as to cover the semiconductor element and wires, and fragmentation is then performed by cutting the resin layer transversely and longitudinally. The wire connecting parts can be connected to any of the partition parts. The fragmentation is a division into one semiconductor element, and each of the rectangular regions comprising the plural partition parts situated around this semiconductor element. By cutting the resin layer, the resin sealing package of the semiconductor device is formed.

Next, the manufacture of the semiconductor device will be described in more detail referring to the process diagrams of FIG. 7. In these process diagrams, shading is not used for the description as it makes the diagrams unclear. Likewise, the following embodiments will be described without the use of shading in some cases.

Figure 7A:
FIGS. 7A to 7G are cross-sectional views of steps involved in the method of manufacturing the non-leaded semiconductor device.

In the manufacture of the non-leaded semiconductor device, a semiconductor substrate 20 is first provided as shown in FIG. 7(a). This substrate 20 comprises a metal plate such as a copper alloy plate, copper plate or iron-nickel alloy plate usually used for the manufacture of semiconductor devices. In Embodiment 1, a flat copper plate is used. As shown in FIG. 8, this substrate 20 is a rectangular flat plate (rectangular plate) of a size such that plural semiconductor devices can be manufactured in one operation, for example 3 columns and 8 rows of 24 semiconductor devices can be manufactured. Although not shown in FIGS. 7A to 7G, to improve the bonding properties of the semiconductor element and the connectivity of the wires, the plating film 11 (FIG. 5) comprising Ag is provided on one surface of the substrate 20, i.e., on the principal surface to which the semiconductor element is fixed. The thickness of the substrate 20 may for example be 0.125-0.2 mm.

Figure 7B:
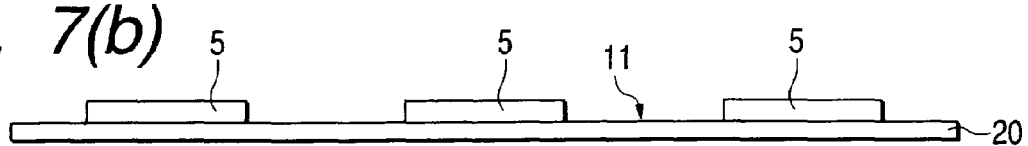
Figure 8:
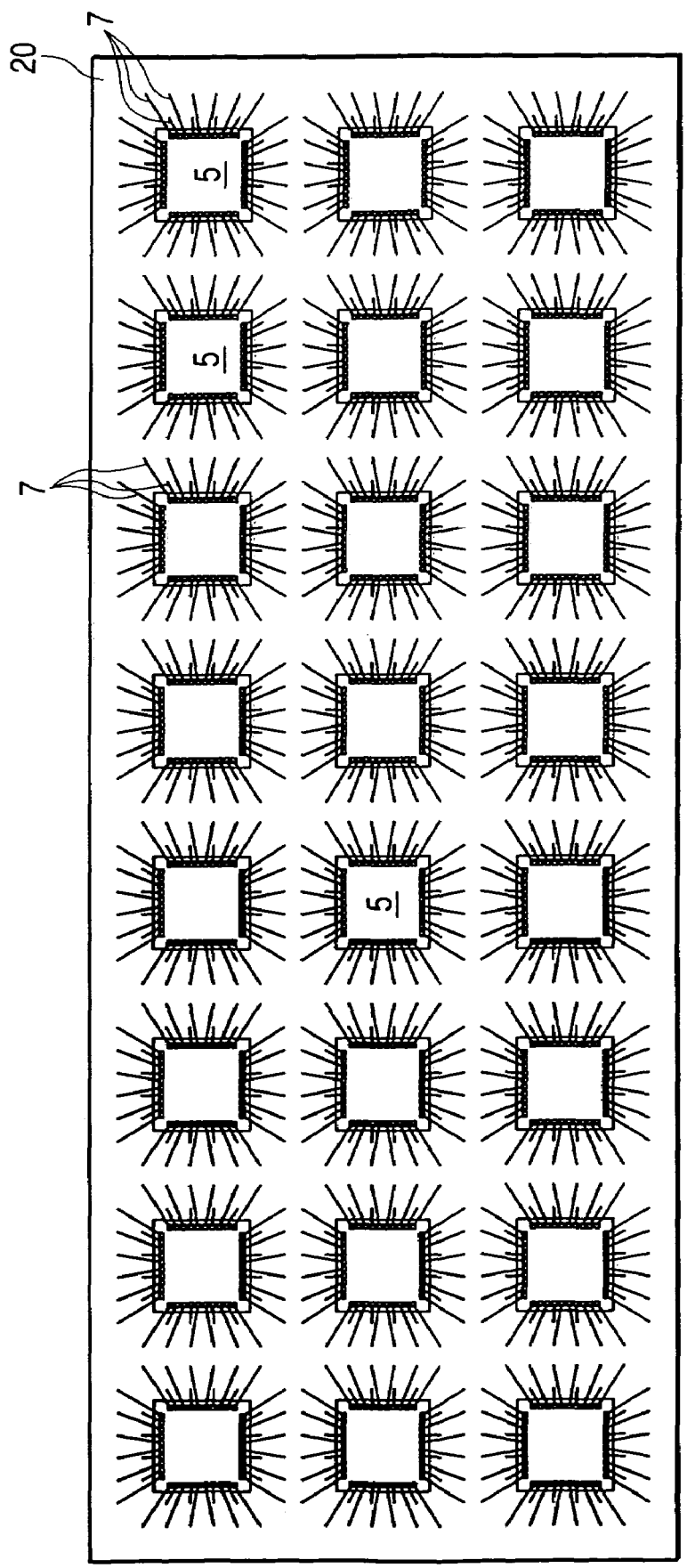
FIG. 8 is a plan view showing the state where, in the manufacture of the non-leaded semiconductor device, a semiconductor element is fixed to a substrate and wires are attached thereto.

Next, as shown in FIG. 7B and FIG. 8, the semiconductor element 5 is fixed to the principal surface of the substrate 20 using the usual chip bonding device, not shown. As shown in FIG. 5, the semiconductor element 5 is fixed by the adhesive 9 comprising Ag paste. In this process, in order not to cut the rear surface (fixing surface) of the semiconductor element 5 when the substrate 20 is cut by a dicing blade in a subsequent process, the thickness of the adhesive 9 is set as thick as, for example, approximately 30-100 um so that the tip of the dicing blade stops at the middle layer of the adhesive 9. In this chip bonding, the semiconductor elements 5 are aligned (in a matrix pattern) leaving a predetermined gap horizontally and vertically from the principal surface of the substrate 20. A region having predetermined gaps is left between each of the semiconductor elements 5, and this region is the outer periphery of the semiconductor devices. Therefore, although the substrate 20 is not patterned in any way, the rectangular region part surrounded by the outer periphery of the semiconductor elements is a unit substrate part (unit substrate region) for forming one non-leaded semiconductor device.

Figure 7C:
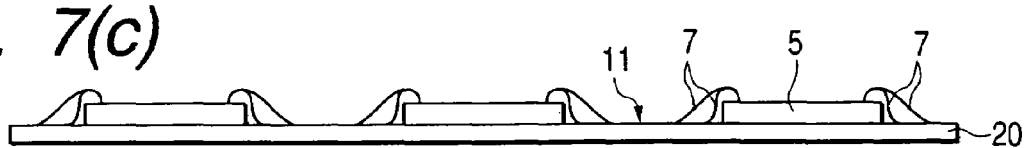

Next, as shown in FIG. 7C and FIG. 8, the electrode 6 (FIG. 3) on the front surface of the semiconductor element 5 is connected to the region 4 which is a predetermined partition part in the rectangular frame region surrounding the semiconductor element 5 by the conductive wires 7. The wires 7 may for example be gold wires, and are connected by a wire bonding device, not shown.

Figure 7D:
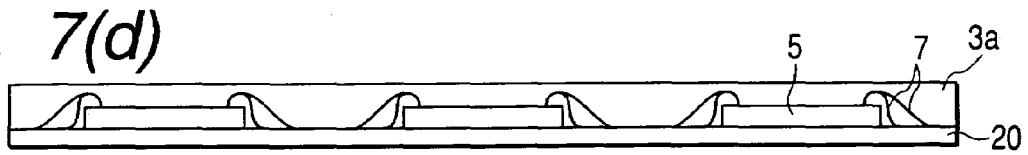

Next, as shown in FIG. 7D, a resin layer 3a is formed by an insulating resin on the principal surface of the substrate 20 using a transfer molding device, not shown. The resin layer 3a is formed to a uniform thickness, and the semiconductor elements 5 and wires 7 are covered by the resin without leaving any gaps. The thickness of this resin layer 3a covers the semiconductor elements 5 and wires 7, and provided that the moisture resistance of the semiconductor device does not decrease, it is made as thin as possible to make the semiconductor device thinner. The insulating resin forming the resin layer of 3a may for example be an epoxy resin. The resin layer 3a may also be formed by a resin filling method other than transfer molding. Specifically, it may be formed also by applying with a dispenser having a multi-nozzle.

Figure 7E:
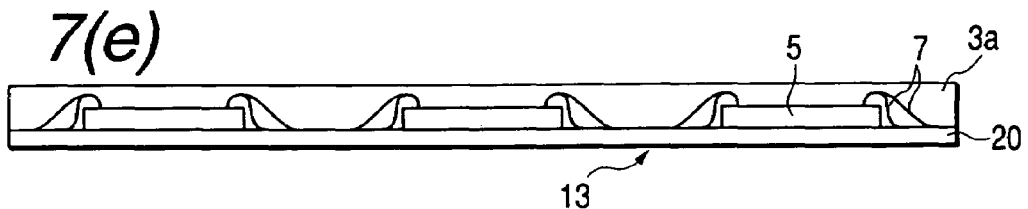

Next, as shown in FIG. 7E, the external mounting plating film 13 is formed on the rear surface of the substrate 20. In FIG. 7E, only the symbol is shown. The external mounting plating film 13 is shown in FIG. 5. The external mounting plating film 13 may also be formed by PbSn solder, for example by electroplating. The external mounting plating film 13 is formed to a thickness of approximately 5-20 μm.

Figure 4:
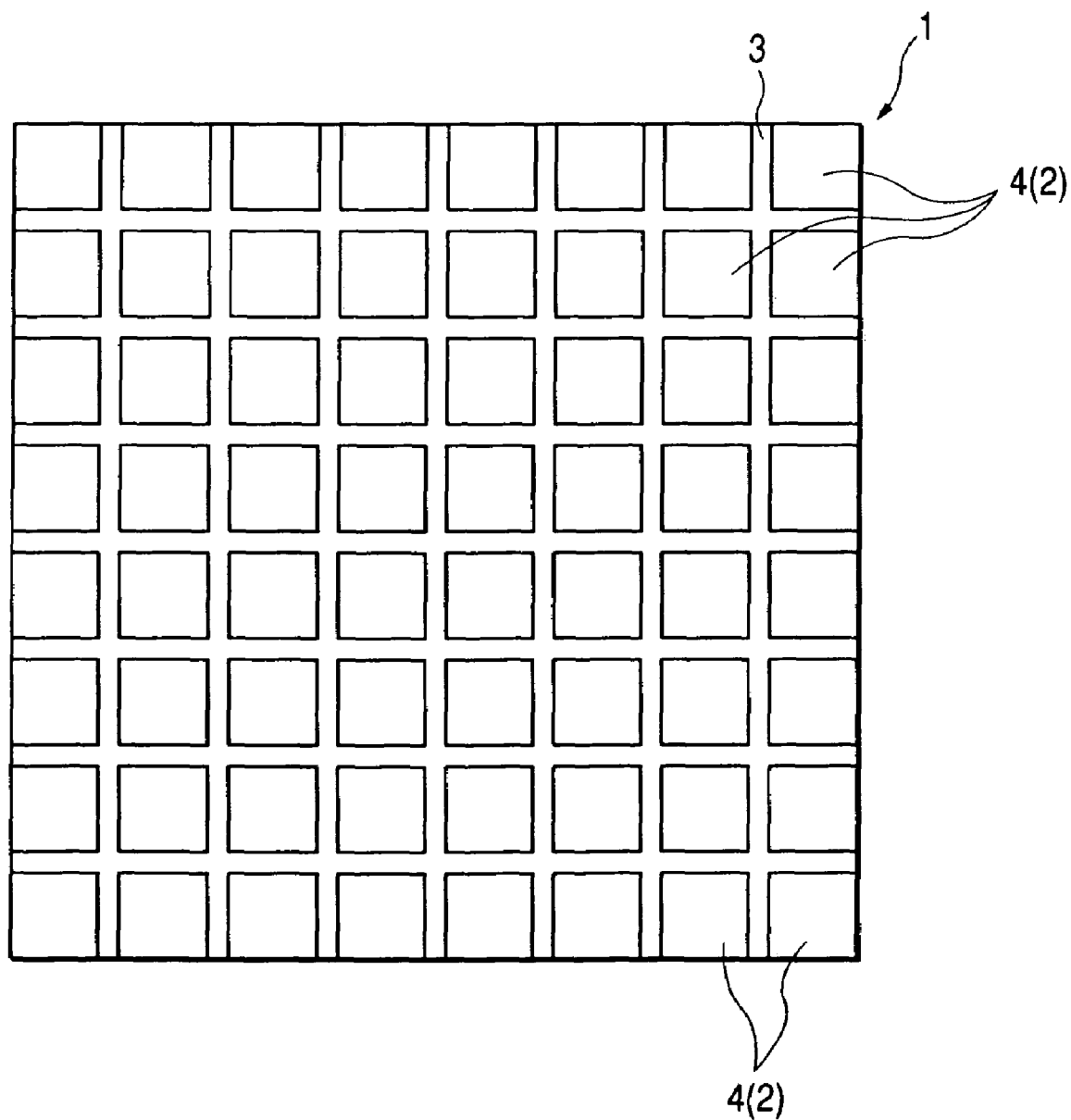
FIG. 4 is a base plan view of the semiconductor device.
Figure 7F:
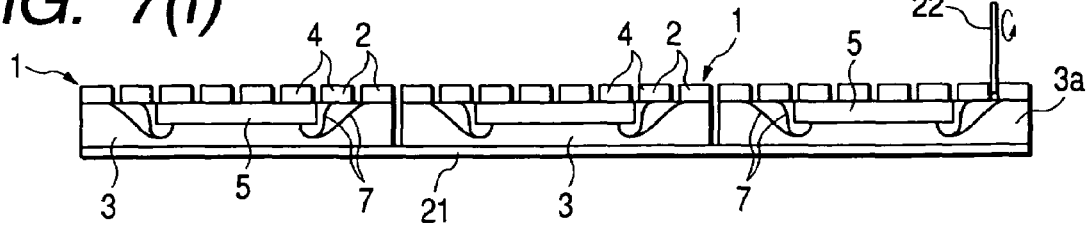

Next, as shown in FIG. 7F, a tape 21 is affixed as a supporting member to the whole of the front surface of the resin layer 3a. Subsequently, the substrate 20 is cut transversely and longitudinally by a dicing blade 22 with the substrate 20 facing upwards, and the partition parts 4 comprising squares (rectangles) are thereby formed. As shown in FIG. 4, the parts cut by the dicing blade 22 are in a checkered pattern, and the partition parts 4 are formed in a grid pattern between them.

If the dicing blade 22 has a thickness of 150 μm, for example, the partition parts 4 having sides of 0.5 mm are formed in a grid pattern at a pitch of 0.65 mm. In this dicing, as the substrate 20 is cut without fail, the tip of the dicing blade is diced to a depth which passes through the substrate 20, but care is taken not to cut the rear surface of the semiconductor element 5. Consequently, the dicing groove bases are situated at an intermediate depth of the adhesive 9 which fixes the semiconductor element 5 to the substrate 20. There is no particular problem if the dicing groove is formed in a surface layer part inside the resin layer 3a.

The boundary between a unit substrate region and a unit substrate region is cut by the dicing blade 22, and the resin layer 3a is cut simultaneously. Due to the cutting of the resin layer 3a, fragmentation is achieved, and plural semiconductor devices 1 are manufactured although they are still attached to the tape 21. The resin layer 3a covering the semiconductor elements 5 and wires 7 form a sealing package 3 due to this cutting.

In the cutting of the resin layer 3a, care is taken not to completely cut the tape 21. This is because the cutting is performed in the two directions XY, and it is preferred that even after cutting in one direction, each part is supported by the tape 21.

The dicing blade 22 may have only one blade, or it may have plural blades which perform cutting of plural devices simultaneously in parallel directions.

In the above embodiment, an example was described where, when the partition parts 4 are formed and fragmentation is performed, the tape 21 was a fixed as a supporting member over the whole of the front surface of the resin layer 3a before cutting by the dicing blade, but the invention is not necessarily limited to this case, it being possible to support the resin layer 3a by a fixing tool instead of the tape 21.

Figure 7G:
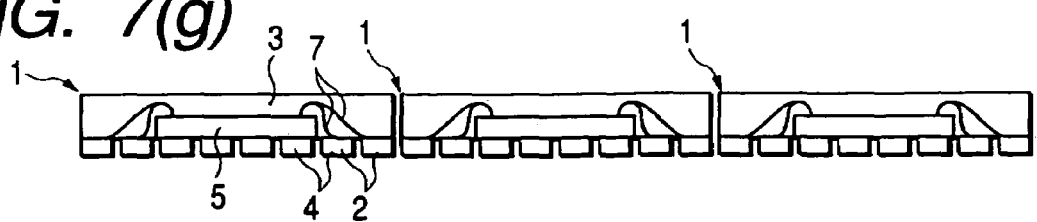

Next, as shown in FIG. 7(g), plural non-leaded semiconductor devices 1 are manufactured by peeling off the tape 21 from the resin sealing body 3. In this construction, in the semiconductor device 1 of Embodiment 1, the external electrode terminals 2 are formed in two rows along the edges (sides) of the semiconductor device 1.

Embodiment 1 has the following advantages.

(1) The external electrode terminals 2 are formed in two rows along the periphery (sides) of the non-leaded semiconductor device, so the number of external electrode terminals 2 can be increased.

(2) In a non-leaded semiconductor device which requires a large number of external electrode terminals, the external electrode terminals have to be aligned in one row along one side of the sealing package, so the length of one side of the package has to be increased, the sealing package becomes larger and the semiconductor device becomes large, but in the case of Embodiment 1, the external electrode terminals 2 are disposed in two rows along the sides of the semiconductor device, so a sealing package 33 can be made smaller, and the semiconductor device 1 can be made compact.

(3) Due to the aforesaid (1) and (2), the number of external electrode terminals 2 can be increased even in a small resin sealing package, so large numbers of terminals are possible. This is desirable in a multi-function semiconductor device.

(4) As the external electrode terminals 2 are formed by cutting transversely and longitudinally by the dicing blade, the shape and dimensions of the external electrode terminals 2 can be controlled to a high precision.

(5) As the external electrode terminals 2 are formed by cutting a metal plate transversely and longitudinally by the dicing blade, long projections (manufacturing burrs) due to cutting do not easily occur on the periphery of the external electrode terminals, and the electrode flatness improves. As a result, when the non-leaded semiconductor device is mounted on the interconnection board 15 such as a motherboard, modular board or mounting board using solder or the like, faulty contacts of the external electrode terminals 2 with the lands (interconnections) 17 of the mounting board due to projections do not easily occur, so mounting strength is improved and mounting reliability is improved.

(6) As the partition parts (external electrode terminals) can easily be formed by cutting one metal plate, the cost of manufacturing the semiconductor device is reduced.

(7) According to the aforesaid (1)-(6), a non-leaded semiconductor device which has a high mounting reliability, is compact and has large numbers of external electrode terminals, can be manufactured economically.

Figure 9:
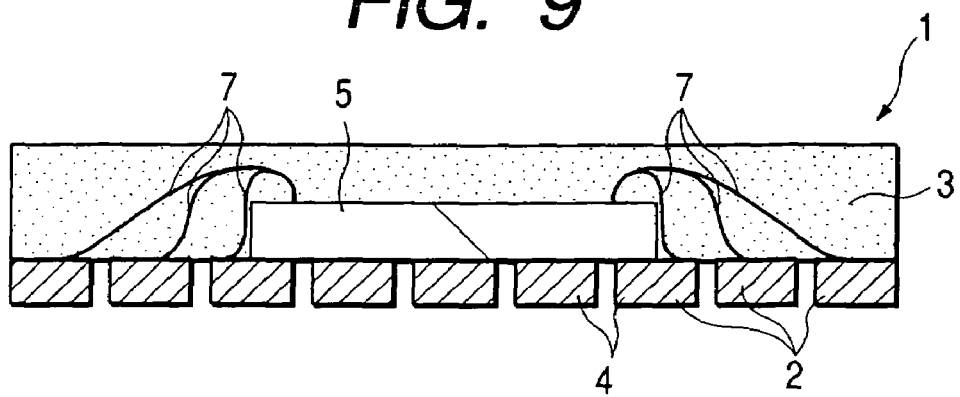
FIG. 9 is a schematic cross-sectional view of a non-leaded semiconductor device having three rows of terminals manufactured by the method of manufacturing the semiconductor device according to Embodiment 1.
Figure 10:
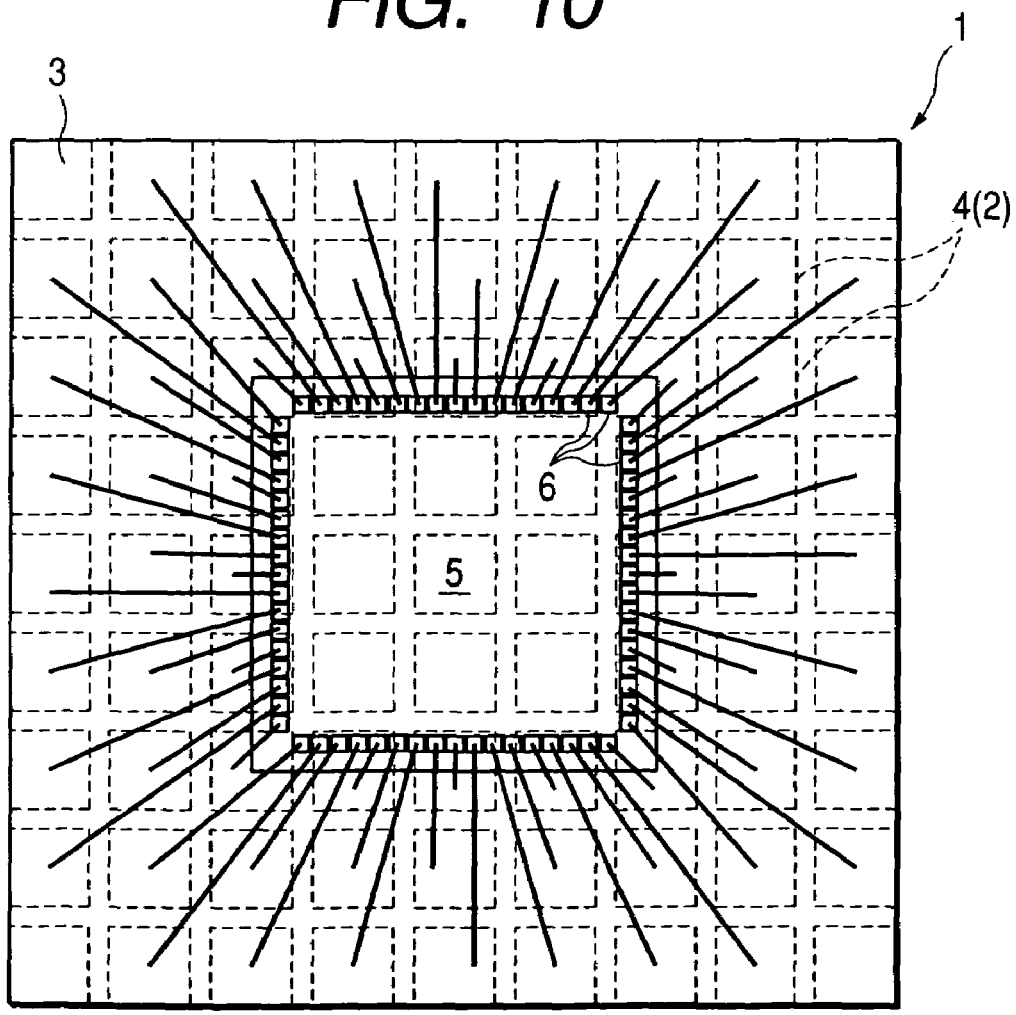
FIG. 10 is a perspective view showing the planar arrangement of the semiconductor device having a three-row terminal construction.
Figure 11:
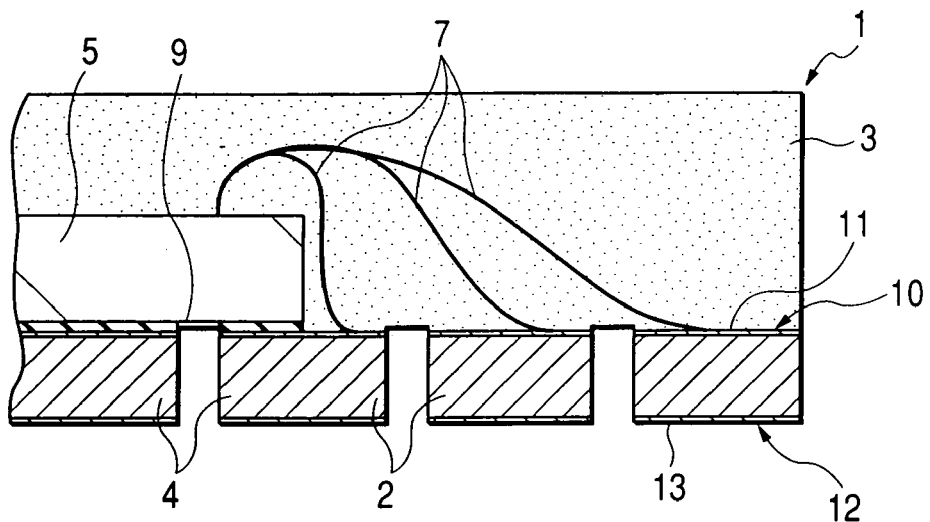
FIG. 11 is an enlarged cross-sectional view of part of the semiconductor device having a three-row terminal construction.

Next, a modification of Embodiment 1 will be described. FIG. 9 to FIG. 11 are diagrams relating to another non-leaded semiconductor device manufactured by the semiconductor device manufacturing method of Embodiment 1. These diagrams show a non-leaded semiconductor device with a three row terminal construction wherein the external electrode terminals 2 are arranged in three rows. Specifically, in this semiconductor device 1, the wires 7 are connected to three rows of partition parts 4 separated from the semiconductor element 5. As contact between the wires is to be avoided, wires are not connected to some of the partition parts 4. The three rows of partition parts 4 to which the wires 7 are connected, are used as the external electrode terminals 2. However, in order to increase mounting strength, the partition parts 4 situated in the region underneath the semiconductor element 5 may also be used for mounting.

Figure 12A:
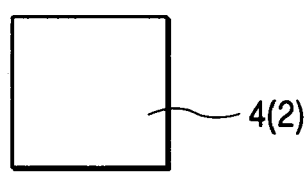
FIGS. 12A and 12B are diagrams showing the shape of external electrode terminals according to a modification of the method of manufacturing the semiconductor device of Embodiment 1.
Figure 12B:
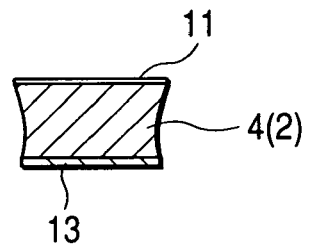

FIGS. 12A and 12B are diagrams showing the shape of the external electrode terminals according to this modification of the manufacturing method of the semiconductor device of Embodiment 1. FIG. 12A is a plan view of the partition part 4, and FIG. 12B is a cross-sectional view. This is achieved by etching, instead of dicing, the substrate 20. Specifically, to form the partition parts in the substrate 20, a photoresist film is selectively exposed and developed to form a predetermined etching mask. The partition parts 4 shown in FIGS. 12A and 12B are then formed by etching the substrate 20 using a predetermined etching liquid.

When the partition parts are formed by etching, partition parts having any desired shape can be formed by the pattern of the etching mask. Therefore, a large partition part effectively corresponding to the semiconductor element fixing region can also be formed, and the semiconductor element can be fixed to a single partition part. In this case, there is the advantage that the heat generated by the semiconductor element 5 can be dissipated by dispersing it uniformly underneath the semiconductor element.

The cutting of the substrate 20 may be performed by another method, for example, it can also be cut by melting with laser beam irradiation. This cutting technique can likewise be applied to the cutting (fragmentation) of the resin layer 3a. In other words, the resin layer 3a can be cut by dicing or laser beam irradiation.

In Embodiment 1, one semiconductor element was integrated in a unit substrate part, but a non-leaded semiconductor device of even higher performance and a higher level of integration can be manufactured by fixing plural semiconductor elements to unit substrate parts, connecting the electrodes of the semiconductor elements to the surrounding partition parts by wires, and fragmenting into the unit substrate regions containing plural semiconductor elements and plural partition parts.

Also, the external electrode terminals 2 can also be formed underneath the semiconductor element 5 by electrically connecting the regions of the external electrode terminals separated from the region in which the semiconductor element 5 is fixed, to the predetermined partition part 4 in which the semiconductor element 5 is fixed, by means of the conductive wires 7, and fixing the semiconductor element 5 to the substrate 20 by an insulating adhesive so as to enclose part of the wires 7. This permits the external electrode terminals 2 to be provided also underneath the semiconductor element, and increases the degree of freedom of design such as interconnection patterning of the mounting board. Further, by connecting the partition parts underneath the semiconductor element 5 to which the wires are connected with other partition parts 4 underneath the semiconductor element 5 by the conductive wires 7, the partition parts 4 can be used as the external electrode terminals 2 even in the center region.

If through holes are also provided at intersection points which divide the substrate 20 transversely and longitudinally, when dicing is performed, the cutting time is shortened, and the time required for forming the partition parts (external electrode terminals) is shortened. Further, manufacturing burrs in the cutting intersection parts due to the dicing blade occur to an even lesser extent.

Figure 13A:
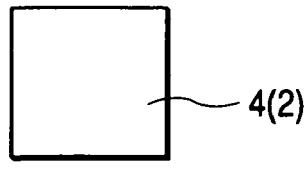
FIGS. 13A and 13B are diagrams showing the shape of external electrode terminals according to another modification of the method of manufacturing the semiconductor device of Embodiment 1.
Figure 13B:
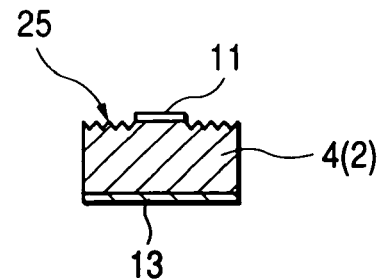

It is preferred that bonding strength enhancement is given to the principal surface of the substrate 20 so that the partition parts 4 are strongly bonded to the sealing resin (sealing package). As one way of doing this, for example as shown in FIG. 13, the plating film 11 is provided only in the central part of the partition part 4, and the periphery is left as a rough surface 25 (roughening). Alternatively, although not shown in Embodiment 1, grooves or depressions may be provided to increase the contact surface area with the resin sealing body 33. By adopting these techniques, the mounting reliability of the external electrode terminals 2 of the semiconductor device 1 is increased.

Herein, an example was described where all the semiconductor elements 5 and wires 7 were molded by the resin on the substrate 20 using a transfer molding device, but the semiconductor elements 5 on the substrate 20 can also be molded individually. In this case, the substrate 20 can be fragmented into the semiconductor devices 1 simply by cutting.

In Embodiment 1, an example was described where fragmentation was performed into the unit substrate parts, but interconnected semiconductor elements may also be respectively fixed to unit substrates, and one semiconductor device formed by these plural unit substrates. In this case, the chipset can be provided as one package.

In this embodiment, a matrix type substrate was used as the substrate, but a fragmented type substrate may also be used.

Embodiment 2

Figure 14A:
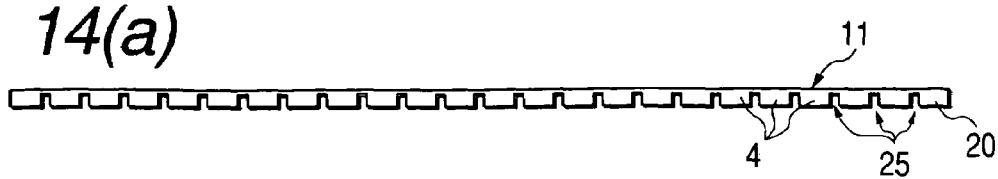
FIGS. 14A to 14G are cross-sectional views of steps showing the method of manufacturing the non-leaded semiconductor device according to another embodiment (Embodiment 2) of this invention.
Figure 14B:
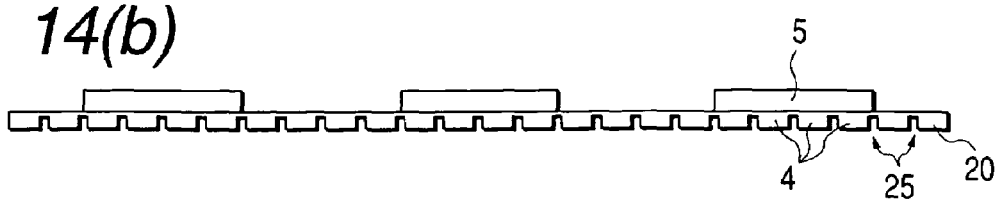
Figure 14C:
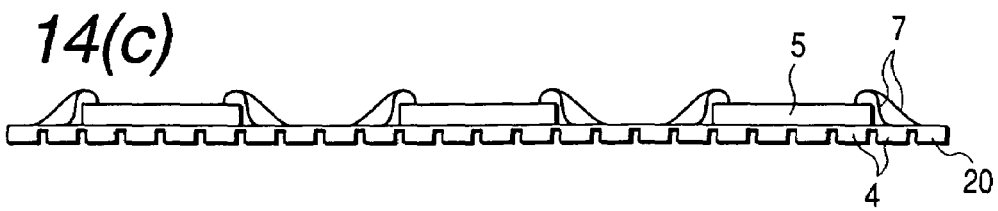
Figure 14D:
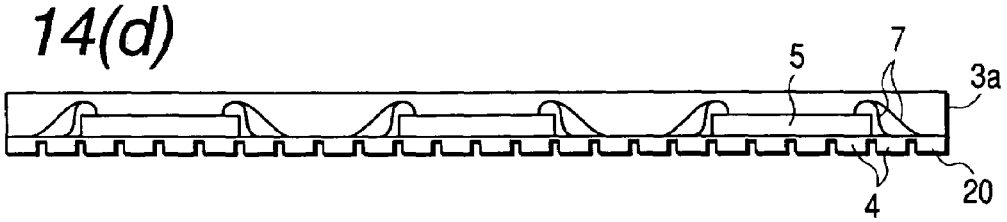
Figure 14E:
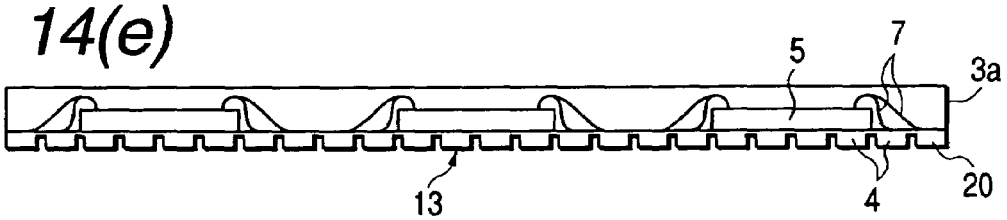
Figure 14F:
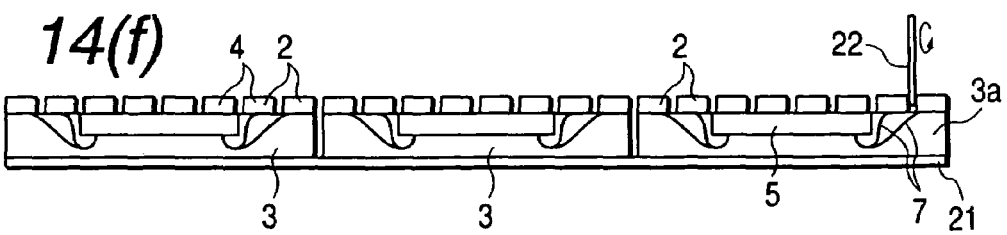
Figure 14G:
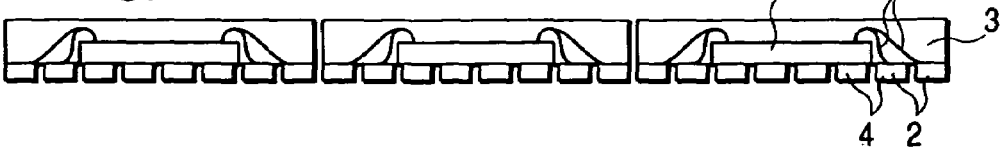
Figure 15:
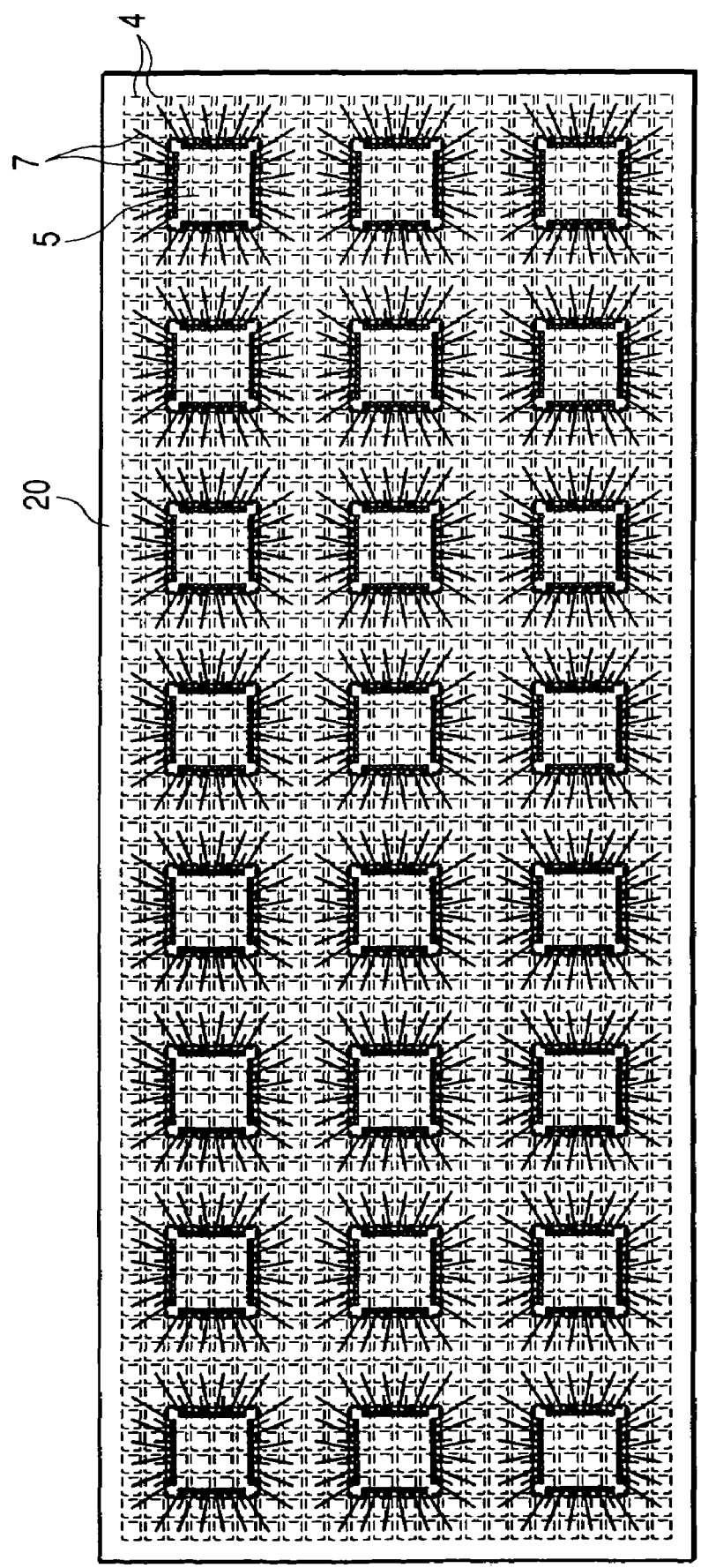
FIG. 15 is a plan view showing the state where, in the manufacture of the non-leaded semiconductor device, a semiconductor element is fixed to a substrate and wires are attached thereto.

FIG. 14 and FIG. 15 are diagrams relating to the method of manufacturing the non-leaded semiconductor device according to another embodiment (Embodiment 2) of this invention. FIG. 14 is a cross-sectional view of the steps showing the method of manufacturing the semiconductor device, and FIG. 15 is a plan view of the substrate to which semiconductor elements are fixed and wires are attached.

In Embodiment 2, grooves 25 are formed along the lines which cut the substrate 20 in Embodiment 1. The grooves 25 may be formed by a dicing blade or by etching, but are formed by etching in Embodiment 1. Regarding the forming of the grooves 25, although not shown, a photoresist film is provided over the whole surface of the substrate 20, and exposed to a predetermined pattern. Subsequently, the photoresist film is developed to form a checkered pattern of grooves, and the checkered pattern of grooves 25 is then provided on one surface of the substrate 20 by etching. In Embodiment 2, a copper plate of thickness 0.125-0.2 mm is for example used as the substrate 20 as in Embodiment 1. The thickness of the groove bases of the grooves 25 may for example be approximately 50 µm.

According to this method, the cutting depth of the dicing blade 22 is only the groove bases of the grooves 25, and due to the decrease in the amount of cutting, the time required for forming the external electrode terminals and fragmentation is shortened.

Also, due to the reduction in the amount of cutting, the dicing blade 22 has less wear, and the life of the dicing blade 22 is extended.

This Embodiment 2 is an example wherein the non-leaded semiconductor device 1 is manufactured by providing the grooves 25 on the rear surface of the substrate 20. The method of manufacturing the semiconductor device will be described referring to the cross-sectional views of the steps in FIGS. 14A to 14G. As shown in FIG. 14A, the conductive substrate 20 is first provided as in Embodiment 1. Subsequently, the grooves 25 are formed transversely and longitudinally by etching as described above on the rear surface of this substrate 20. As shown in FIG. 15, a matrix of the partition parts 4 is formed by the checkered pattern of the grooves 25. Regarding the dimensions of the partition parts 4, each transverse and longitudinal side is 0.5 mm as in the case of Embodiment 1. FIG. 15 is a plan view of the substrate 20 when the semiconductor elements 5 are fixed to the surface where the grooves are not present, i.e., to the principal surface of the substrate 20, and the connections of the wires 7 have been completed. In the same figure, the grooves 25 and partition parts 4 are shown by broken lines. The plating film 11, not shown, for obtaining satisfactory fixing (connections) of the semiconductor elements 5 and wires 7 is also formed before or after forming the grooves 25.

Next, the semiconductor elements 5 are fixed as in Embodiment 1 to the surface where grooves are not present, i.e., to the principal surface of the substrate 20, and as shown in FIG. 14C, the electrodes of the semiconductor elements 5 are connected to the principal surface of the substrate, i.e., the rear surfaces of the partition parts 4 separated from the semiconductor elements 5, by the conductive wires 7 (FIG. 15).

Next, as shown in FIG. 14D, the resin layer 3a of an insulating resin is formed on the principle surface of the substrate 20 by transfer molding so as to cover the semiconductor elements 5 and wires 7. The resin layer 3a is formed to a uniform thickness. The semiconductor elements 5 and wires 7 are covered by the resin so as to leave no gaps.

Next, as shown in FIG. 14E, the external mounting plating film 13, not shown, is formed on the rear surface of the substrate (front surfaces of the partition parts 4) as in Embodiment 1.

Next, as shown in FIG. 14F, the tape 21 is affixed as a supporting member over the whole of the front surface of the resin layer 3a, and the substrate 20 is then cut transversely and longitudinally by the dicing blade 22 with the substrate 20 facing upwards. The groove bases of the grooves 25 are cut and removed while the dicing blade 22 moves relatively along the extension direction of the grooves 25. In this case also, care is taken not to cut the rear surfaces of the semiconductor elements 5 by the dicing blade.

The substrate 20 and the resin layer 3a attached to the substrate 20 are cut by the dicing blade 22 between the unit substrate parts so as to perform fragmentation. By cutting the substrate 20, the partition parts 4 become electrically isolated partition parts 4. Further, due to the cutting of the resin layer 3a, the resin sealing package 3 is formed.

Next, as shown in FIG. 14G, plural non-leaded semiconductor devices 1 are manufactured by peeling the tape 21 off the resin sealing package 3.

In this embodiment 2, an example was described where the grooves 25 were provided in a checkered pattern of equal pitch, but the invention is not limited to this case. Specifically, when the partition parts are squares, the grooves are provided at equal pitch, but when the partition parts are rectangles, the transverse and longitudinal groove pitches are different. Partition parts which have partially different dimensions may also be formed.

Further, when the cutting and separation of the substrate is cutting by laser beam irradiation or cutting by etching, the shape and dimensions of the partition parts may also be varied between adjacent partition parts.

Embodiment 2 has the following advantages.

(1) The external electrode terminals 2 are formed in two rows along the periphery (sides) of the non-leaded semiconductor device, so the number of the external electrode terminals 2 can be increased.

(2) In a non-leaded semiconductor device which requires a large number of external electrode terminals, the external electrode terminals have to be aligned in one row along one side of the sealing package, so the length of one side of the package has to be increased, the sealing package becomes larger and the semiconductor device becomes large, but in the case of Embodiment 2, the external electrode terminals 2 are disposed in two rows along the sides of the semiconductor device, so the sealing package 3 can be made smaller, and the semiconductor device 1 can be made compact.

(3) Due to the aforesaid (1) and (2), the number of external electrode terminals 2 can be increased even in a small resin sealing package, so large numbers of terminals are possible. This is desirable in a multi-function semiconductor device.

(4) As the external electrode terminals 2 are formed by cutting transversely and longitudinally by the dicing blade, the shape and dimensions of the external electrode terminals 2 can be controlled to a high precision.

(5) As the external electrode terminals 2 are formed by cutting a metal plate transversely and longitudinally by the dicing blade, long projections (manufacturing burrs) due to cutting do not easily occur on the periphery of the external electrode terminals, and the electrode flatness improves. As a result, when the non-leaded semiconductor device is mounted on the interconnection board 15 such as a motherboard, modular board or mounting board using solder or the like, faulty contacts of the external electrode terminals 2 with the lands (interconnections) 17 of the mounting board due to projections do not easily occur, so mounting strength is improved and mounting reliability is improved.

(6) As the partition parts (external electrode terminals) can easily be formed by cutting one metal plate, the cost of manufacturing the semiconductor device is reduced.

(7) In the cutting of the substrate 20, the cutting depth of the dicing blade 22 is only the groove bases of the grooves 25, and due to the decrease in the amount of cutting, the time required for forming the external electrode terminals and fragmentation is shortened.

(8) From the above (7), due to the decrease in the amount of cutting, the dicing blade 22 has less wear, the life of the dicing blade 22 is extended and the cost of manufacturing the semiconductor device 1 is reduced.

(9) According to the aforesaid (1)-(8), a non-leaded semiconductor device which has a high mounting reliability, is compact and has large numbers of external electrode terminals, can be manufactured economically.

According also to Embodiment 2, various modifications can be applied as in the case of Embodiment 1, and in this case, an identical effect to that of Embodiment 1 is obtained.

Embodiment 3

FIGS. 16A to 16G are cross-sectional views of steps showing the method of manufacturing a non-leaded semiconductor device according to another embodiment (Embodiment 3) of this invention. In this Embodiment 3, the substrate 20 used in the manufacture of the semiconductor device 1 has a construction wherein, unlike Embodiment 2, the grooves 25 are provided in a checkered pattern on the side on which the semiconductor elements are fixed. In other words, the substrate 20 comprising the grooves 25 which was used in Embodiment 2 is inverted.

Figure 16A:
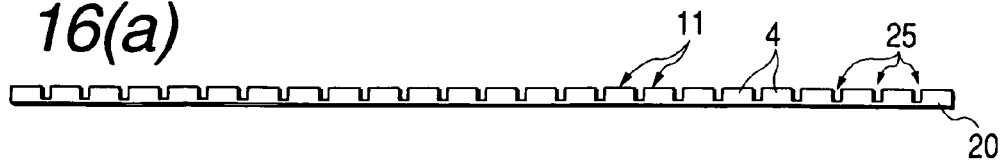
FIGS. 16A to 16G are cross-sectional views of steps showing a method of manufacturing a non-leaded semiconductor device according to another embodiment (Embodiment 3) of this invention.
Figure 16B:
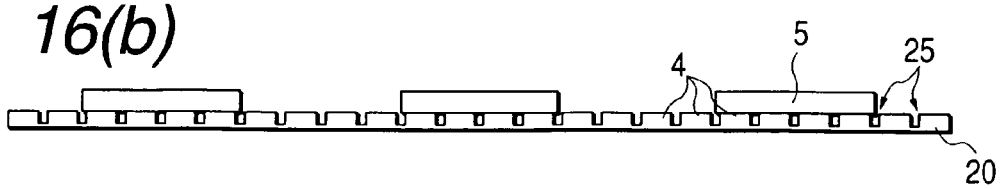

The method of manufacturing the non-leaded semiconductor device of Embodiment 3 will be described referring to the cross-sectional views of the steps of FIGS. 16A to 16G. As shown in FIG. 16A, after forming the checkered pattern of the grooves 25 on the upper surface (front surface), the semiconductor elements 5 are fixed to the surface where the grooves 25 are present as in Embodiment 1 and Embodiment 2.

Figure 16C:
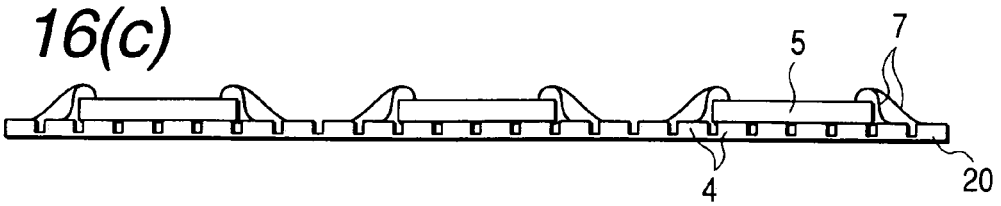

Next, as shown in FIG. 16C, the electrodes of the semiconductor elements 5 are connected to the principal surface side of the substrate, i.e., the rear surfaces of the partition parts 4 separated from the semiconductor elements 5, by the conductive wires 7.

Figure 16D:
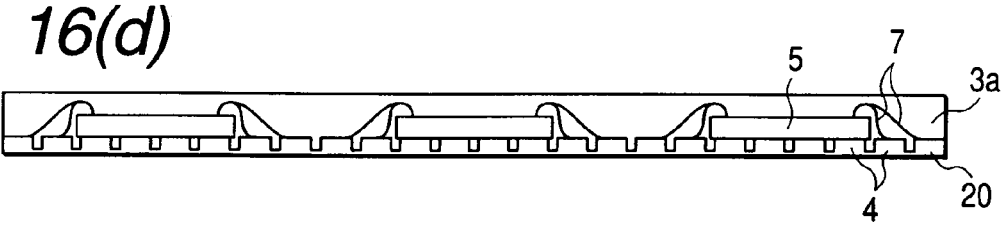
Figure 16E:
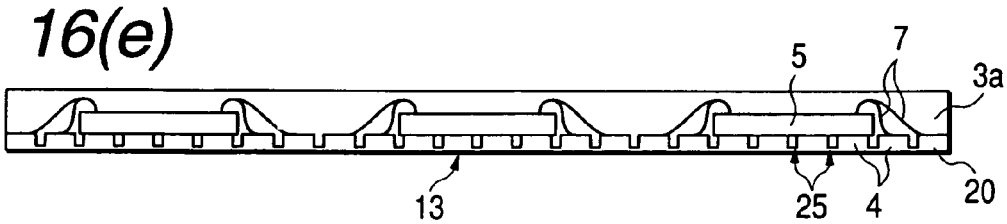

Next, as shown in FIG. 16D, the resin layer 3a is formed by an insulating resin on the principal surface of the substrate 20 by transfer molding so as to cover the semiconductor elements 5 and wires 7. The resin layer 3a is formed to a uniform thickness. Further, the semiconductor elements 5 and wires 7 are covered by the resin without leaving any gaps Next, as shown in FIG. 16E, the external mounting plating film 13, not shown, is formed on the rear surface of the substrate 20 (front surfaces of the partition parts 4).

Figure 16F:
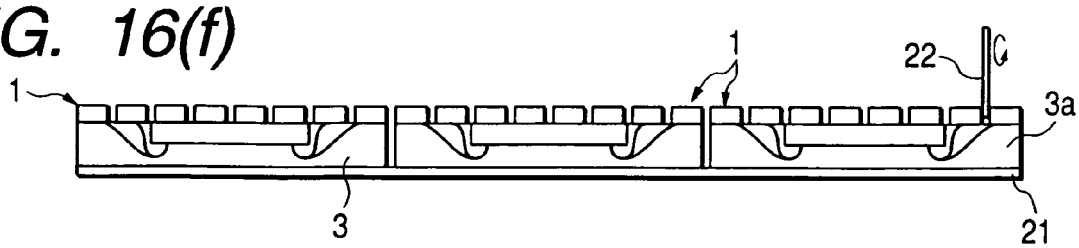

Next, shown in FIG. 16F, the tape 21 is affixed as a supporting member over the whole of the front surface of the resin layer 3a, and the substrate 20 is then cut transversely and longitudinally by the dicing blade 22 with the substrate 20 facing upwards. The groove bases of the grooves 25 are cut and removed while the dicing blade 22 is moved relatively along the extension direction of the grooves 25. In this case also, care is taken not cut the rear surfaces of the semiconductor elements 5 with the dicing blade.

The substrate 20 and the resin layer 3a attached to the substrate 20 are cut by the dicing blade 22 between the unit substrate regions so as to perform fragmentation. Due to the cutting of the substrate 20, the partition parts 4 become electrically isolated partition parts 4. Further, by cutting the resin layer 3a, the resin sealing package 3 is formed.

Figure 16G:
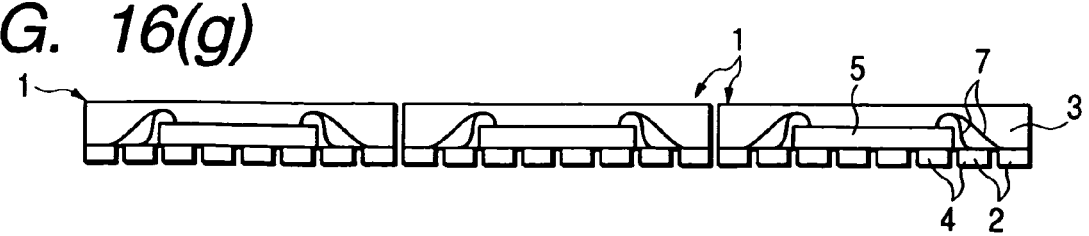

Next, as shown in FIG. 16G, plural non-leaded semiconductor devices 1 are manufactured by peeling the tape 21 off the resin sealing package 3.

Embodiment 3 has identical advantages to those of Embodiment 2. Also, in Embodiment 3, various modifications may be made as in Embodiment 1, in which case identical advantages to those of Embodiment 1 are obtained.

Figure 17:
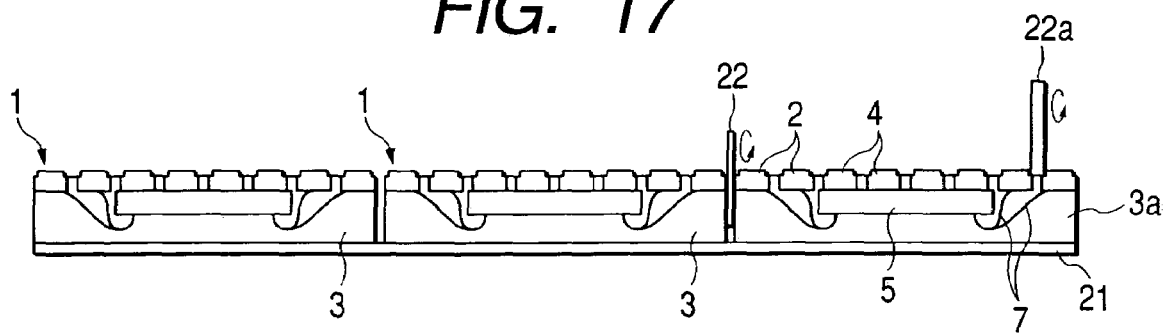
FIG. 17 is a cross-sectional view showing a dicing state in the manufacture of a non-leaded semiconductor device according to a Modification 1 of Embodiment 3.
Figure 18:
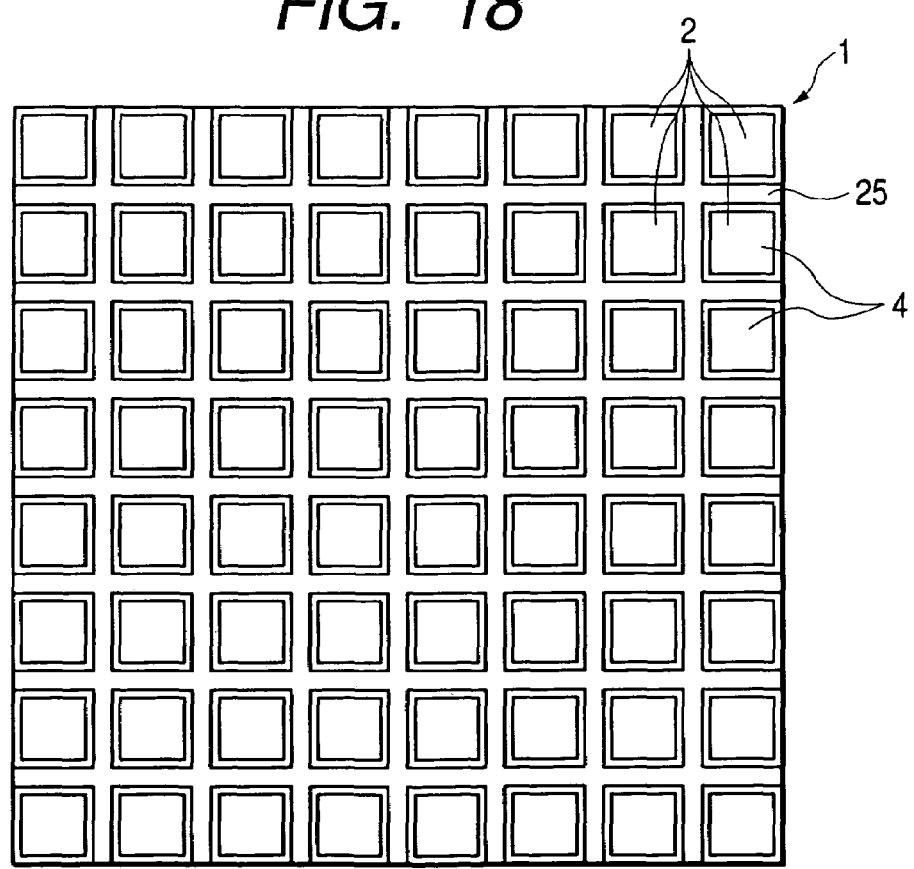
FIG. 18 is a base plan view of the semiconductor device manufactured by Modification 1 of Embodiment 3.
Figure 19:
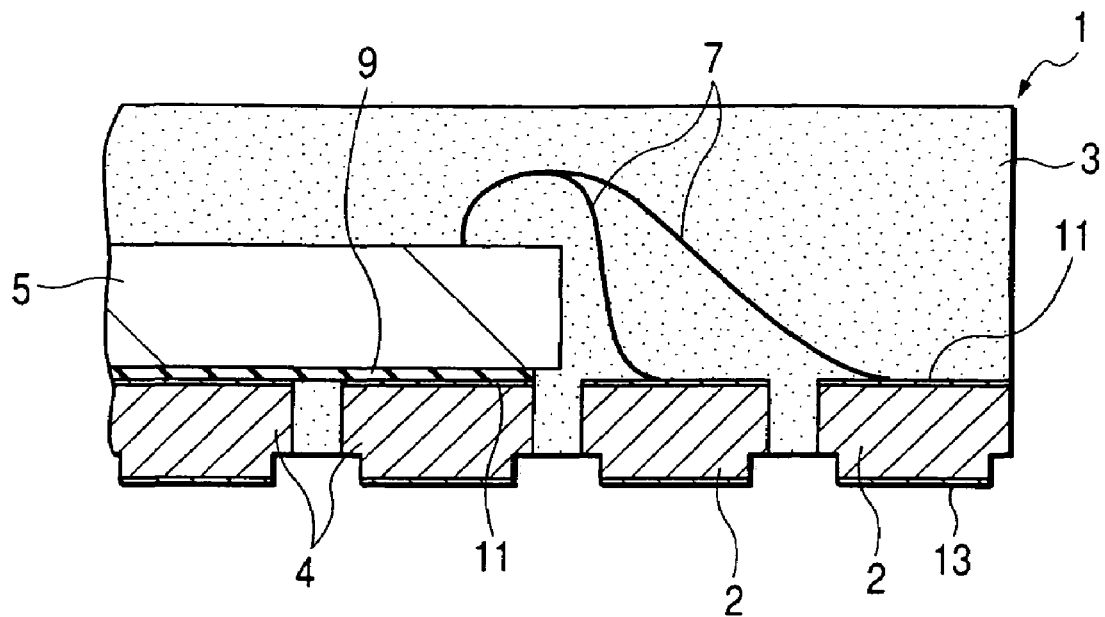
FIG. 19 is an enlarged cross-sectional view of part of the semiconductor device manufactured by Modification 1 of Embodiment 3.

FIG. 17 to FIG. 19 are diagrams relating to the manufacture of a semiconductor device according to a Modification 1 of Embodiment 3. FIG. 17 is a cross-sectional view showing the dicing state in the manufacture of the semiconductor device, FIG. 18 is a base view of the manufactured semiconductor device, and FIG. 19 is an enlarged cross-sectional view of part of the semiconductor device.

Modification 1 concerns the dicing blade 22 which cuts the groove bases of the grooves 25 of the substrate 20. The dicing which isolates unit substrate regions from unit substrate regions is performed by the dicing blade 22 having the same thickness as the width of the grooves 25 as in Embodiment 2, however the dicing which forms the partition parts 4 (external electrode terminals 2) is performed by a dicing blade 22a which is wider (thicker) than the groove width of the grooves 25.

In the case of Modification 1, as shown in FIG. 18 and FIG. 19, the interval between the mounting surfaces of the external electrode terminals 2 is wider, and as a result, shorts between the external electrode terminals 2 due to the PbSn solder which is the bonding material used for mounting do not easily occur.

Figure 20:
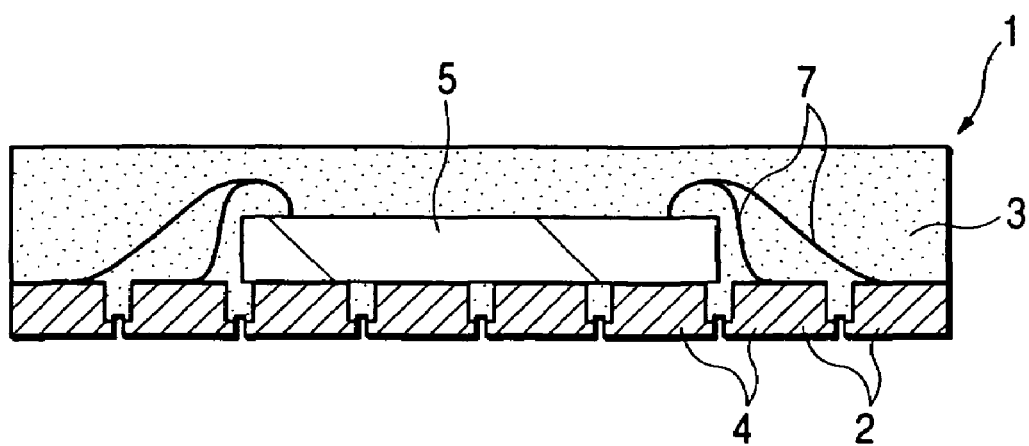
FIG. 20 is a cross-sectional view of the semiconductor device manufactured by a Modification 2 of Embodiment 3.
Figure 21:
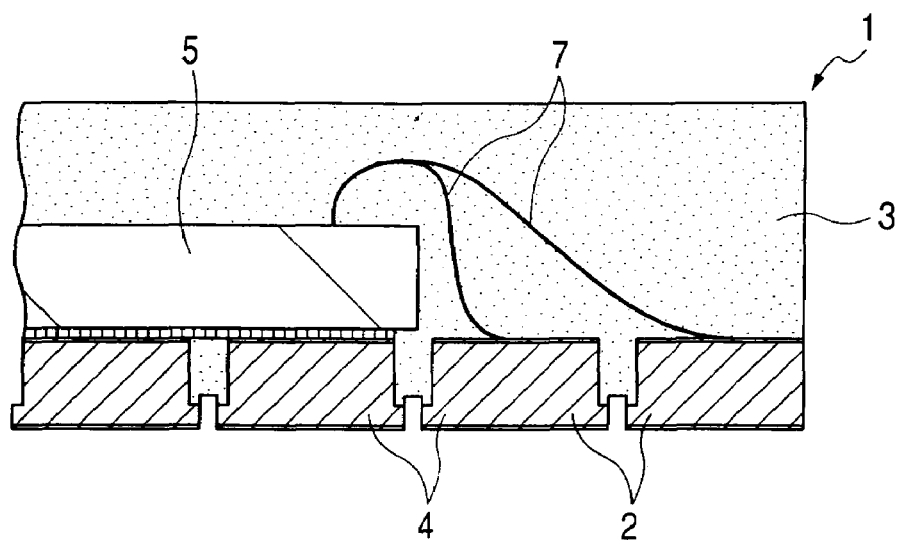
FIG. 21 is an enlarged cross-sectional view of part of the semiconductor device manufactured by Modification 2 of Embodiment 3.

FIG. 20 and FIG. 21 are diagrams relating to the manufacture of a semiconductor device according to a Modification 2 of Embodiment 3. FIG. 20 is a cross-sectional view of the manufactured semiconductor device, and FIG. 21 is an enlarged cross-sectional view of part of the semiconductor device. In this Modification 2, unlike Modification 1, the dicing blade which cuts the partition parts 4 (external electrode terminals 2) is narrower (thinner) than the groove width of the grooves 25.

In Modification 2, due to the reduced amount of cutting, the life of the dicing blade is extended.

Figure 22:
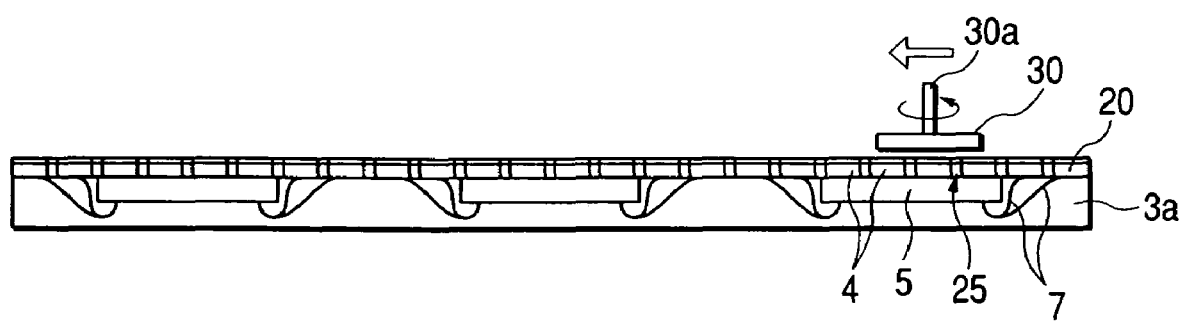
FIG. 22 is a schematic cross-sectional view showing the state where, in the manufacture of the semiconductor device according to a Modification 3 of Embodiment 3, external electrode terminals are formed by polishing.

FIG. 22 and FIG. 23 are diagrams relating to the manufacture of a semiconductor device according to a Modification 3 of Embodiment 3. FIG. 22 is a schematic cross-sectional view showing the formation of the external electrode terminals by polishing in the manufacture of the semiconductor device, and FIG. 23 is a schematic plan view showing the polishing of the front surface of the substrate. In Modification 3, as shown in FIG. 23, a rotating grinder 30 is moved in contact from one edge to the other edge of the substrate 20, and the groove bases of the grooves 25 are removed by polishing. To simplify the description, in FIG. 22, the grinder 30 supported by a rotating shaft 30a is shown smaller.

Prior to this polishing, in Modification 3, after forming the resin layer 3a by transfer molding, the tape 21 is not affixed. Also, fragmentation is performed by dicing or laser beam irradiation.

In Modification 3, the fragmentation of the terminals can be performed in a short time.

Figure 24A:
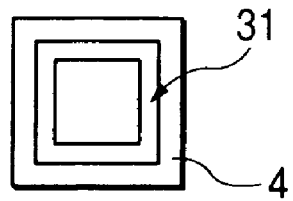
FIGS. 24A and 24B are diagrams showing the shape of external electrode terminals in a Modification 4 of Embodiment 3.
Figure 24B:
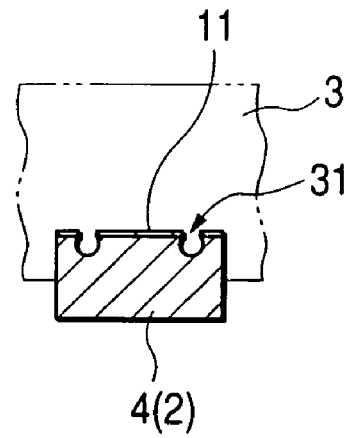

FIG. 24 is a diagram showing the shape of the external electrode terminals in the manufacture of a semiconductor device according to a Modification 4 of Embodiment 3. In Modification 4, grooves 31 are provided facing the resin layer 3a of the partition part 4. The insulating resin forming the resin sealing package 3 is introduced into these grooves 31, so the bonding strength with the partition parts 4 (external electrode terminals 2) is improved, the partition parts 4 (external electrode terminals 2) do not fall out so easily from the semiconductor device 1, and product reliability increases.

Figure 25A:
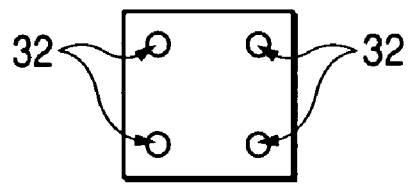
FIGS. 25A and 25B are diagrams showing the shape of external electrode terminals in a Modification 5 of Embodiment 3.
Figure 25B:
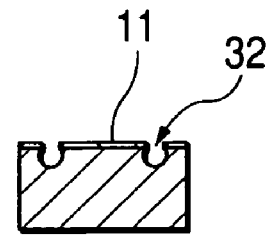

FIG. 25 is a diagram showing the shape of the external electrode terminals in the manufacture of a semiconductor device according to a Modification 5 of Embodiment 3. In Modification 5, plural depressions 32 are provided in the surface facing the resin layer 3a of the partition parts 4. The insulating resin which forms the resin sealing package 3 is introduced into these depressions 32, so the bonding strength with the partition parts 4 (external electrode terminals 2) is improved, the partition parts 4 (external electrode terminals 2) do not fall out so easily from the semiconductor device 1, and product reliability increases.

Embodiment 4

FIG. 26 is a cross-sectional view of steps showing the method of manufacturing a non-leaded semiconductor device according to another embodiment (Embodiment 4) of this invention. In Embodiment 4, the grooves 25 are not provided on one surface of the substrate 20 as in Embodiment 3, but are provided on both sides of the substrate 20 so that they are facing each other. The grooves 25 are provided on both sides of the substrate 20, and the groove bases have a predetermined thickness as mechanical strength is required. For example, the thickness of the bases grooves 25 may be 50 µm.

Figure 26A:
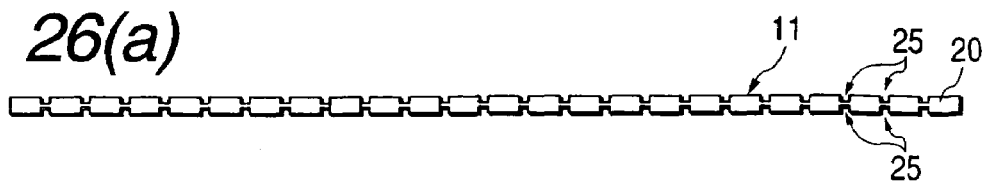
FIGS. 26A and 26G are cross-sectional views of steps showing a method of manufacturing a non-leaded semiconductor device according to another embodiment (Embodiment 4) of this invention.
Figure 26B:

The method of manufacturing the non-leaded semiconductor device of Embodiment 4 will be described referring to the cross-sectional views of the steps of FIGS. 26A to 26G. As shown in FIG. 26A, the semiconductor elements 5 are fixed as in Embodiment 3 to one surface of the substrate 20 wherein the grooves 25 are provided correspondingly on both surfaces in a checkered pattern (FIG. 26B).

Figure 26C:
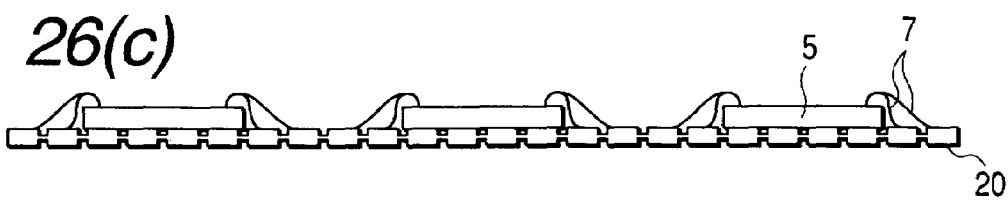

Next, as shown in FIG. 26C, the electrodes of the semiconductor elements 5 are connected to the principal surface side of the substrate, i.e., the rear surfaces of the partition parts 4 separate from the semiconductor elements 5, by the conductive wires 7.

Figure 26D:
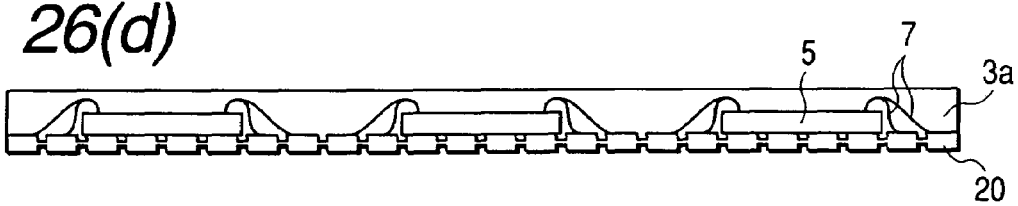

Next, as shown in FIG. 26D, the resin layer 3a is formed by an insulating resin on the principle surface of the substrate 20 by transfer molding so as to cover the semiconductor elements 5 and wires 7. The resin layer 3a is formed to a uniform thickness. The semiconductor elements 5 and wires 7 are covered by the resin so as not to leave any gaps.

Figure 26E:
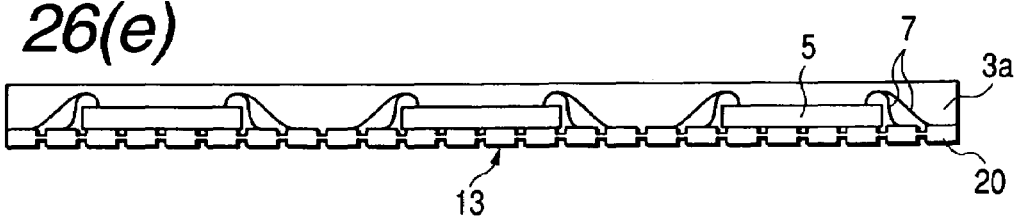

Next, as shown in FIG. 26E, the external plating film 13, not shown, is formed on the rear surface of the substrate 20 (front surfaces of the partition parts 4) as in Embodiment 1.

Figure 26F:
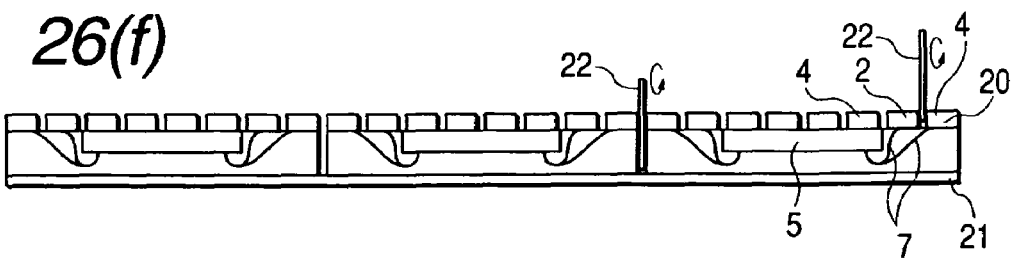
Figure 26G:
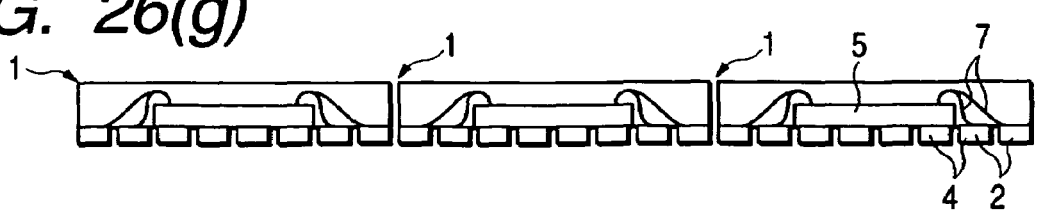

Next, as shown in FIG. 26F, the tape 21 is affixed as a supporting member over the whole of the front surface of the resin layer 3a, and the substrate 20 is then cut transversely and longitudinally by the dicing blade 22 with the substrate 20 facing upwards. The groove bases of the grooves 25 are cut and removed while the dicing blade 22 moves relatively along the extension direction of the grooves 25. In this case also, care is taken not to cut the rear surfaces of the semiconductor elements 5 by the dicing blade.

The substrate 20 and the resin layer 3a attached to the substrate 20 are cut by the dicing blade 22 between the unit substrate parts so as to perform fragmentation. By cutting the substrate 20, the partition parts 4 become electrically isolated partition parts 4. Further, due to the cutting of the resin layer 3a, the resin sealing package 3 is formed.

Next, as shown in FIG. 14G, plural non-leaded semiconductor devices 1 are manufactured by peeling the tape 21 off the resin sealing package 3.

Embodiment 4 has some of the advantages of Embodiment 2 and Embodiment 3. Also, in Embodiment 4, various modifications may be applied as in Embodiment 1, and in this case, identical advantages to those of Embodiment 1 are obtained.

It is a characteristic feature of Embodiment 4 that, as the outline portion on the mounting surface of the partition parts 4 (external electrode terminals 2) is determined to be a minimum by the grooves 25, the partition parts 4 (external electrode terminals 2) can be formed in a precise shape.

Figure 27:
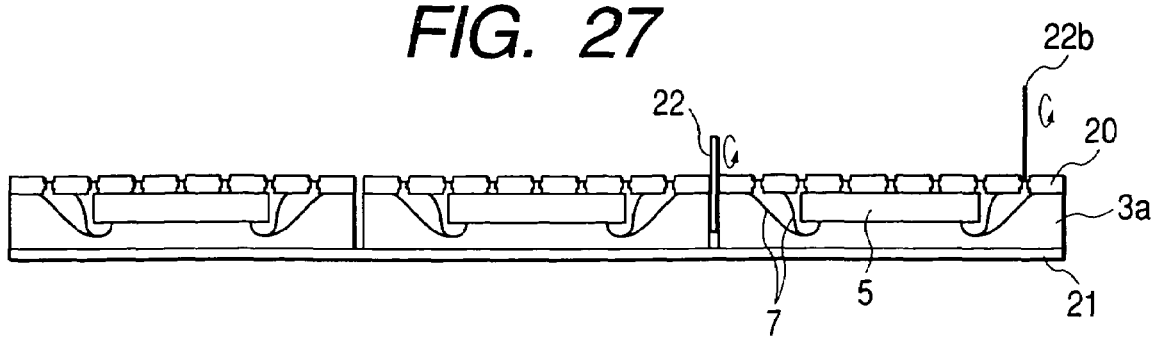
FIG. 27 is a cross-sectional view showing a dicing state in the manufacture of a semiconductor device according to a Modification 1 of Embodiment 4.
Figure 28:
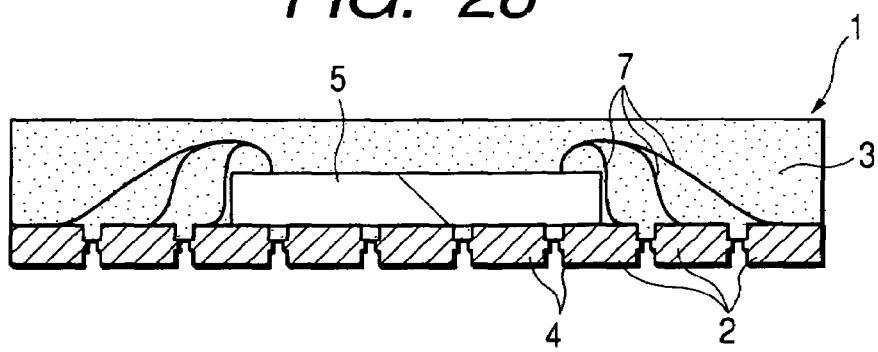
FIG. 28 is a cross-sectional view of the semiconductor device manufactured by Modification 1 of Embodiment 4.
Figure 29:
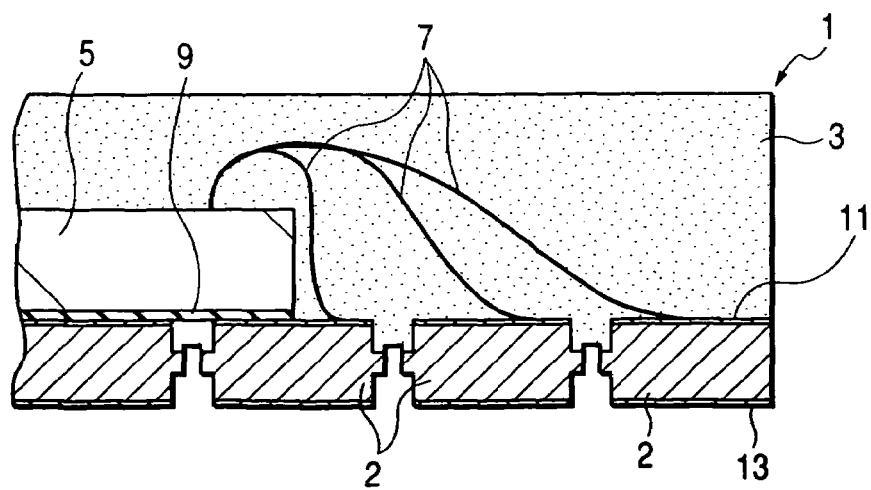
FIG. 29 is an enlarged cross-sectional view of part of the semiconductor device manufactured by Modification 1 of Embodiment 4.

FIGS. 27 to 29 are diagrams relating to the manufacture of a semiconductor device according to a Modification 1 of Embodiment 4. FIG. 27 is a cross-sectional view showing a dicing state, FIG. 28 is a cross-sectional view of the manufactured semiconductor device, and FIG. 29 is an enlarged cross-sectional view of part of the semiconductor device.

Embodiment 4 concerns the dicing blade 22 which cuts the groove bases of the grooves 25 of the substrate 20. As shown in FIG. 27, the dicing which isolates unit substrate regions from unit substrate regions is performed by the dicing blade 22 having the same thickness or about the same thickness as the width of the grooves 25 as in Embodiment 2, however the dicing which forms the partition parts 4 (external electrode terminals 2) is performed by a dicing blade 22b which is wider (thicker) than the groove width of the grooves 25.

In the case of Modification 4, the interval between adjacent external electrode terminals 2 (partition parts 4) on the mounting surface is wider than the groove bases, so when the non-leaded semiconductor device is mounted by PbSn solder, adjacent partition parts 4 (external electrode terminals 2) do not come into electrical contact due to the PbSn solder and mounting reliability is increased.

In Modification 1 of Embodiment 4, three rows of the external electrode terminals 2 are provided on each side of the semiconductor device 1. Therefore, the semiconductor device 1 can be made even more compact, and can be provided with plural terminals.

FIGS. 30A to 30D are cross-sectional views of steps of one part of the method of manufacturing the semiconductor device according to a Modification 2 of Embodiment 4. In Modification 2 of Embodiment 4, in FIGS. 30A to 30D, only provision of the substrate 20 (FIG. 30A), filling of the grooves 25 on the surface where the semiconductor elements are attached by the filling material 33 (FIG. 30B), fixing of the semiconductor elements (FIG. 30C) and wire bonding (FIG. 30D) are shown. The grooves 25 may for example be filled by an insulating epoxy resin by the screen printing method. The front surface of the filling material 33 approximately coincides with the front surface of the substrate 20 so as not to interfere with the fixing of the semiconductor elements.

By filling the grooves 25 on the surface where the semiconductor elements 5 are fixed with the filling material 33, the rear surfaces of the semiconductor elements 5 are always blocked even when the external electrode terminals 2 (partition parts 4) are formed by dicing, so entry of moisture into the grooves 25 is prevented and the reliability of the semiconductor device is increased.

Embodiment 5

Figure 31:
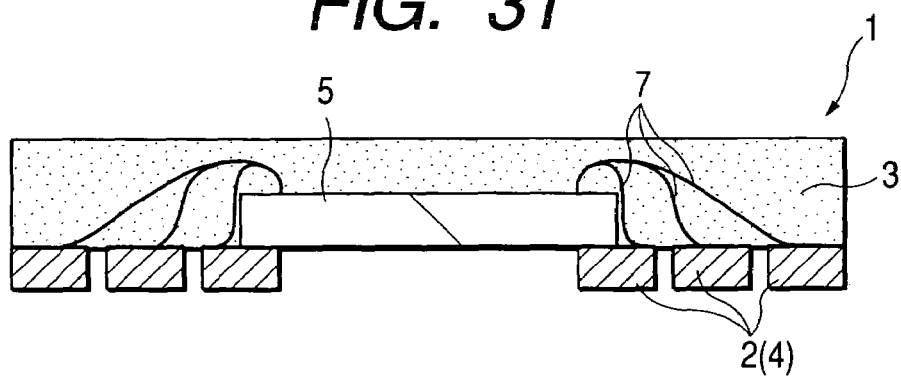
FIG. 31 is a cross-sectional view of a non-leaded semiconductor device manufactured by a semiconductor device manufacturing method according to another embodiment (Embodiment 5) of this invention.
Figure 32:
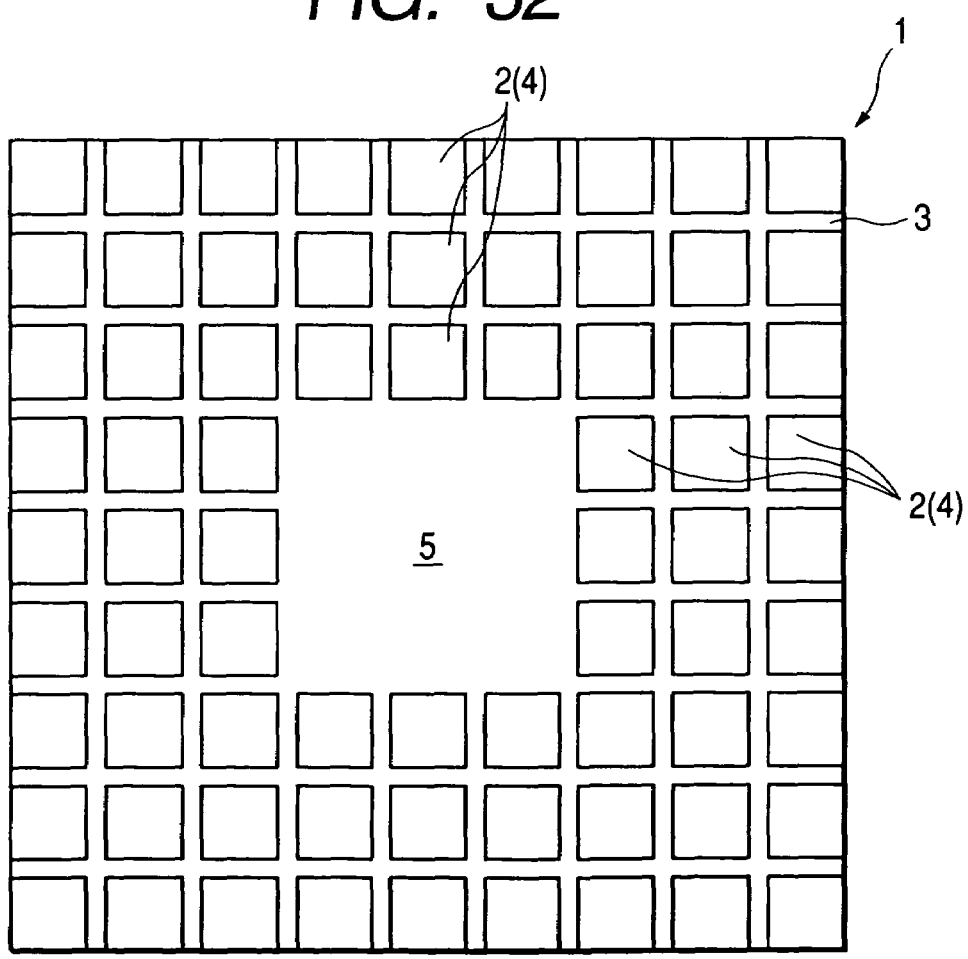
FIG. 32 is a base plan view of the semiconductor device of Embodiment S.

FIG. 31 is a cross-sectional view of a non-leaded semiconductor device manufactured by a method according to another embodiment (Embodiment 5) of this invention, and FIG. 32 is a base plan view of the semiconductor device. Embodiment 5 has a stand-off construction wherein a predetermined gap is left between the rear surfaces of the semiconductor elements 5 and the interconnection board during mounting, by removing the partition parts 4 inside the three rows of the external electrode terminals 2 arranged along the sides of the semiconductor device 1. The semiconductor device 1 having the structure shown in FIG. 31 can be manufactured by providing a rectangular hole which is a stand-off in the center part of the unit substrate parts of the substrate 20, and then performing chip bonding, wire bonding, transfer molding, dicing and fragmentation. FIG. 32 is a base plan view of the semiconductor device 1, there being no partition parts 4 (external electrode terminals 2) in the center part.

Due to this stand-off construction, even if there is a foreign body on the mounting board during mounting, it does not easily interfere as there is a space underneath the semiconductor element 5.

Embodiment 6

Figure 33:
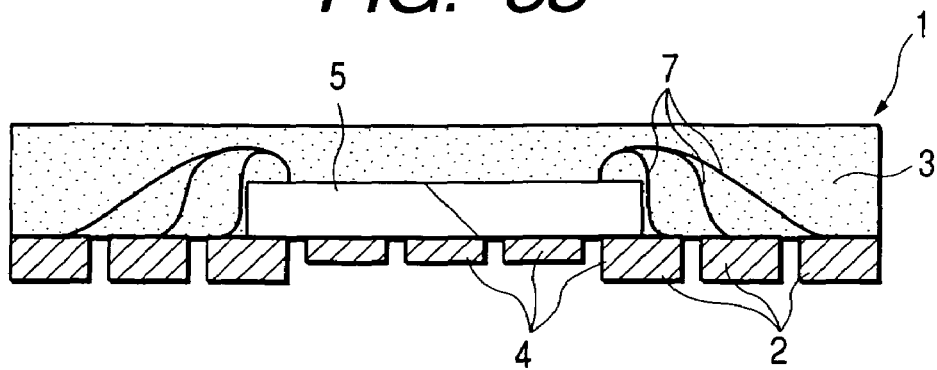
FIG. 33 is a cross-sectional view of a non-leaded semiconductor device manufactured by a semiconductor device manufacturing method according to another embodiment (Embodiment 6) of this invention.
Figure 34:
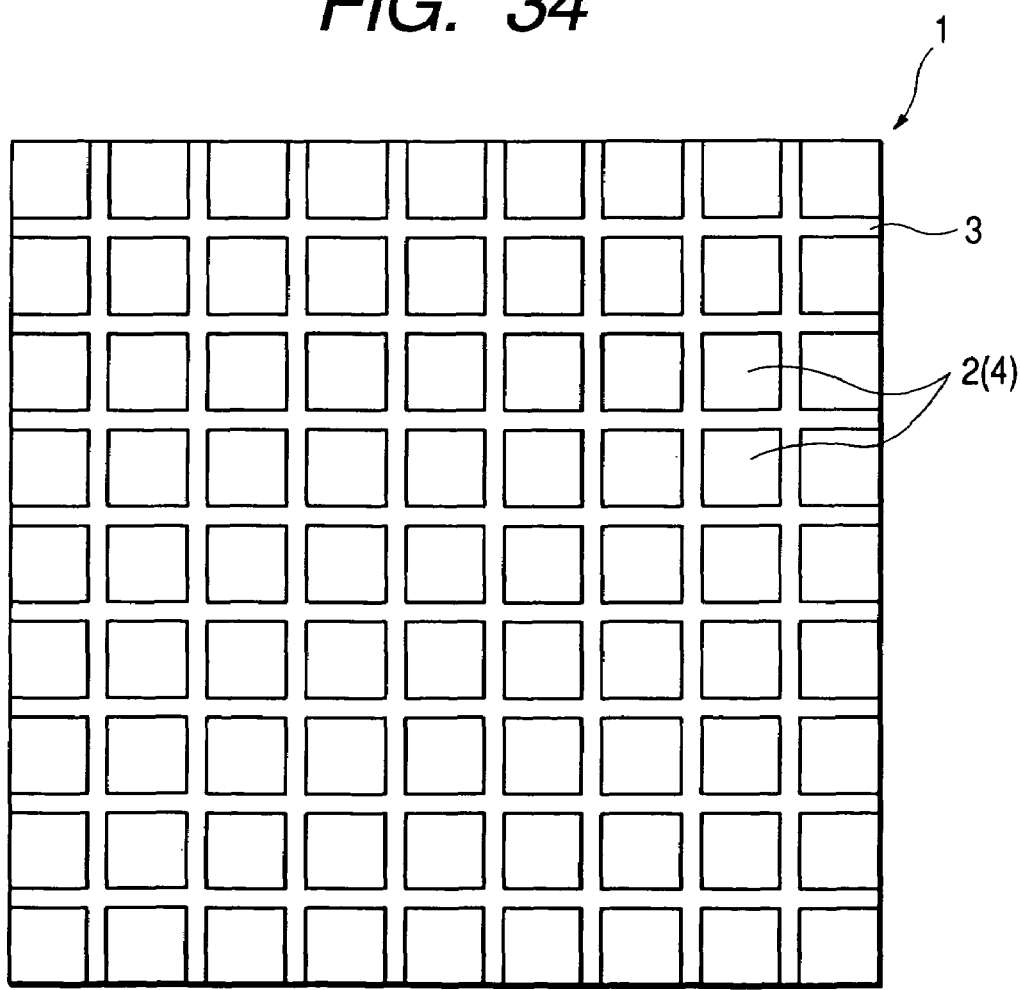
FIG. 34 is a base plan view of the semiconductor device of Embodiment 6.

FIG. 33 is a cross-sectional view of a non-leaded semiconductor device manufactured by a method according to another embodiment (Embodiment 6) of this invention, and FIG. 34 is a base plan view of the semiconductor device. Embodiment 6 is a stand-off construction as in the case of Embodiment 5. In this embodiment, the substrate region surface requiring stand-off in the substrate 20 is made thinner by half-etching. In this construction also, during mounting as in the case of Embodiment 5, if a foreign body comes to be facing the half-etched partition parts 4, the foreign body does not easily interfere.

Embodiment 7

Figure 35:
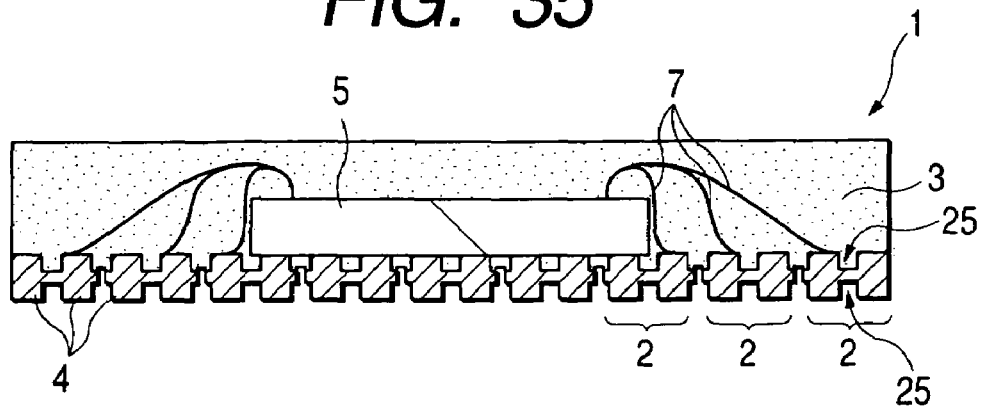
FIG. 35 is a cross-sectional view of a non-leaded semiconductor device manufactured by a semiconductor device manufacturing method according to another embodiment (Embodiment 7) of this invention.
Figure 36:
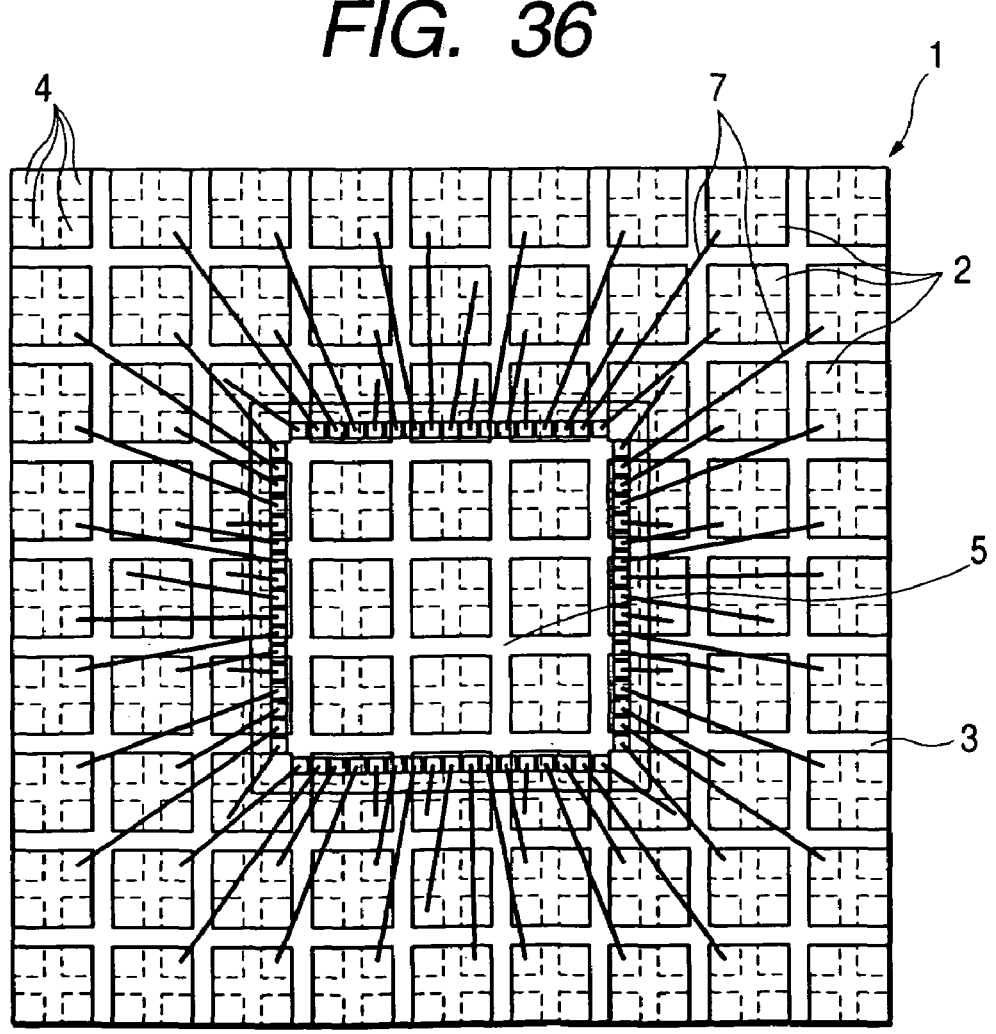
FIG. 36 is a perspective view showing the planar arrangement of the semiconductor device of Embodiment 7.
Figure 37:
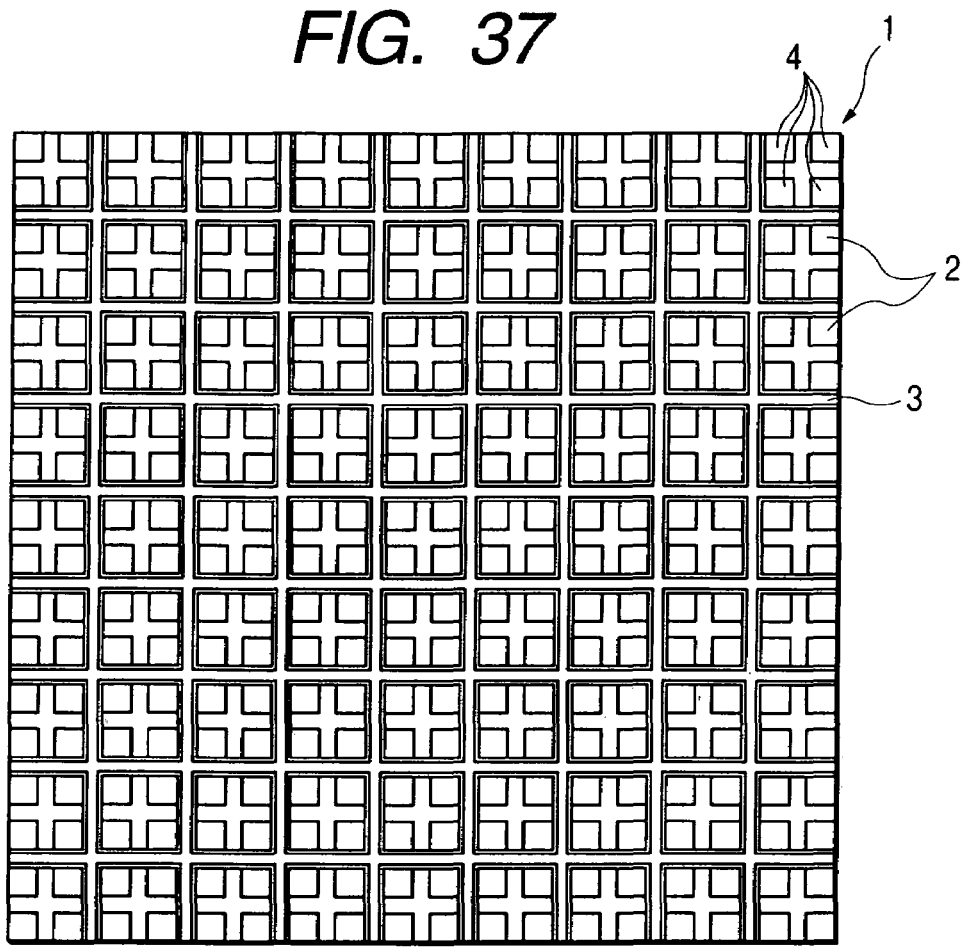
FIG. 37 is a base plan view of the semiconductor device of Embodiment 7.
Figure 38:
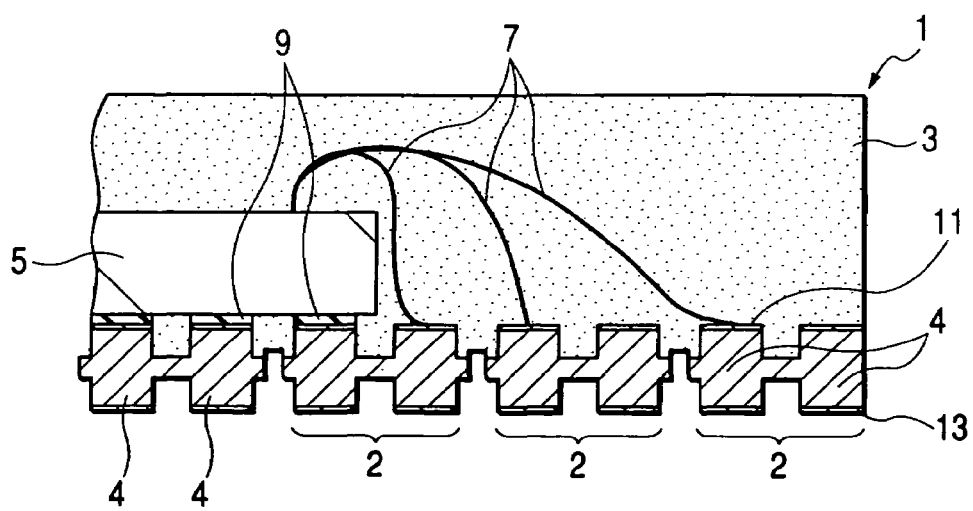
FIG. 38 is an enlarged cross-sectional view of part of the semiconductor device of Embodiment 7.

FIG. 35 to FIG. 38 are diagrams relating to a method of manufacturing a non-leaded semiconductor device according to another embodiment (Embodiment 7) of this invention. FIG. 35 is a cross-sectional view of the manufactured non-leaded semiconductor device, FIG. 36 is a perspective view showing the planar arrangement of the semiconductor device, FIG. 37 is a base plan view of the semiconductor device, and FIG. 38 is an enlarged cross-sectional view of part of the semiconductor device.

In the method of manufacturing the semiconductor device according to Embodiment 7, the external electrode terminals 2 are formed by removing the bases of the grooves 25 at intervals of several grooves apart. In this example, the groove bases of the grooves 25 one groove apart are removed. This technique has the advantage that the size and pitch of the external electrode terminals 2 can be freely selected.

Embodiment 8

Figure 39:
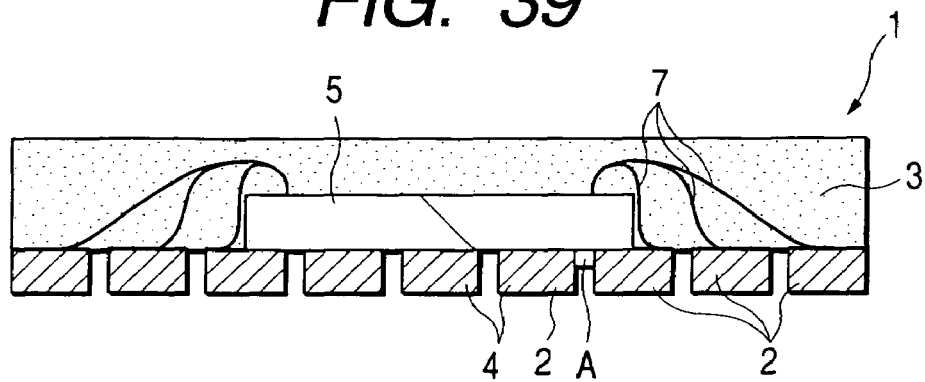
FIG. 39 is a cross-sectional view of a non-leaded semiconductor device manufactured by a semiconductor device manufacturing method according to another embodiment (Embodiment 8) of this invention.
Figure 40:
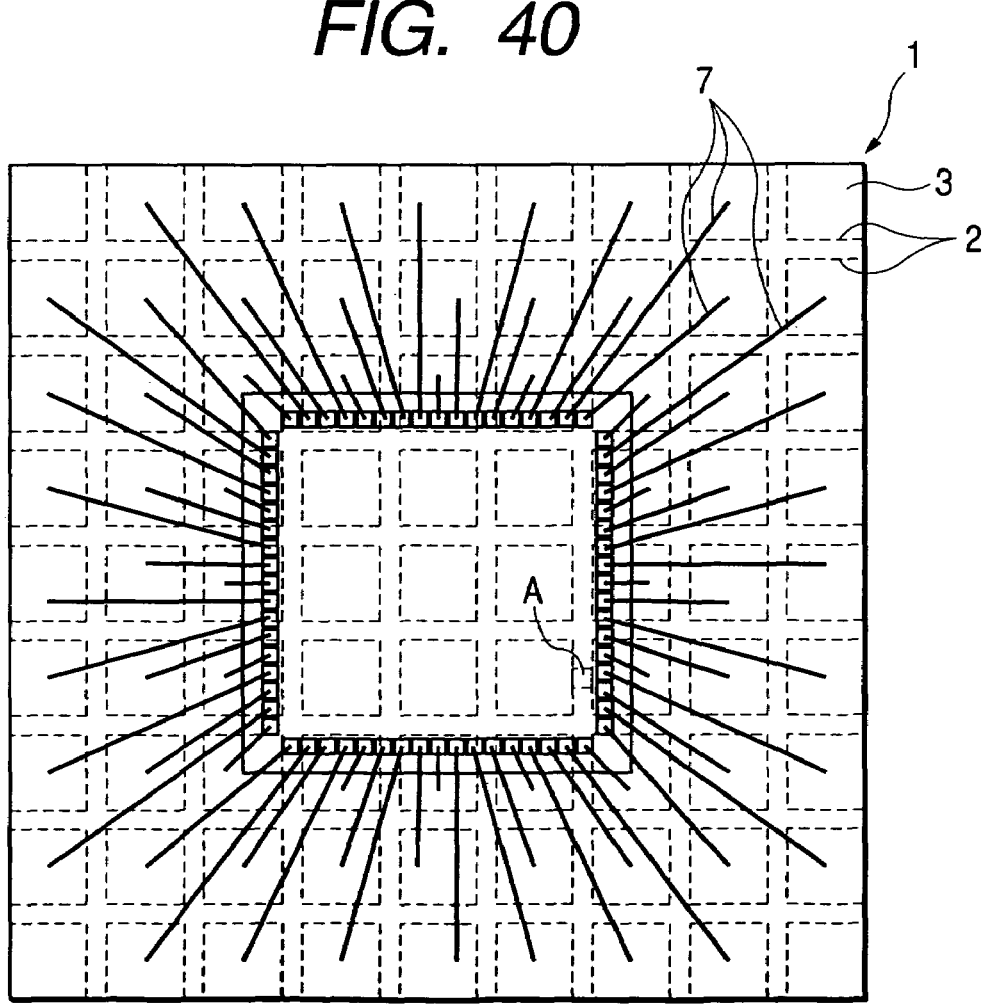
FIG. 40 is a perspective view showing the planar arrangement of the semiconductor device of Embodiment 8.
Figure 41:
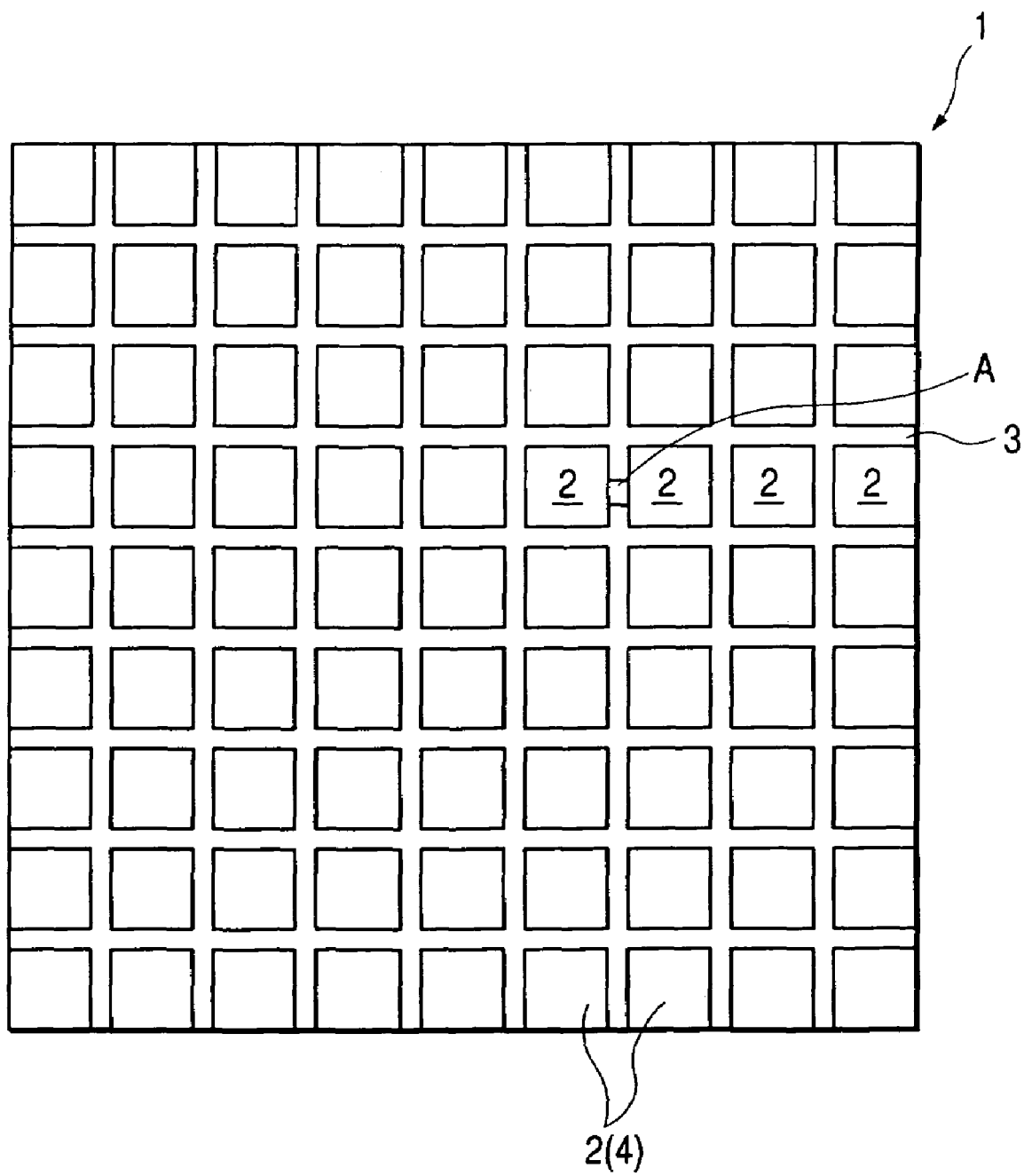
FIG. 41 is a base plan view of the semiconductor device of Embodiment 8.

FIG. 39 to FIG. 41 are diagrams relating to a method of manufacturing a non-leaded semiconductor device according to another embodiment (Embodiment 8) of this invention. FIG. 39 is a cross-sectional view of the manufactured non-leaded semiconductor device, FIG. 40 is a perspective view showing the planar arrangement of the semiconductor device, and FIG. 41 is a base plan view of the semiconductor device.

Embodiment 8 is an example wherein three rows of the partition parts 4 adjacent each other including the outermost row along the sides of the semiconductor device 1 are used as the external electrode terminals 2, and the fourth row of predetermined partition parts 4 from the outside to inside are used as the external electrode terminals 2. Specifically, as shown here, a part A electrically connects the third row of predetermined partition parts 4 and fourth row of predetermined partition parts 4. This may for example be manufactured by a construction wherein the part A adjoins parts of adjacent partition parts 4 without etching. In the figure, one of the partition parts 4 underneath the semiconductor element 5 is electrically connected to one of the partition parts 4 outside the semiconductor element 5, but the partition parts 4 underneath the semiconductor element 5 may be further electrically connected, or other partition parts 4 outside the semiconductor element 5 may also be electrically connected to the partition parts 4 underneath the semiconductor element 5.

According to Embodiment 8, the partition part 4 directly underneath the semiconductor element 5 may also be used as one of the external electrode terminals 2. As a result, the degree of freedom of interconnection layout design on the interconnection board for mounting is increased.

Embodiment 9

Figure 42:
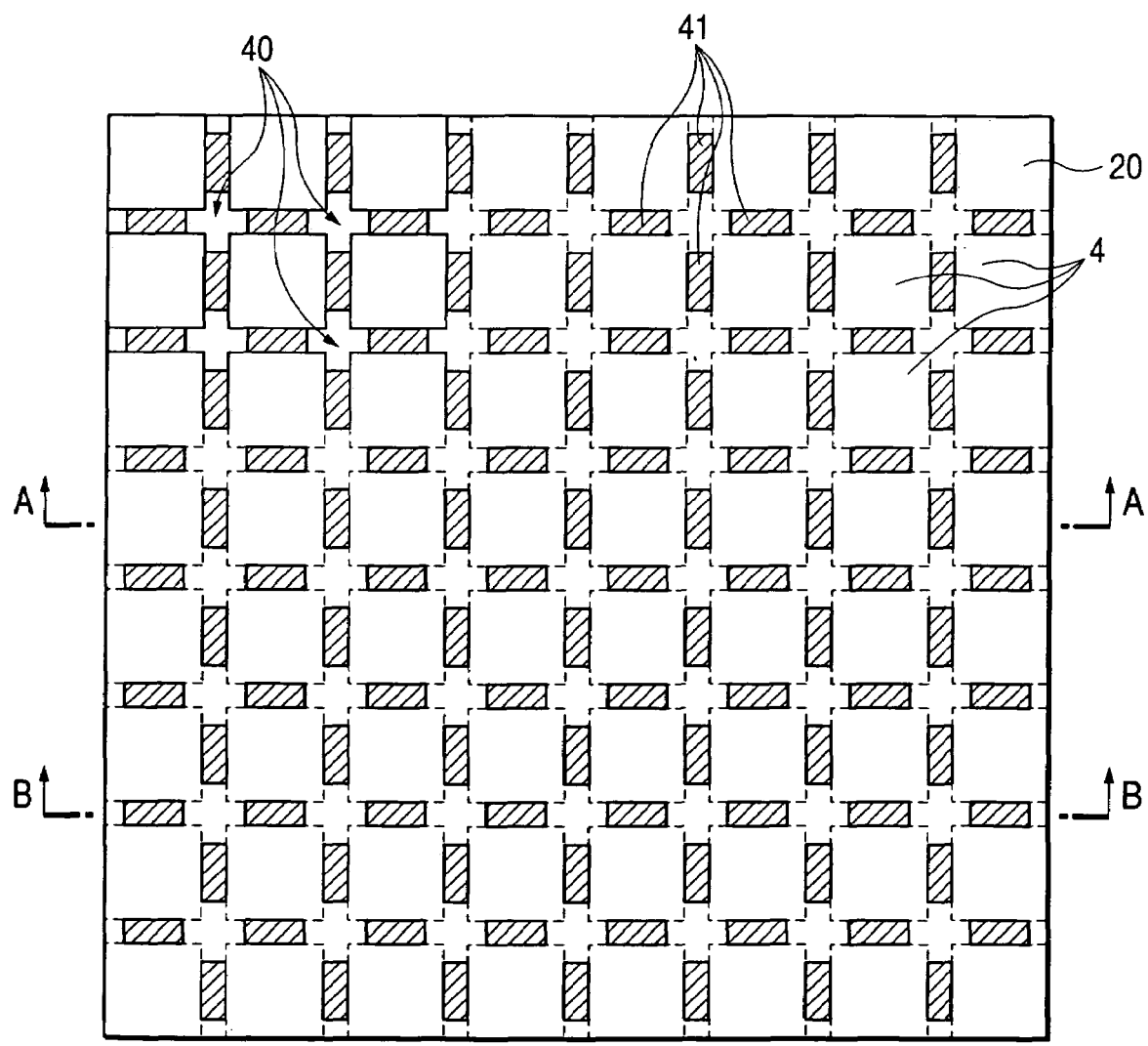
FIG. 42 is a schematic plan view of the substrate used in the method of manufacturing a semiconductor device according to another embodiment (Embodiment 9) of this invention.
Figure 43:
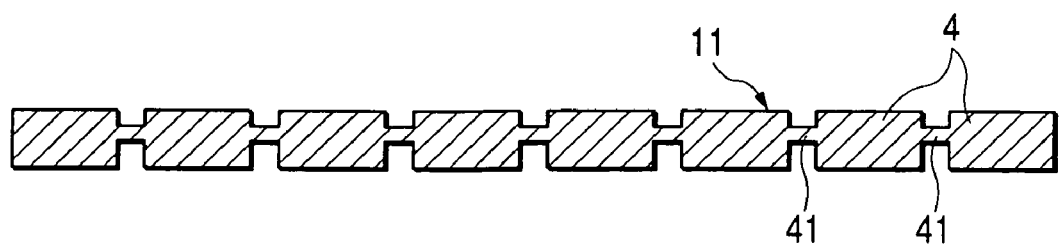
FIG. 43 is a cross-sectional view along a line A-A in FIG. 42.
Figure 44:
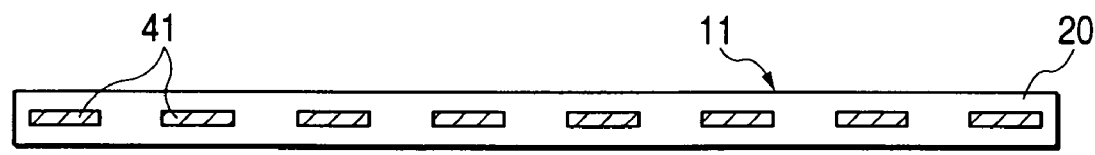
FIG. 44 is a cross-sectional view along a line B-B in FIG. 42.

FIG. 42 to FIG. 44 are diagrams relating to a method of manufacturing a non-leaded semiconductor device according to another embodiment (Embodiment 9) of this invention. FIG. 42 is a schematic cross-sectional view of the substrate used in the method of manufacturing the semiconductor device, FIG. 43 is a cross-sectional view along a line A-A in FIG. 42, and FIG. 44 is a cross-sectional view along a line B-B in FIG. 42.

In Embodiment 9, through holes 40 are provided at substrate points where the grooves 25 intersect transversely and longitudinally. By providing the through holes 40 at the substrate points where the grooves 25 intersect, dicing parts are less, the cutting time can be shortened, and the time required to form the partition parts (external electrode terminals) can also be shortened. Further, manufacturing burrs in the intersection parts cut by the dicing blade occur even less frequently.

In FIG. 43 and FIG. 44, connecting parts 41 which join adjacent partition parts 4 are also shown by shading. In FIG. 42, the connecting parts 41 are shaded.

Embodiment 10

Figure 45:
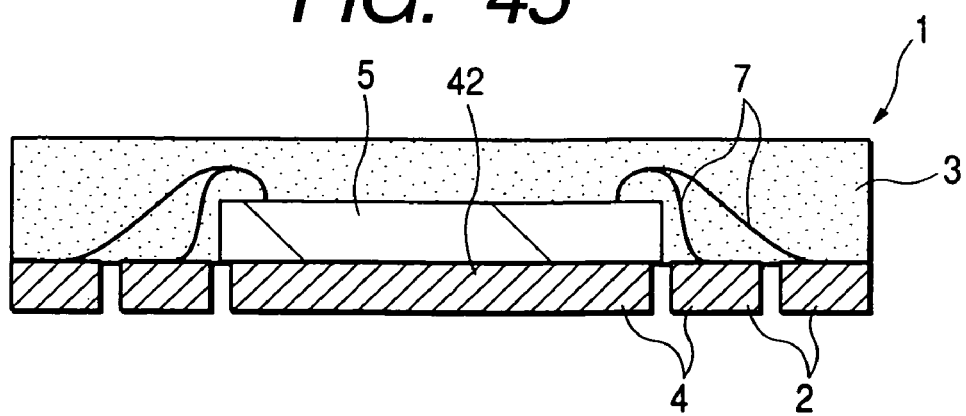
FIG. 45 is a cross-sectional view of a non-leaded semiconductor device manufactured by a semiconductor device manufacturing method according to another embodiment (Embodiment 10) of this invention.
Figure 46:
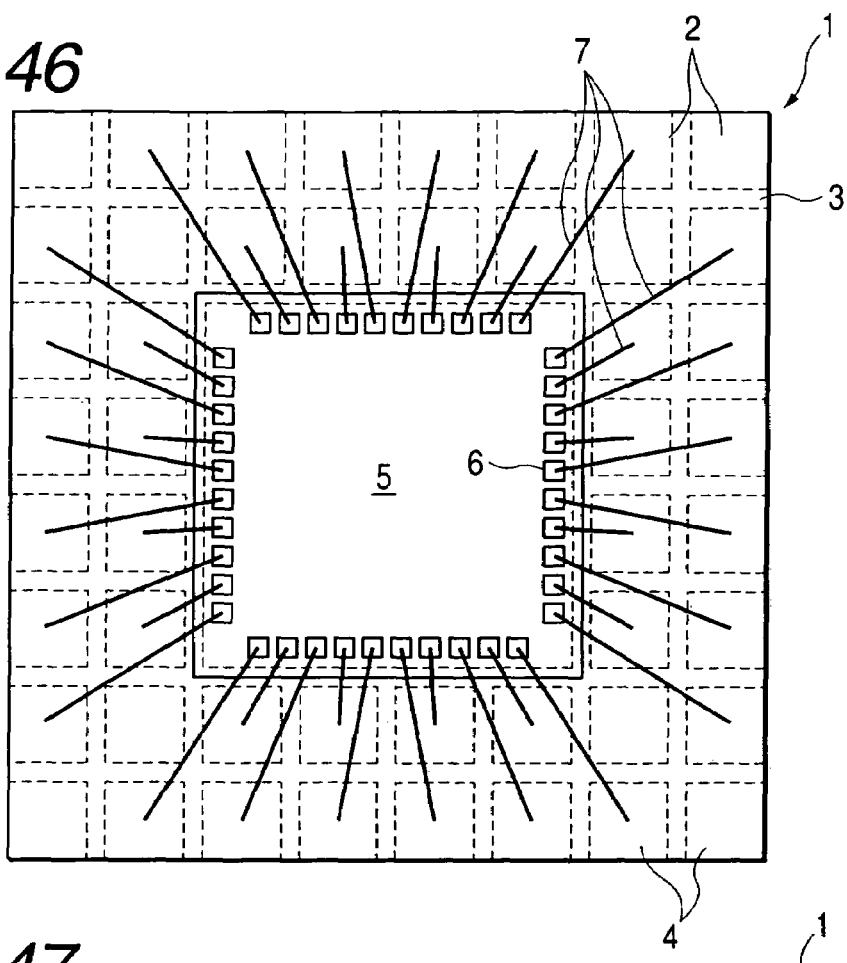
FIG. 46 is a perspective view showing the planar arrangement of the semiconductor device of Embodiment 10.
Figure 47:
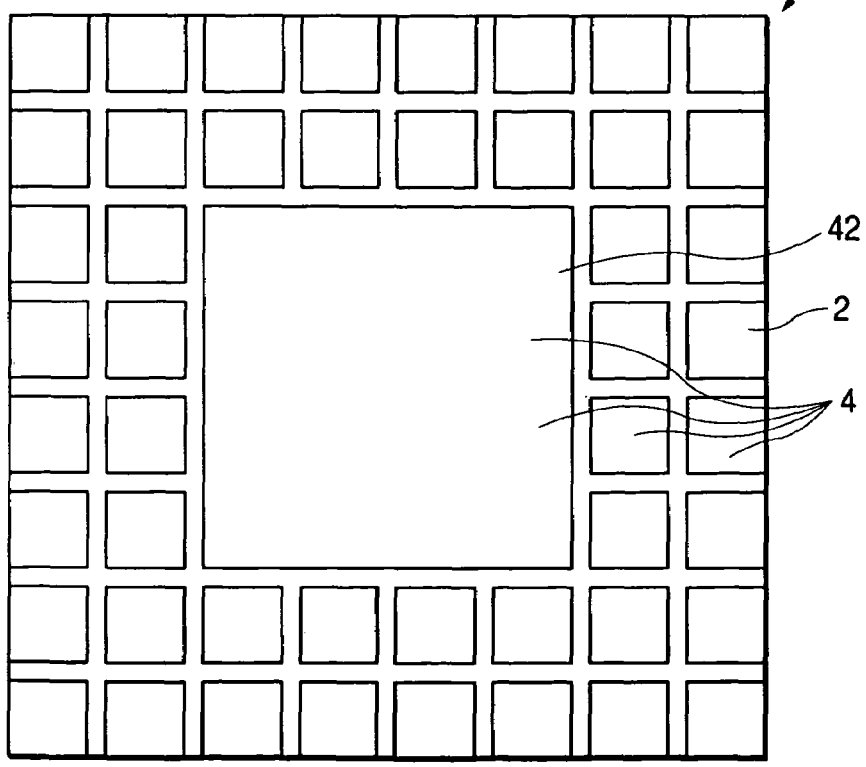
FIG. 47 is a base plan view of the semiconductor device of Embodiment 10.

FIG. 45 to FIG. 48 are diagrams relating to a method of manufacturing a non-leaded semiconductor device according to another embodiment (Embodiment 10) of this invention. FIG. 45 is a cross-sectional view of the manufactured non-leaded semiconductor device, FIG. 46 is a perspective view showing the planar arrangement of the semiconductor device, FIG. 47 is a base plan view of the semiconductor device, and FIG. 48 is a cross-sectional view of some of the steps in the method of manufacturing the semiconductor device.

In Embodiment 10, the partition parts 4 to which the semiconductor element 5 are fixed are integrated to form a chip fixing partition part 42 of a size such that the semiconductor element 5 can easily be fixed to it. This improves the mechanical strength of the part supporting the semiconductor element 5, and improves heat dissipation properties by effectively transmitting the heat produced by the semiconductor element 5.

This example can be manufactured by, for example, using the substrate 20 in Embodiment 4, forming a structure (chip fixing partition part 42) wherein parts of adjacent partition parts 4 are joined without etching between the parts it is desired to connect even after dicing the partition parts 4.

Figure 48A:
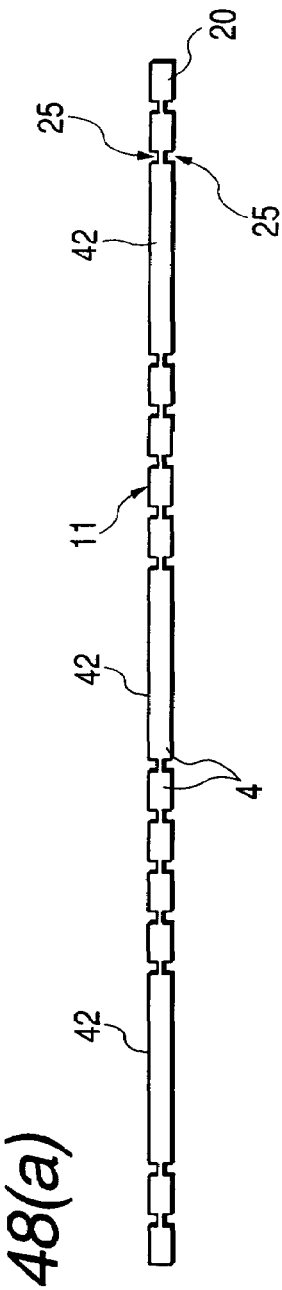
FIGS. 48A to 48C are cross-sectional views of some of the steps in the method of manufacturing the semiconductor device according to Embodiment 10.
Figure 48B:
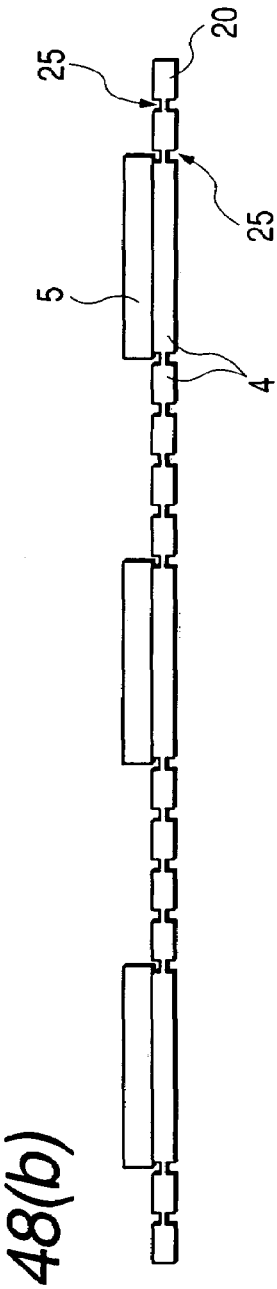
Figure 48C:
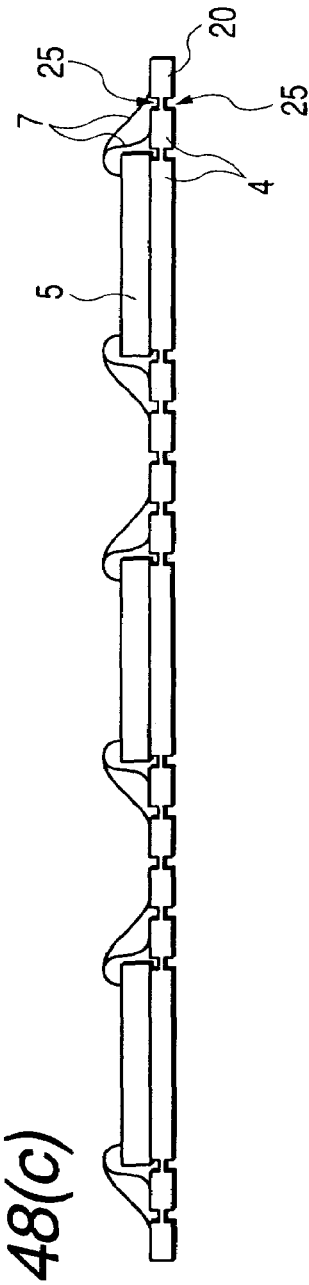

FIGS. 48A to 48C are cross-sectional views of some of the steps in the method of manufacturing the semiconductor device according to Embodiment 10. As shown in FIGS. 48A to 48C, only provision of the substrate 20 (FIG. 48A), fixing of the semiconductor element (FIG. 48B) and wire bonding (FIG. 48C) are shown. As shown in FIG. 48A, a structure (chip fixing partition part 42) is formed wherein parts of adjacent partition parts 4 are joined without etching between the parts it is desired to connect even after dicing the partition parts 4.

Embodiment 11

Figure 49:
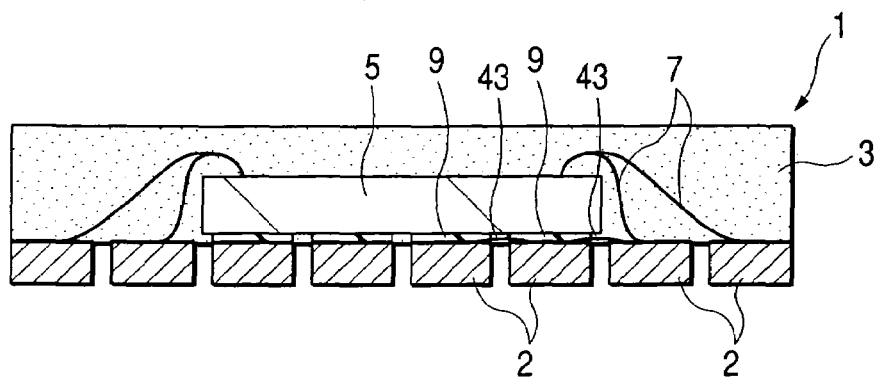
FIG. 49 is a cross-sectional view of a non-leaded semiconductor device manufactured by a semiconductor device manufacturing method according to another embodiment (Embodiment 11) of this invention.
Figure 50:
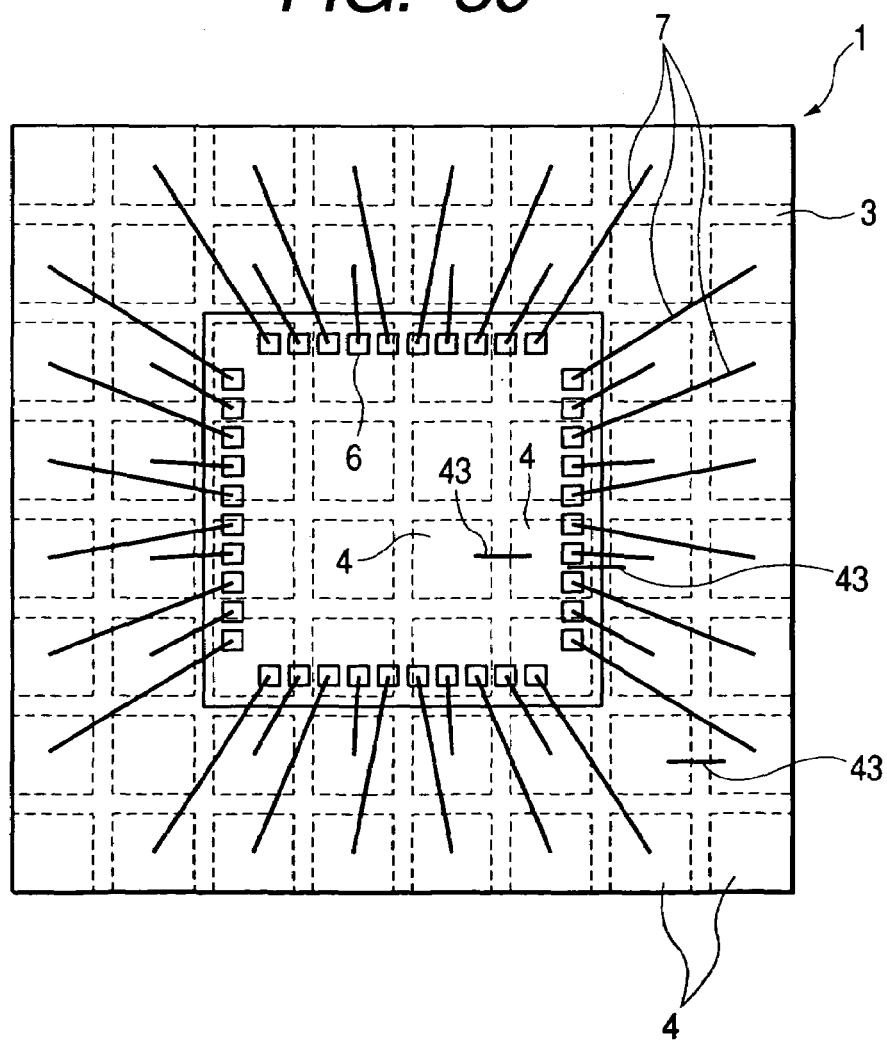
FIG. 50 is a perspective view showing the planar arrangement of the semiconductor device of Embodiment 11.

FIG. 49 to FIG. 51 are diagrams relating to a method of manufacturing a non-leaded semiconductor device according to another embodiment (Embodiment 11) of this invention. FIG. 49 is a cross-sectional view of the manufactured non-leaded semiconductor device, FIG. 50 is a perspective view showing the planar arrangement of the semiconductor device, and FIG. 51 is a cross-sectional view of some of the steps in the method of manufacturing the semiconductor device.

Embodiment 11 is a technical concept identical to that of Embodiment 8 wherein the partition parts 4 directly underneath the semiconductor element 5 are also used as the external electrode terminals 2. As shown in FIGS. 51A to 51D, only provision of the substrate (FIG. 51A), wire bonding which electrically connects the partition parts 4 (FIG. 51B), fixing of the semiconductor element (FIG. 51C) and wire bonding (FIG. 51D) are shown.

In Embodiment 11, as shown in FIG. 51A, after providing the substrate 20 which has the grooves 25 on both surfaces, on the surface (principal surface) of the substrate 20 to which the semiconductor elements 5 are fixed, as shown in FIG. 51B, regions which function as the external electrode terminals 2 separate from the regions where the semiconductor elements 5 are fixed, are electrically connected by conductive wires 43 to predetermined partition parts 4 to which the semiconductor elements 5 are fixed.

Next, the semiconductor elements 5 are fixed to the substrate 20 by insulating adhesive 9 enclosing part of the wires 43 (FIG. 49). In this state, the wires 43 are not visible, and are therefore shown in FIG. 49 and FIG. 50. In Embodiment 11, as shown in FIG. 50, the partition parts 4 separate from the semiconductor element 5 are electrically connected by the wires 43, so that they may be used as the external electrode terminals 2.

Next, as shown in FIG. 51D, wire bonding is performed, and the semiconductor device 1 shown in FIG. 49 and FIG. 50 is manufactured by performing the sequence of steps as in Embodiment 4.

In Embodiment 11 also, the external electrode terminals 2 may be formed underneath the semiconductor elements 5 as in Embodiment 8. As result, the degree of freedom of design of the interconnection pattern of the mounting substrate is increased.

Embodiment 12

Figure 52:
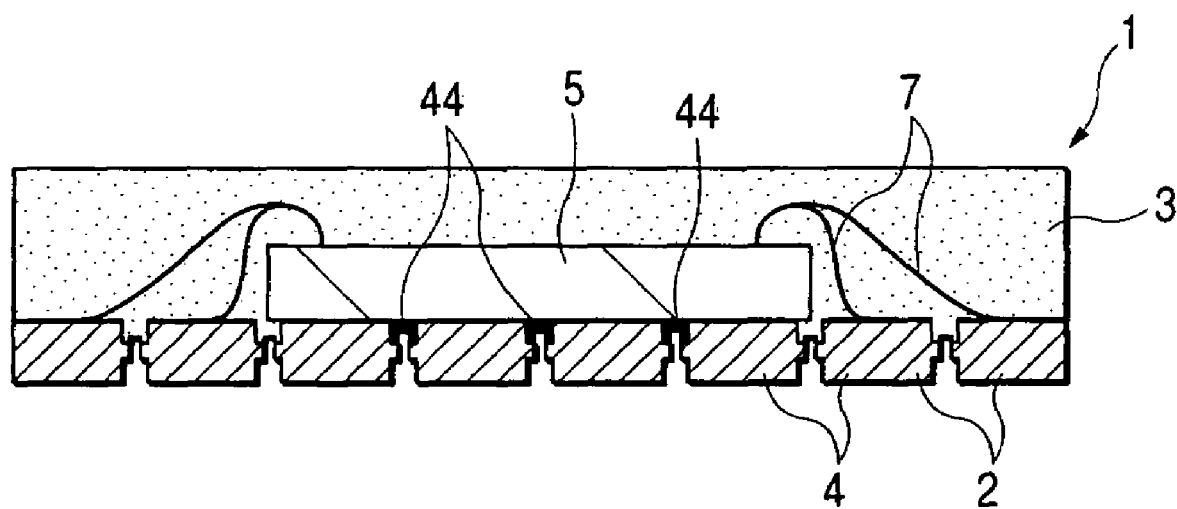
FIG. 52 is a cross-sectional view of a non-leaded semiconductor device manufactured by a semiconductor device manufacturing method according to another embodiment (Embodiment 12) of this invention.

FIG. 52 is a cross-sectional view of a non-leaded semiconductor device manufactured by a method according to another embodiment (Embodiment 12) of this invention, and FIGS. 53A to 53C is a cross-sectional view of some of the steps showing the method of manufacturing the semiconductor device. In FIGS. 53A to 53C, only provision of the substrate (FIG. 53A), fixing of the semiconductor elements (FIG. 53B) and wire bonding (FIG. 53C) are shown.

In Embodiment 12, as shown in FIG. 53A, in the substrate 20 which has the grooves 25 provided on both surfaces, the grooves 25 in the regions where the semiconductor elements 5 are fixed, are filled with a filling material 44 prior to fixing the semiconductor elements, as shown in FIG. 53B, the semiconductor elements 5 are fixed to predetermined positions, and as shown in FIG. 53C, the electrodes of the semiconductor elements 5 are connected to the partition parts 4 by the conductive wires 7. Subsequently, the steps in the manufacturing method of Embodiment 11 are followed in sequence to manufacture the semiconductor device 1 shown in FIG. 52.

According to Embodiment 12, by filling the groove parts 25 in the regions where the semiconductor elements 5 are fixed with the filling material 44, the rear surfaces of the semiconductor elements 5 are definitely obstructed even when the external electrode terminals 2 (partition parts 4) are formed by dicing, etc., so seepage of water through the grooves 25 is prevented, and the reliability of the semiconductor device is increased. It may be noted that the filling material 44 and adhesive 9 may be used in conjunction to fill the grooves 25 in these regions.

Embodiment 13

Figure 54:
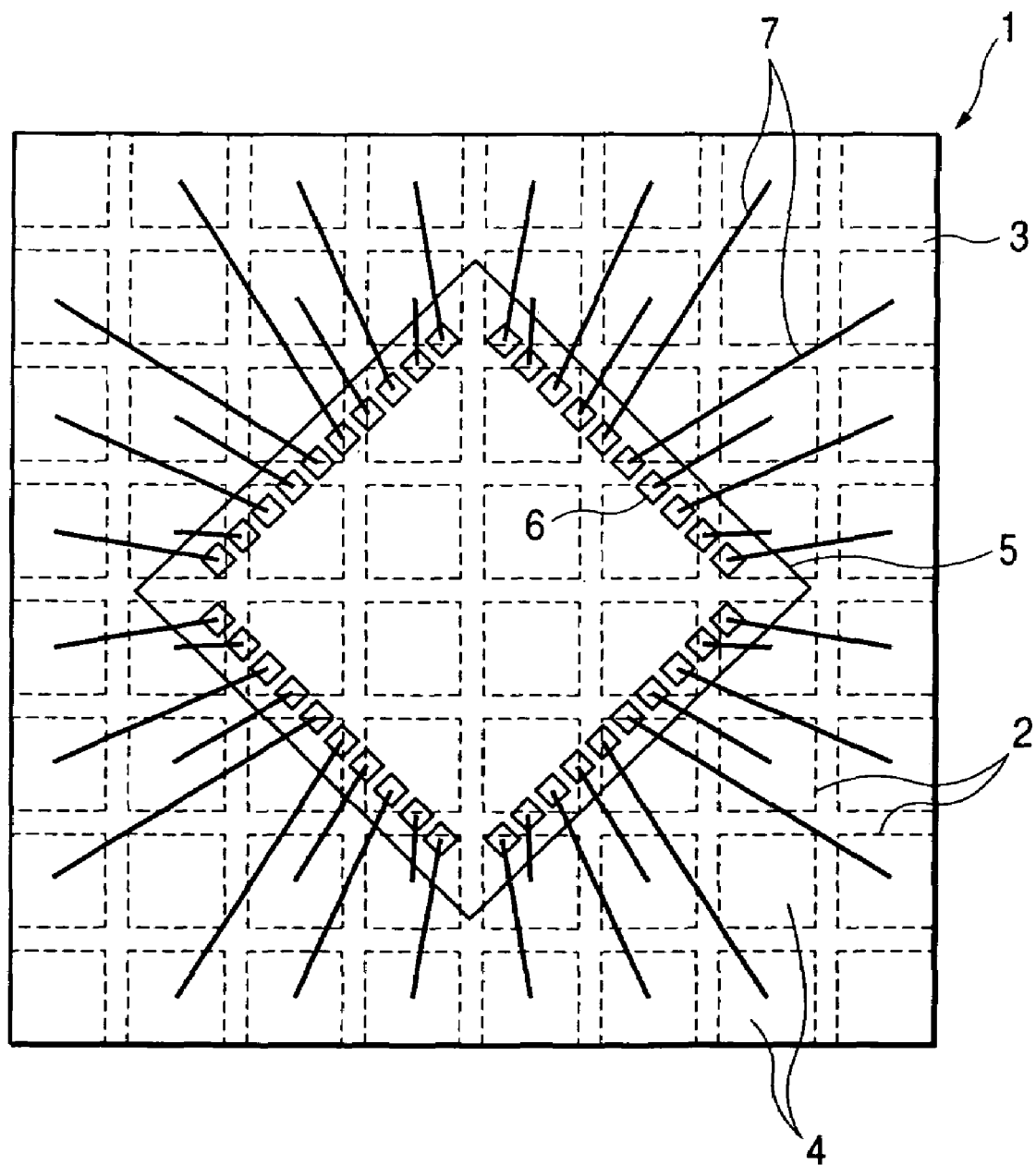
FIG. 54 is a perspective view showing the planar arrangement of the non-leaded semiconductor device manufactured by the semiconductor device manufacturing method according to another embodiment (Embodiment 13) of this invention.

FIG. 54 is a perspective view showing a planar arrangement of a non-leaded semiconductor device manufactured by a method according to another embodiment (Embodiment 13) of this invention.

In Embodiment 13, the semiconductor device 1 is manufactured by fixing the semiconductor element to the substrate 20 so that the sides of the semiconductor element intersect in the grooves 25 which are provided transversely and longitudinally perpendicular to each other. By so doing, more of the partition parts 4 which can be used as the external electrode terminals 2 are obtained.

Embodiment 14

FIG. 55 is a cross-sectional view of steps illustrating the method of manufacturing the semiconductor device according to another embodiment (Embodiment 14) of this invention. Embodiment 14 is an example wherein the resin layer 3a is formed by a method other than transfer molding, such as for example a dispenser.

Figure 55A:
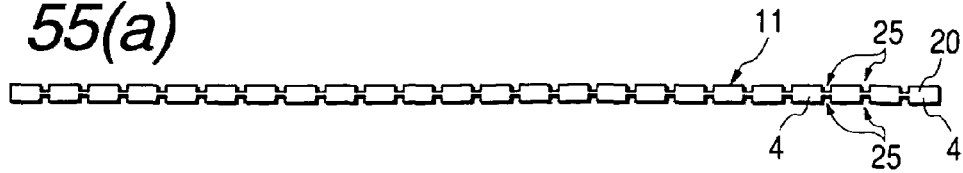
FIGS. 55A to 55G are cross-sectional views of the steps in a semiconductor device manufacturing method according to another embodiment (Embodiment 14) of this invention.
Figure 55B:
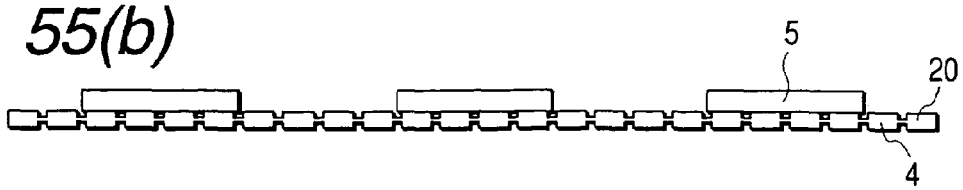

There is no particular limitation on the substrate 20, but an example will be described where the semiconductor device is manufactured using the substrate 20 having the grooves 25 on both surfaces. As shown in FIG. 55A, the substrate 20 having the grooves 25 facing each other in corresponding positions in a checkered pattern on both surfaces is first provided, and the semiconductor elements 5 are then fixed to one surface of the substrate 20 as in Embodiment 4 (FIG. 55B).

Figure 55C:
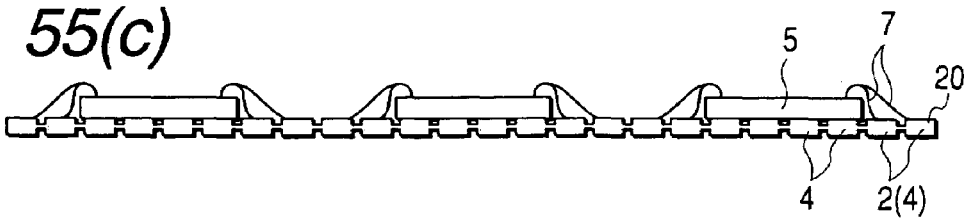

Next, as shown in FIG. 55C, the electrodes of the semiconductor elements 5 are connected to predetermined partition parts 4 separate from the semiconductor elements 5 by the conductive wires A Manufacturing Method of a Semiconductor Device 7.

Figure 55D:
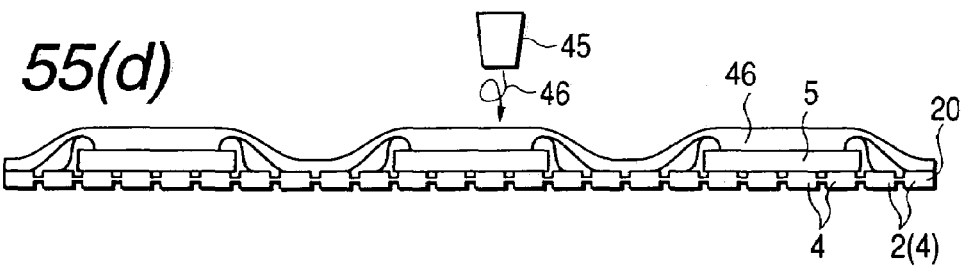

Next, as shown in FIG. 55D, a predetermined amount of an insulating resin liquid 46 such as an epoxy resin is allowed to flow onto the upper surface of the substrate 20 from a dispenser nozzle 45, so as to cover the semiconductor elements 5 and wires 7. It is necessary to employ a means whereby the semiconductor elements 5 and wires 7 are completely covered by the resin, and the resin does not flow out from the edges of the substrate 20. In other words, the viscosity of the resin is suitably selected, and although not shown in the diagram, a stopper of predetermined height may for example be placed to form a dam on the peripheral surface of the substrate 20 so that the resin does not flow from the substrate 20 to the outside. In the figure, only one of the nozzles 45 is shown, but in practice, the resin may be supplied from a dispenser having plural nozzles.

Figure 55E:
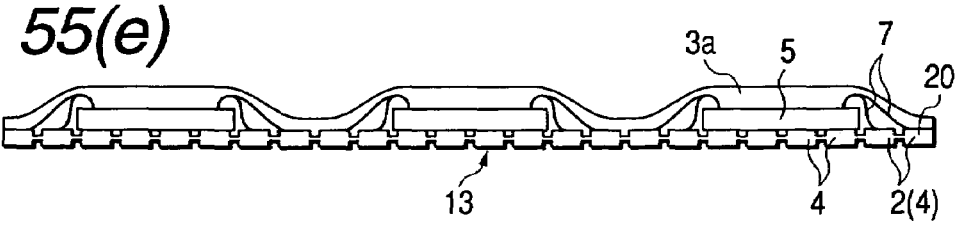

Next, as shown in FIG. 55E, the insulating resin liquid 46 is baked under predetermined conditions so as to form the resin layer 3a covering the semiconductor elements 5 and wires 7. In the resin layer 3a, the semiconductor elements 5 and wires 7 are present so the surface is undulating, but the semiconductor elements 5 and wires 7 are covered by the resin without leaving any gaps. To avoid undulations on the surface, after supplying the insulating resin liquid 46 from the dispenser, it may be flattened by using a tool such as a squeezer or the like. Also, the insulating resin liquid 46 may be a UV curing resin.

Next, as shown in FIG. 55E, the external mounting plating film 13, not shown (in the figure, only the symbol is shown) is formed on the rear surface of the substrate 20.

Figure 55F:
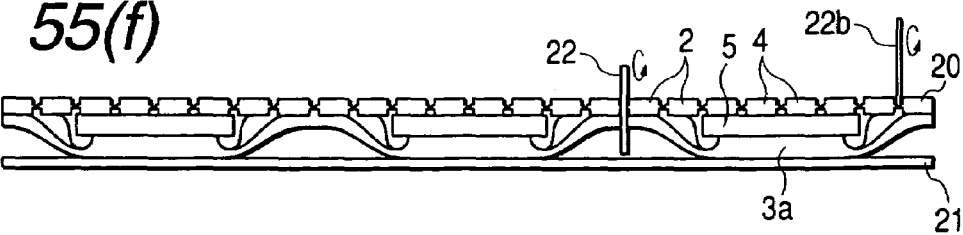

Next, as shown in FIG. 55F, the tape 21 is affixed as a supporting member to the resin layer 3a, and the substrate 20 is cut transversely and longitudinally by two dicing blades with the substrate 20 facing upwards. Specifically, the independent partition parts 4 are formed by cutting the groove bases of the grooves 25 by the dicing blade 22b which is narrower (thinner) than the grooves 25, and the areas between unit substrate regions are cut by the dicing blade 22 which has approximately the same thickness as the groove width of the grooves 25 (fragmentation). The cutting between these unit substrate regions is also in part of the grooves 25. Due to the cutting of the resin layer 3a, the resin sealing package 3 is formed.

Figure 55G:
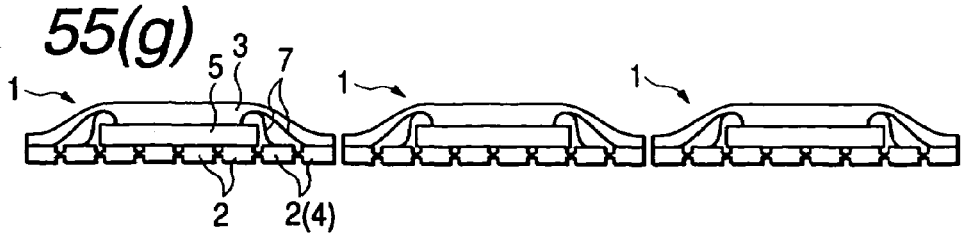

Next, as shown in FIG. 55G, plural non-leaded semiconductor devices 1 are formed by peeling the tape off the resin sealing body 3.

Embodiment 14 has some of the advantages of Embodiment 3. The resin may be supplied from a device other than the dispenser.

Embodiment 15

FIG. 56 to FIG. 63 are diagrams relating to the method of manufacturing the semiconductor device according to another embodiment (Embodiment 15) of this invention. In Embodiment 15, the fixing of the semiconductor element to one surface of the substrate, the connection of the electrodes of the semiconductor device to predetermined positions on the substrate by conductive wires, one-side molding to cover the semiconductor elements, the cutting of the substrate to form the semiconductor device and the removal of unnecessary substrate are identical to the aforesaid embodiments.

However, in Embodiment 15, there are differences in that when the semiconductor device is manufactured, unit substrate parts are formed by rectangular tabs fixed to the semiconductor element, and leads extending parallel from predetermined sides of the tabs and extending from adjacent tabs, or plural leads connected to the substrate frame. The leads have wire connection regions in two or more positions along their length.

Figure 60A:
FIGS. 60A to 60G are cross-sectional views of the steps in the semiconductor device manufacturing method according to Embodiment 15.

Next, the method of manufacturing the semiconductor device will be described referring to FIG. 60. First, as shown in FIG. 60(a), the substrate 20 is provided. The substrate 20 has the pattern shown in FIG. 61. The materials and thickness of this substrate 20 are effectively identical to those of the aforesaid embodiments. Also, the pattern may be manufactured by selectively etching or stamping the substrate 20.

The substrate 20 comprises a rectangular (lengthwise) substrate frame 50, and unit substrate parts arranged transversely and longitudinally inside this substrate frame 50. The rectangular regions including the unit substrate parts are referred to as unit substrate regions. The unit substrate regions comprise a rectangular tab 51 which fixes the semiconductor element 5, and leads 52 extending parallel from predetermined sides of this tab 51 and extending from adjacent tabs 51, or plural leads connected to the substrate frame 50. Therefore, all of the leads 52 are parallel to the substrate frame 50. A plating film 11 is formed in at least a part of the principal surface of the substrate 20 to which semiconductor elements and wires are connected (FIG. 59).

Figure 61:
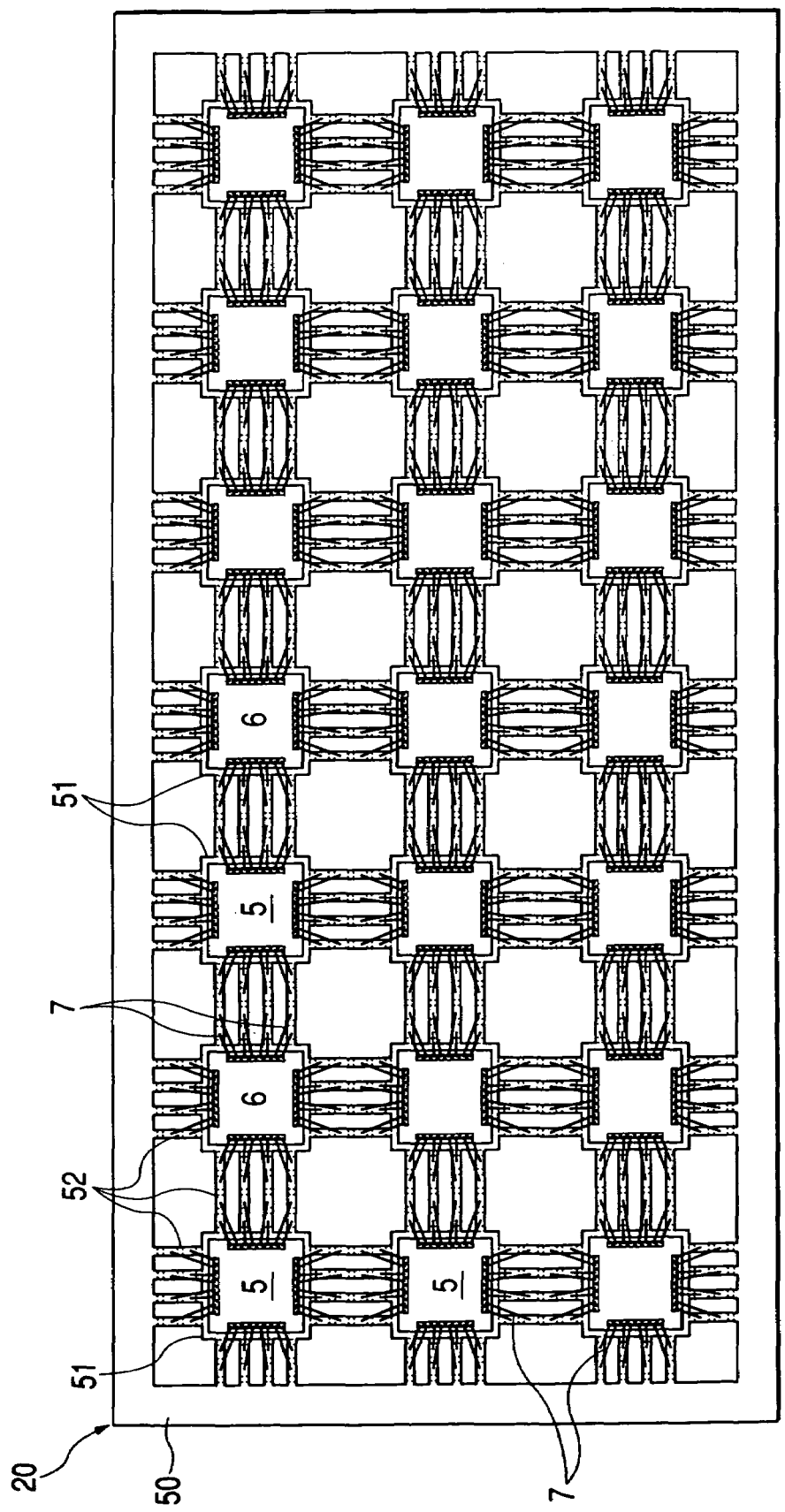
FIG. 61 is a schematic plan view showing a lead frame used in the semiconductor device manufacturing method according to Embodiment 15, and a fixed semiconductor chip.
Figure 62:
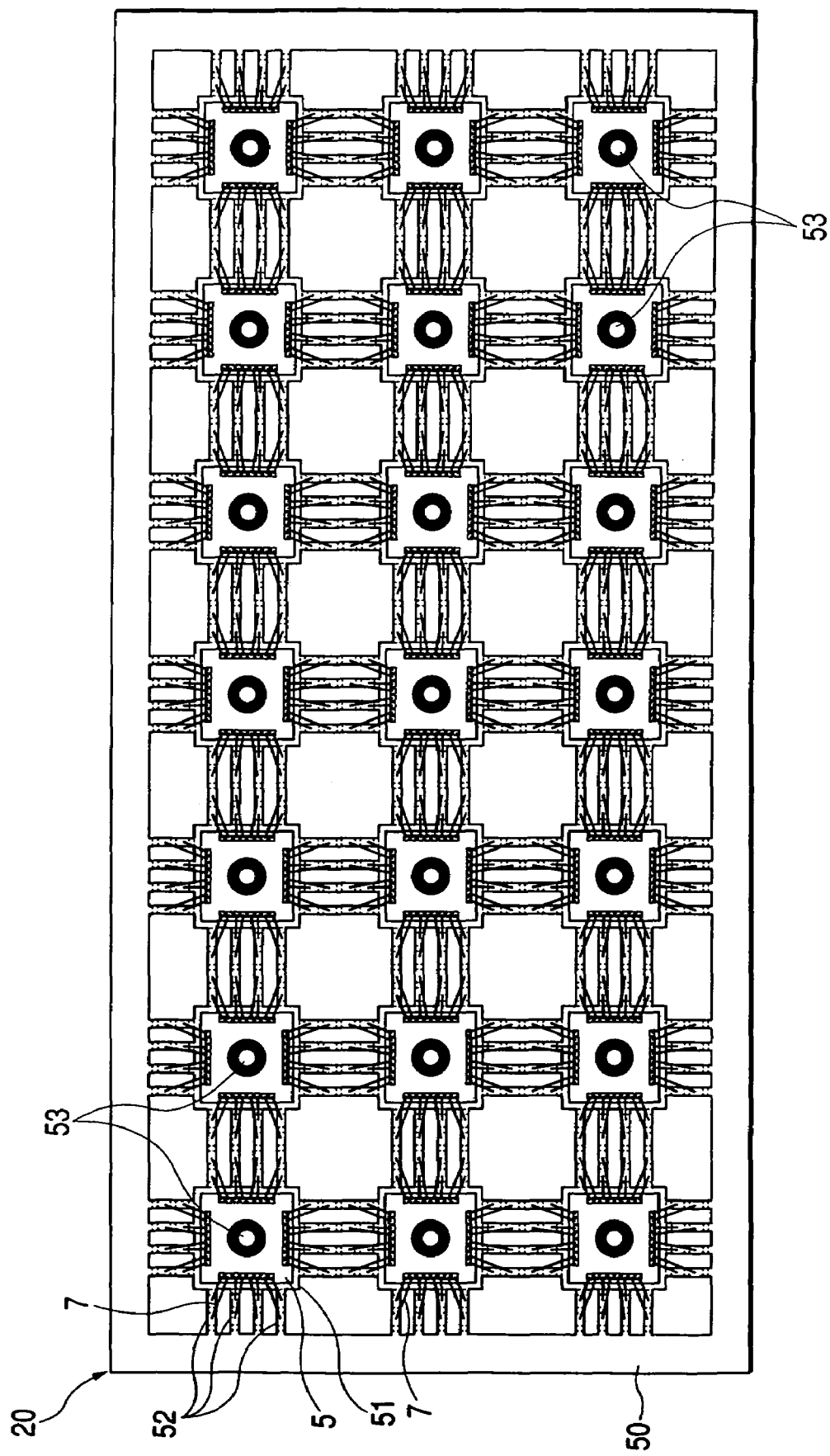
FIG. 62 is a schematic view showing the arrangement of vacuum pads which apply vacuum suction to the lead frame during transfer molding in the semiconductor device manufacturing method according to Embodiment 15.

There is no particular limitation on the substrate 20 shown in FIG. 61, but a total of 21 unit substrate parts may be aligned in 3 columns and 7 rows so that 21 semiconductor devices can be manufactured from one of the substrates 20. In FIG. 61, the semiconductor element 5 is already fixed, and the electrodes 6 of the semiconductor element 5 are connected to predetermined positions (wire bonding positions) of the leads 52 by the wires 7.

Figure 59:
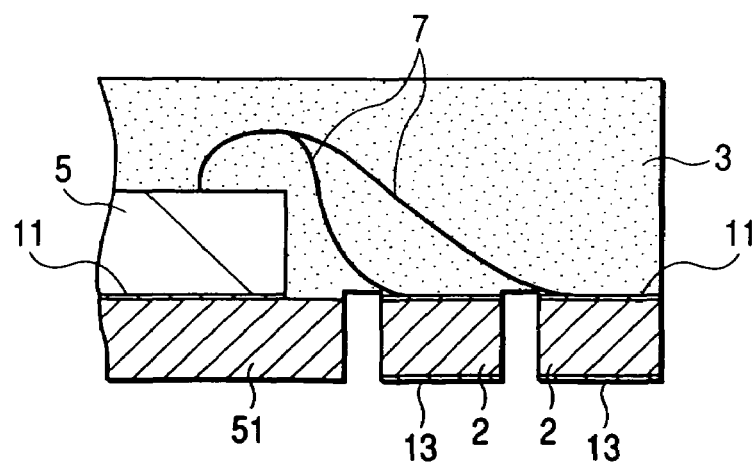
FIG. 59 is an enlarged cross-sectional view of part of the semiconductor device of Embodiment 15.
Figure 60B:
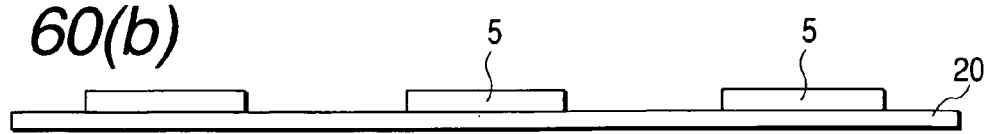

Next, as shown in FIG. 60B and FIG. 61, the semiconductor element 5 is fixed to the tabs on one surface (the principal surface) of the substrate 20 via the adhesive 9 (FIG. 59). The adhesive 9 may be an insulating adhesive or a conductive adhesive. In Embodiment 1, an example is described where the tabs 51 are larger than the semiconductor element 5.

Figure 56:
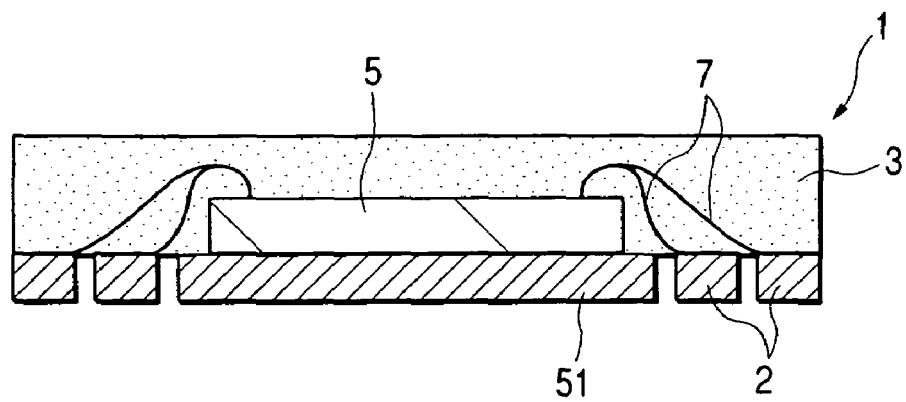
FIG. 56 is a cross-sectional view of a non-leaded semiconductor device manufactured by a semiconductor device manufacturing method according to another embodiment (Embodiment 15) of this invention.
Figure 57:
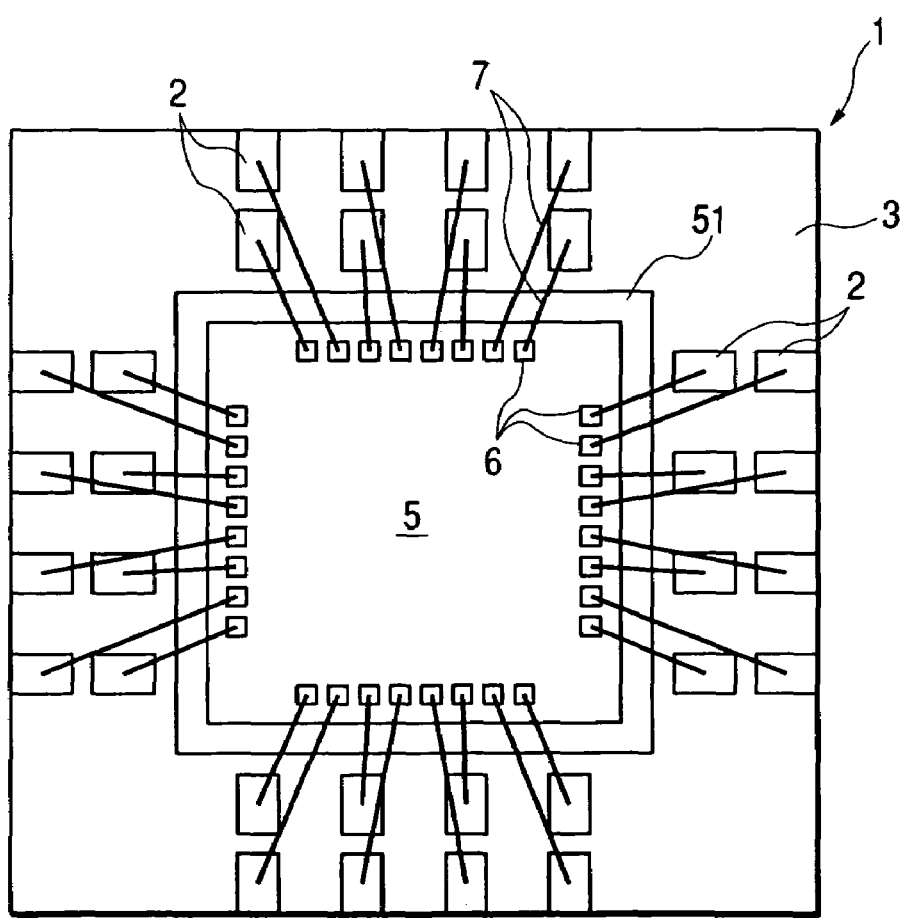
FIG. 57 is a plan view showing an external outline of the resin sealing package without the resin sealing package of the semiconductor device of Embodiment 15.
Figure 60C:
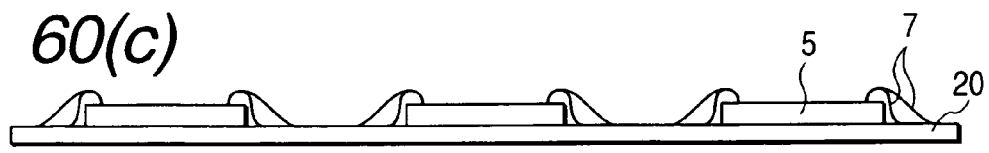

Next, as shown in FIG. 60C and FIG. 61, the electrodes of the semiconductor element 5 are connected to predetermined wire bonding positions on the leads 52 by the conductive wires 7 (FIG. 56 and FIG. 57). In Embodiment 1, two regions for fixing the wires are provided in the length direction of the leads 52. These two positions are marked by dotted lines in FIG. 61 for clarity.

Figure 60D:
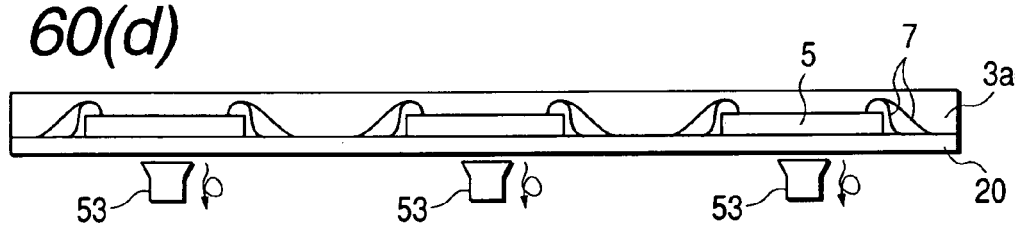
Figure 63:
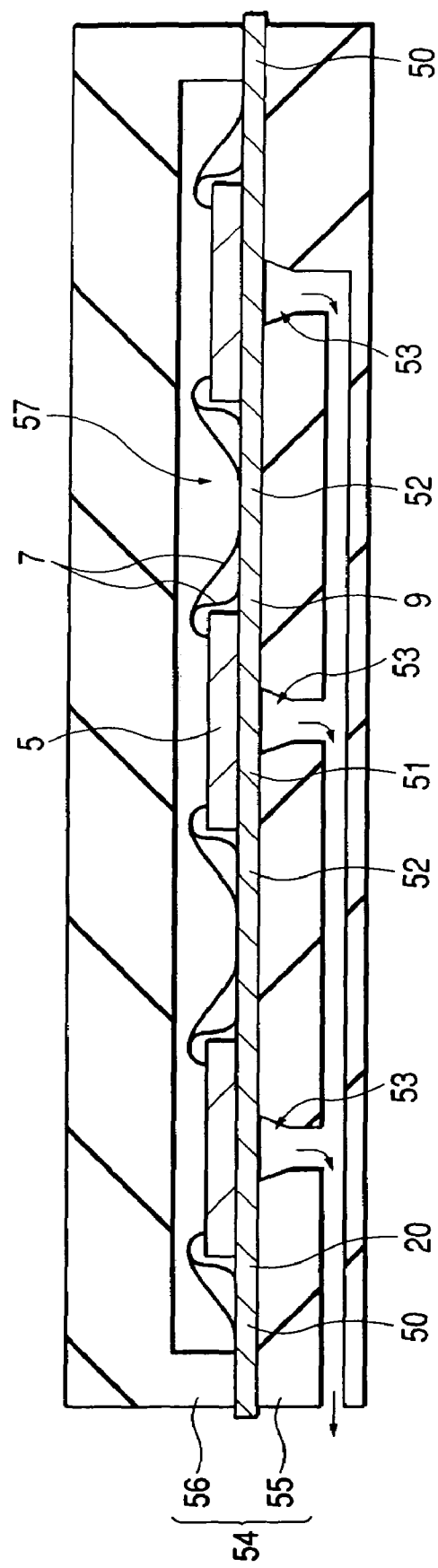
FIG. 63 is a schematic cross-sectional view showing a vacuum suction state of the lead frame during transfer molding in the semiconductor device manufacturing method according to Embodiment 15.

Next, as shown in FIG. 60D, the semiconductor elements 5 and wires 7 are covered by an insulating resin (resin layer 3$a$) by transfer molding to seal the package. When this transfer molding is performed, the tab parts 51 of the substrate 20 are made to adhere to the surface of the lower die of a molding die by vacuum suction nozzles 53. This state is shown in FIG. 63. In FIG. 60($d$), the nozzles 53 are shown schematically.

As shown in FIG. 63, the substrate 20 is die clamped between a lower die 55 and upper die 56 of a molding die 54. The region inside the substrate frame 50 of the substrate 20 is situated inside a cavity 57, which is a rectangular depression provided on the parting surface of the upper die 56, and the semiconductor elements 5 and wires 7 are situated inside the cavity 57. In transfer molding, resin is pressure-injected from a gate and the cavity 57 is filled with resin, but there is a risk that resin will flow onto the lower surface of the tabs 51, i.e., the surface of the tabs 51 in contact with the lower die 55. Hence, vacuum suction is applied to the tabs 51 as shown by the arrow using the nozzles 53 provided on the lower die 55 as shown schematically in FIG. 62. In this way, the tabs 51 are kept in adhesive contact with the flat parting surface of the lower die 55 and seepage of resin is prevented.

Due to this, the resin layer 3$a$ of constant thickness specified by the shape of the cavity 57 is formed on the principal surface side of the substrate 20 without resin adhering to the lower surface of the tabs 51 and leads 52 (See FIG. 60D).

Figure 60E:
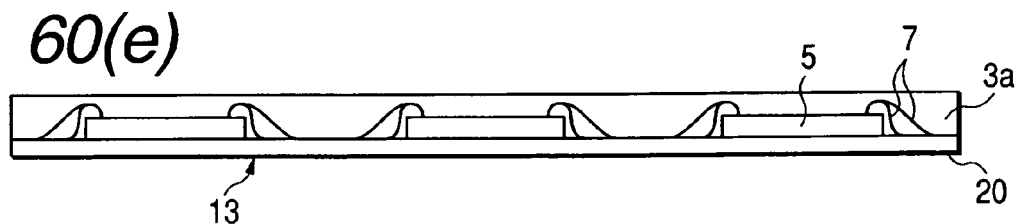

Next, as shown in FIG. 60E, the external mounting plating film 13, not shown (in the figure, only the symbol is shown, FIG. 59), is formed on the rear surface of the substrate 20.

Figure 60F:
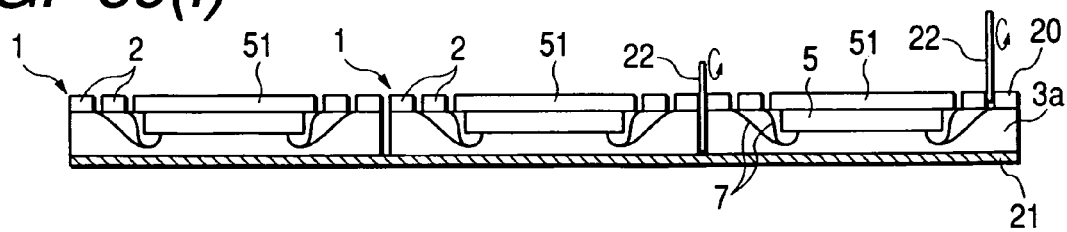

Next, as shown in FIG. 60F, the tape 21 is affixed as a supporting member to the resin layer 3$a$, and the substrate 20 is cut transversely and longitudinally by a dicing blade with the substrate 20 facing upwards.

The cutting by the dicing blade 22 is performed transversely in a direction perpendicular to the leads 52. Cutting is performed at the parts of the leads 52 attached to the tabs 51, the boundaries of the wire bonding positions, the boundaries between unit substrate parts (unit substrate regions) and unit substrate parts (unit substrate regions), and the boundaries between the unit substrate parts (unit substrate regions) and the frame body 50.

In the cutting at the boundaries between unit substrate parts (unit substrate regions) and unit substrate parts (unit substrate regions), and the cutting at the boundaries between the unit substrate parts (unit substrate regions) and the frame body 50, the resin layer 3$a$ is cut simultaneously. Due to cutting of the resin layer 3$a$, the semiconductor device 1 is manufactured, and the resin layer 3$a$ covering the semiconductor elements 5 and wires 7 becomes the resin sealing package 3. In the cutting of the resin layer 3$a$, care is taken not to completely cut the tape 21. As this cutting takes place in the two directions XY, it is preferred that after cutting in one direction, the parts are still held by the tape 21.

Figure 58:
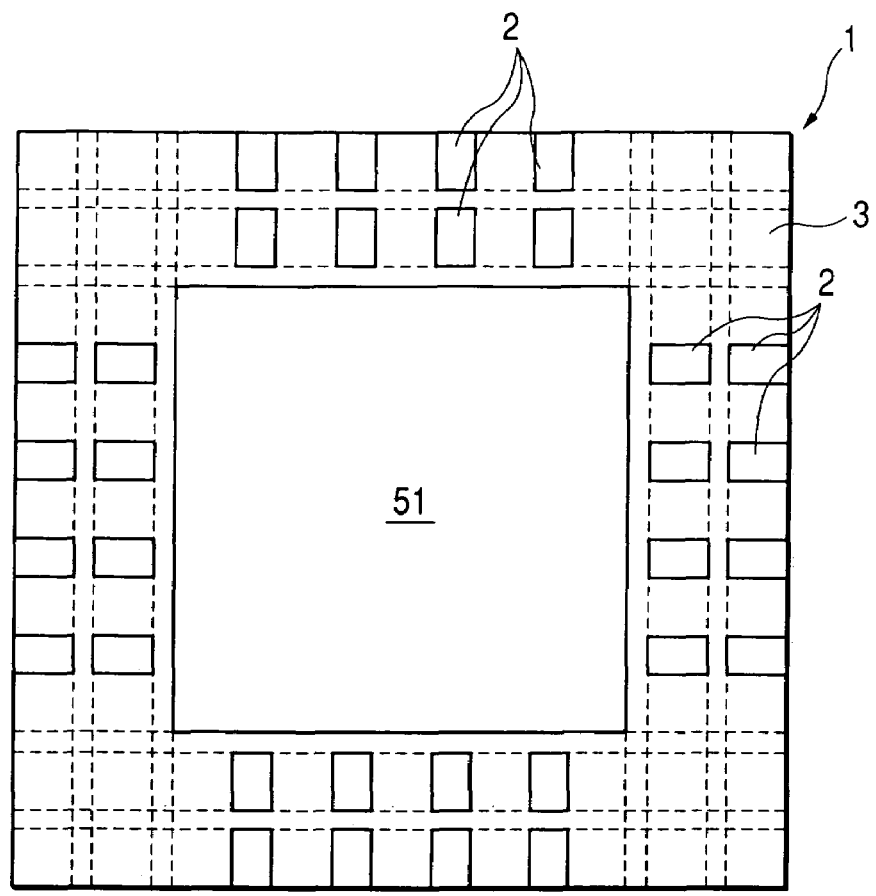
FIG. 58 is a base plan view of the semiconductor device of Embodiment 15.
Figure 60G:
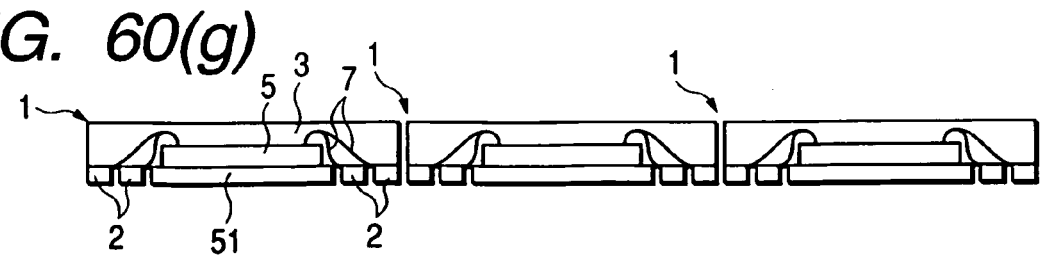

Next, as shown in FIG. 60G, plural non-leaded semiconductor devices 1 are manufactured by peeling the tape 21 off the resin sealing body 3. FIG. 56 to FIG. 59 are diagrams relating to the semiconductor devices 1 manufactured in this way. FIG. 56 is a cross-sectional view of the manufactured non-leaded semiconductor device, FIG. 57 is a plan view of the non-leaded semiconductor device showing the external outline of the resin sealing without the resin sealing, FIG. 58 is a base plan view of the semiconductor device, and FIG. 59 is an enlarged cross-sectional view of part of the semiconductor device.

On the mounting surface side of the semiconductor device 1, as shown in FIG. 58, the square tab 51 is situated in the middle, and the external electrode terminals 2 are aligned in two rows along each side of the tab 51.

In the semiconductor device 1 according to Embodiment 15, during mounting, only the external electrode terminals 2 may be fixed, or the external electrode terminals 2 and tabs 51 may be fixed, to the interconnection board.

In the manufacture of the non-leaded semiconductor device 1, Embodiment 15 also has some of the advantages of the preceding embodiments.

Also, in Embodiment 15, both ends of the leads 52 formed on the external electrode terminals 2 are supported, and as it is not a cantilever construction, it does not float up during molding. Therefore, resin also does not adhere to the mounting surfaces of the external electrode terminals 2.

In Embodiment 15, the leads 52 had two wire bonding positions, but there may be plural positions. Specifically, if further division into plural pieces is possible by the dicing blade, plural external electrode terminals 2 can also be formed from one of the leads 52.

Embodiment 16

FIG. 64 to FIG. 69 are diagrams relating to the method of manufacturing the semiconductor device according to another embodiment (Embodiment 16) of this invention. In Embodiment 16, the unit substrate parts of Embodiment 15 are formed by the tabs 51 and leads 52, so the four corners of the rectangular unit substrate regions are not used efficiently. This embodiment therefore provides a means of also using the four corners efficiently.

Figure 68:
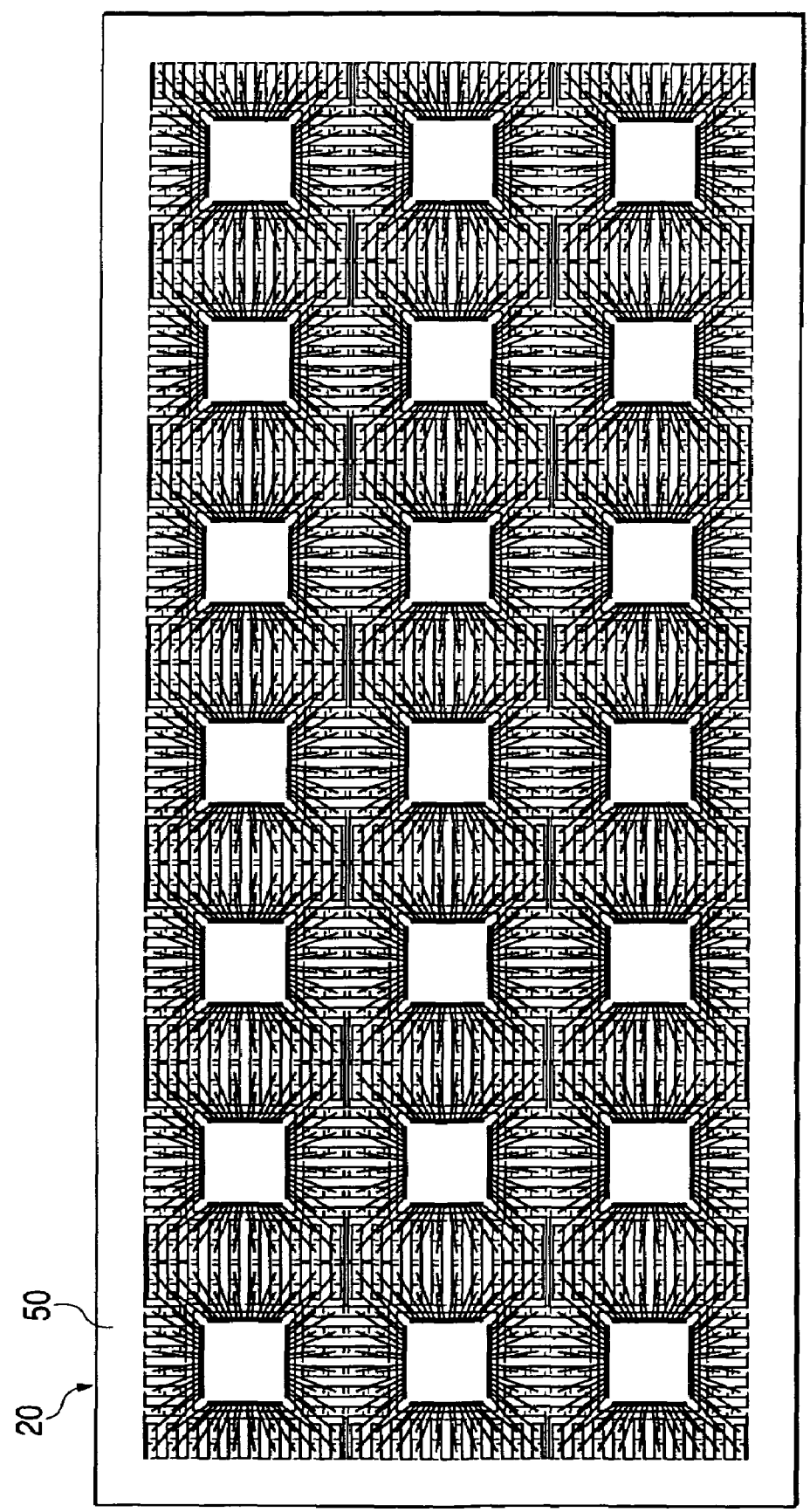
FIG. 68 is a schematic plan view showing the lead frame used in the semiconductor device manufacturing method according to Embodiment 16, and a fixed semiconductor chip.
Figure 69:
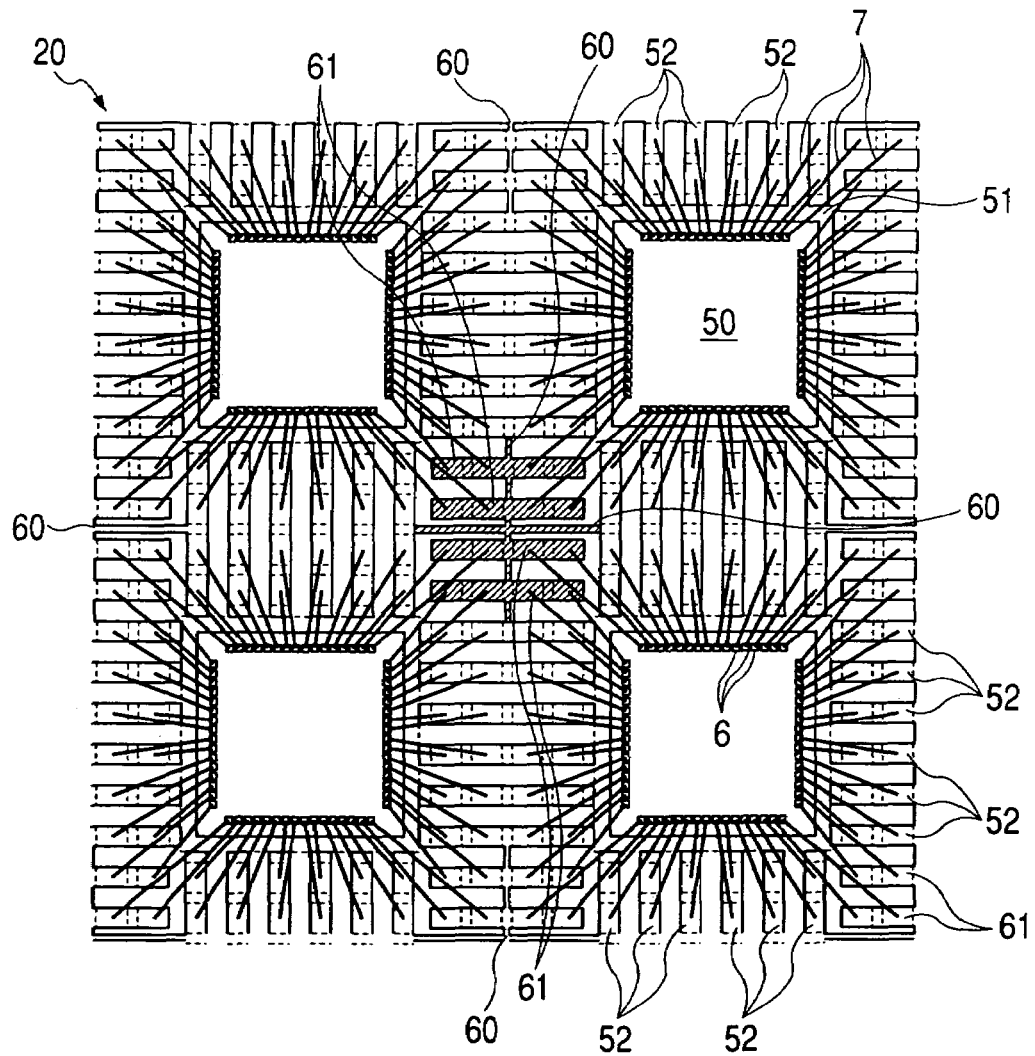
FIG. 69 is an enlarged cross-sectional view showing part of the lead frame used in Embodiment 16.

In Embodiment 16, the substrate 20 shown in FIG. 68 is used. To clarify the unit substrate regions, FIG. 69 shows a partial enlargement. FIG. 68 and FIG. 69 are plan views showing the state where chip bonding and wire bonding have been completed.

In Embodiment 16, when the substrate 20 is patterned, the two edges are connected to the areas at the four corners of the unit substrate regions directly to the substrate frame 50 or leads 52, or via the supplementary pieces 60, and plural corner leads 61 having plural wire connecting regions are formed in their length direction. The wires 7, which are connected to the electrodes of the semiconductor element, are also connected to the wire connecting regions of the corner leads 61, and when the leads are selectively removed, the corner leads 61 are split between the wire connecting regions and the supplementary pieces 60 are removed. In FIG. 68, the positions described are not clearly visible, so symbols are omitted except for the substrate 20 and substrate frame 50.

The semiconductor device 1 is manufactured by identical steps to those of Embodiment 15 using the substrate 20 shown in FIG. 68. When the leads 52 are cut, cutting of the corner leads 61 takes place by moving the dicing blade in a straight line to form the external electrode terminals 2. The supporting pieces 60 are narrower than the width of the dicing blade, and as they are aligned in the travel direction of the dicing blade, they are cut and removed by the dicing blade.

Figure 64:
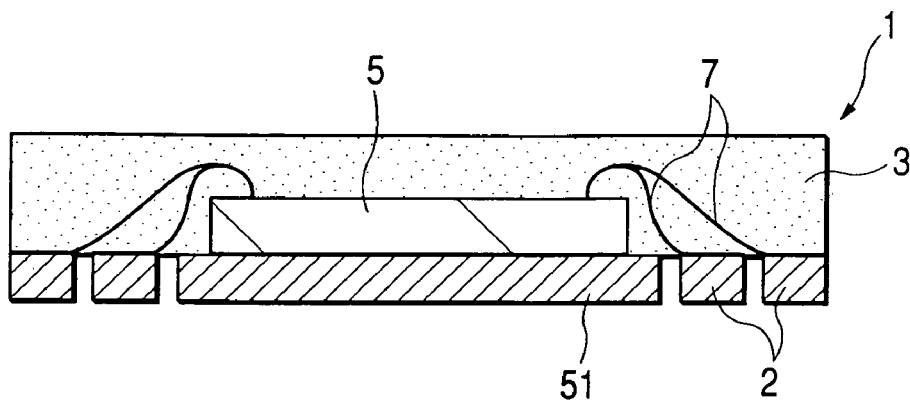
FIG. 64 is a cross-sectional view of a non-leaded semiconductor device manufactured by the semiconductor device manufacturing method according to another embodiment (Embodiment 16) of this invention.
Figure 65:
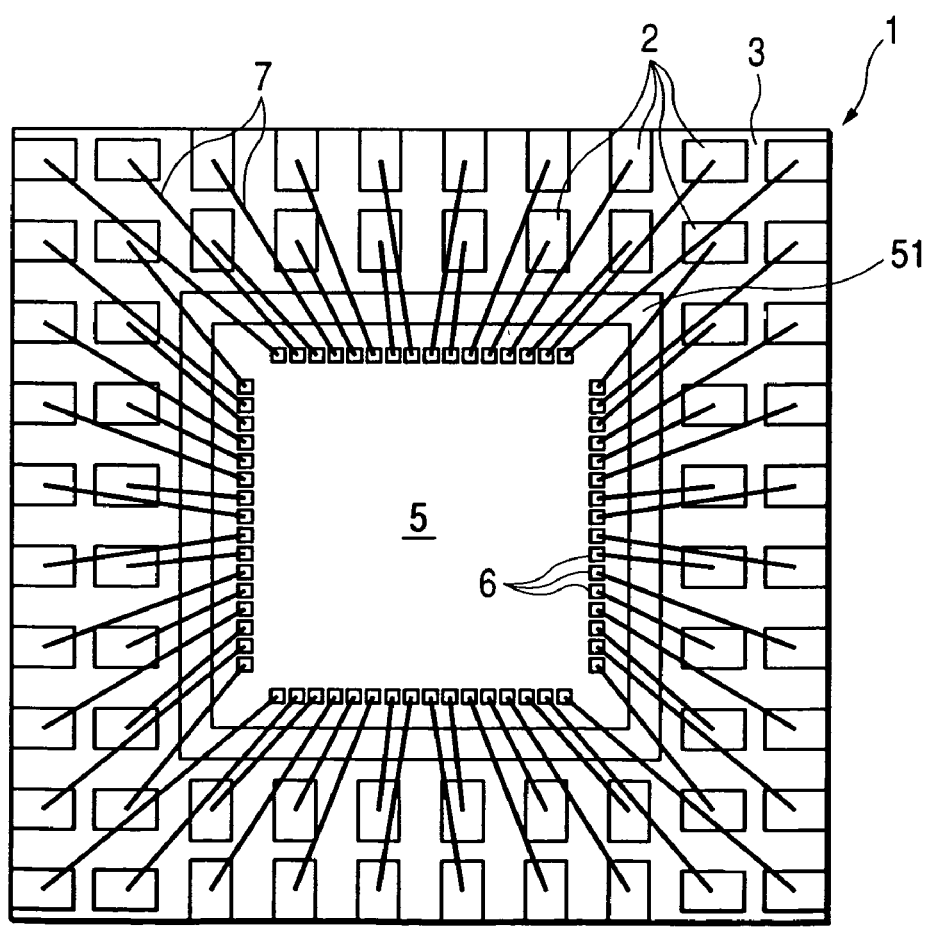
FIG. 65 is a perspective view showing the planar arrangement of the semiconductor device of Embodiment 16.
Figure 66:
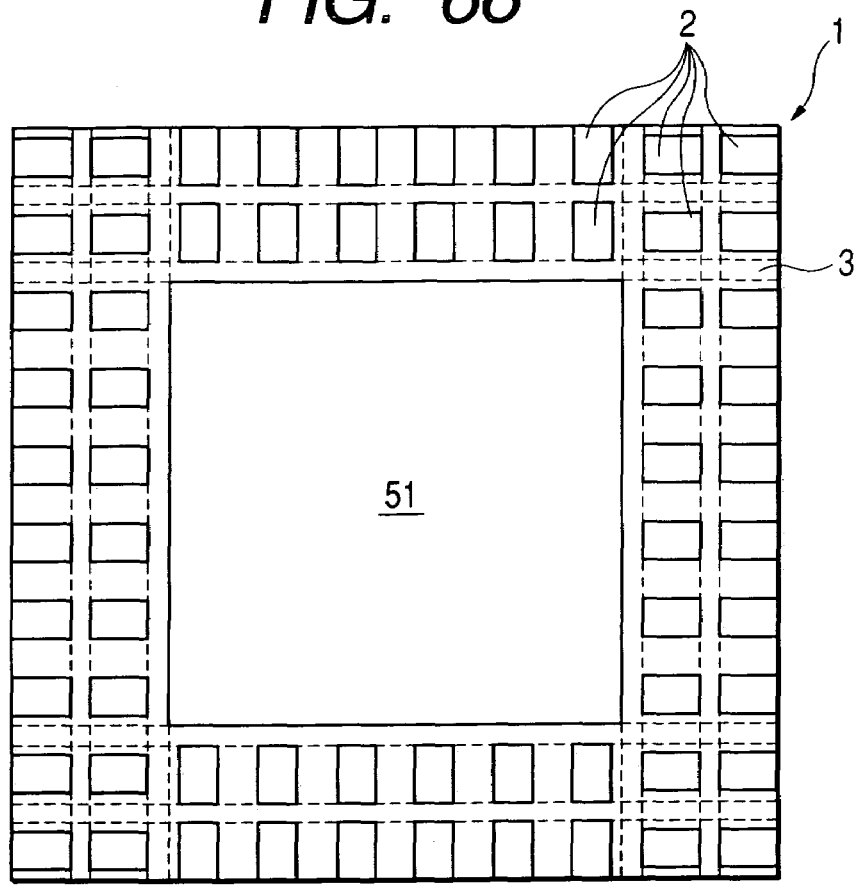
FIG. 66 is a base plan view of the semiconductor device of Embodiment 16.
Figure 67:
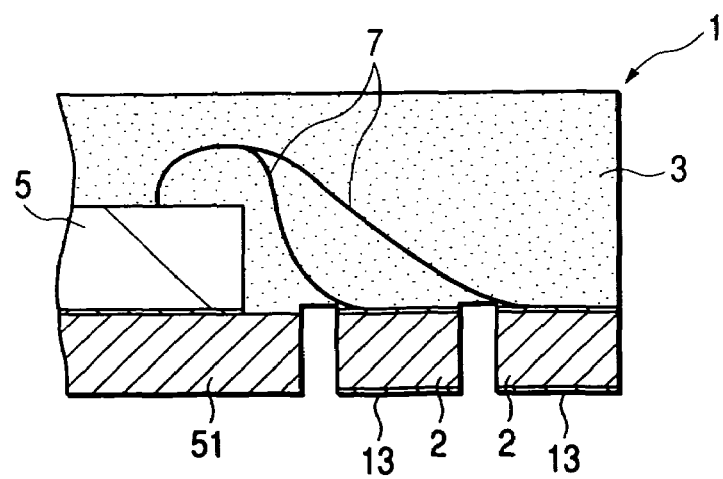
FIG. 67 is an enlarged cross-sectional view of part of the semiconductor device of Embodiment 16.

As a result, the semiconductor device 1 shown in FIG. 64 to FIG. 67 is manufactured. FIG. 64 is a cross-sectional view of the semiconductor device, FIG. 65 is a perspective view showing the planar arrangement of the semiconductor device, FIG. 66 is a base plan view of the semiconductor device, and FIG. 67 is an enlarged cross-sectional view of part of the semiconductor device. As shown in FIG. 65 and FIG. 66, the external electrode terminals 2 are formed also at the four corners of the unit substrate regions.

In Embodiment 16, both ends of the leads 52 and corner leads 61 formed on the external electrode terminals 2 are supported, and as it is not a cantilever construction, it does not float up during molding. Therefore, resin does not adhere to the mounting surfaces of the external electrode terminals 2.

In the manufacture of the non-leaded semiconductor device 1, Embodiment 16 has some of the advantages of the preceding embodiments.

Embodiment 17

Figure 70:
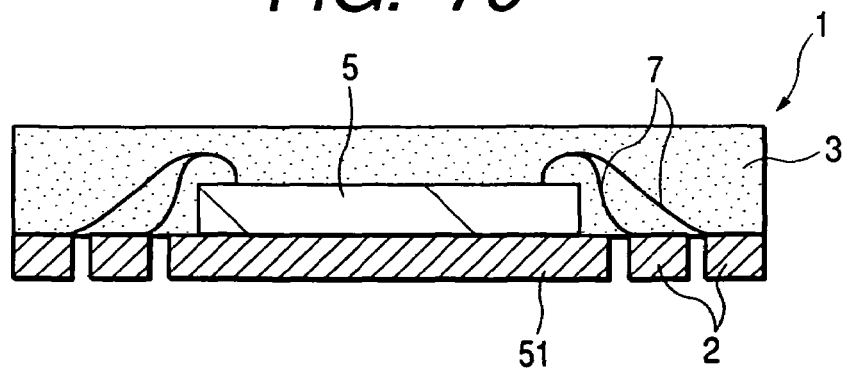
FIG. 70 is a cross-sectional view of a non-leaded semiconductor device manufactured by the semiconductor device manufacturing method according to another embodiment (Embodiment 17) of this invention.
Figure 71:
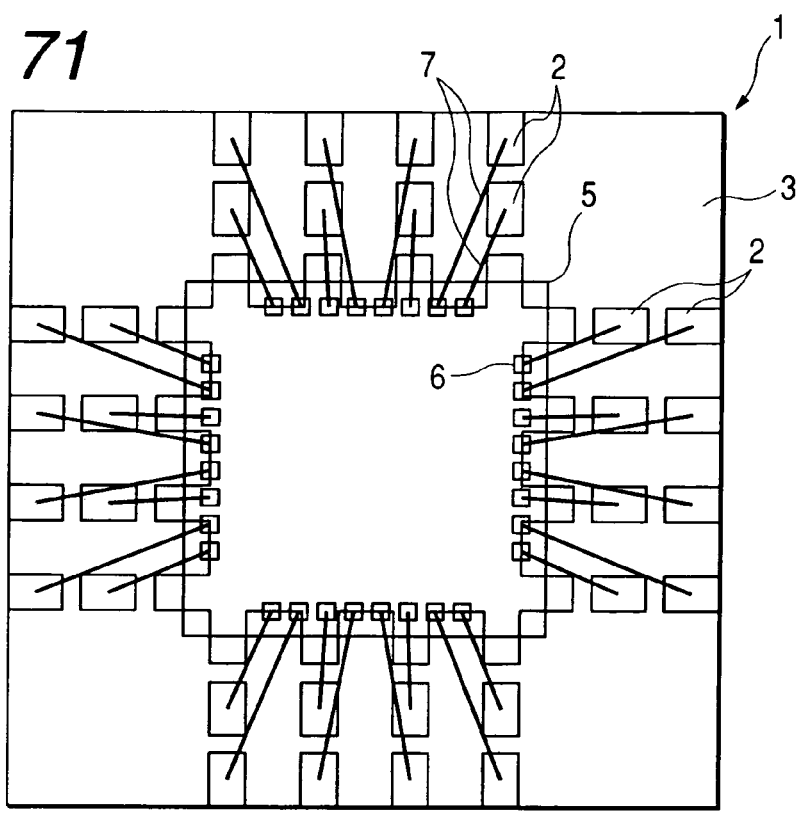
FIG. 71 is a perspective view showing the planar arrangement of the semiconductor device of Embodiment 17.
Figure 72:
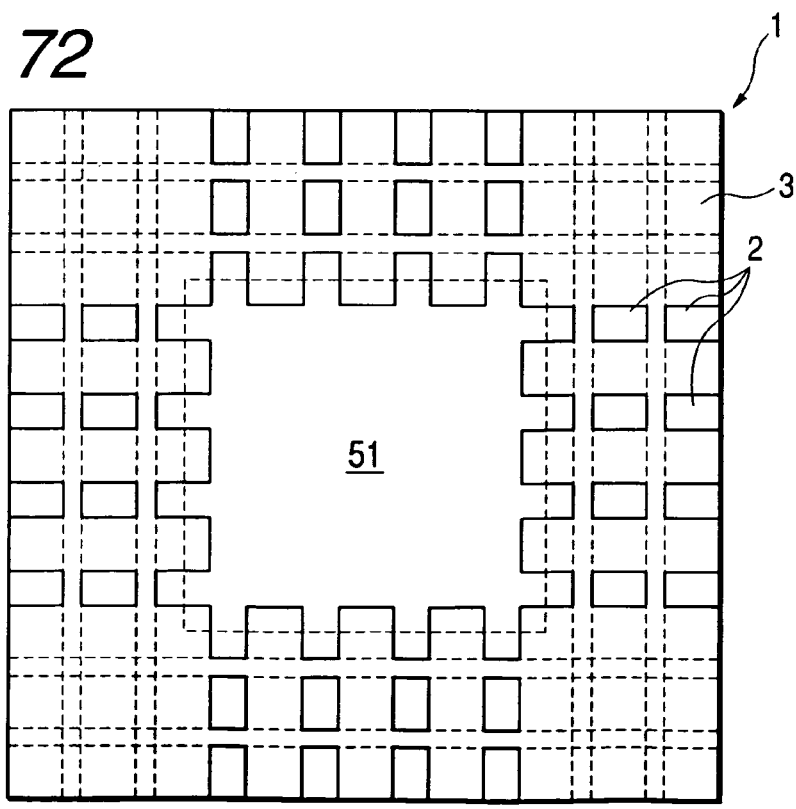
FIG. 72 is a base plan view of the semiconductor device of Embodiment 16.

FIG. 70 to FIG. 72 are diagrams relating to the method of manufacturing the semiconductor device according to another embodiment (Embodiment 17) of this invention. FIG. 70 is a cross-sectional view of the semiconductor device, FIG. 71 is a perspective view showing the planar arrangement of the semiconductor device, and FIG. 72 is a base plan view of the semiconductor device.

As shown in FIG. 71, Embodiment 17 is an example of application to the manufacture of a semiconductor device where the tabs 51 are small tabs relative to the semiconductor element 5. This small tab construction is widely applicable to different sizes of the semiconductor element 5, and has universality as the substrate 20.

Embodiment 18

Figure 73:
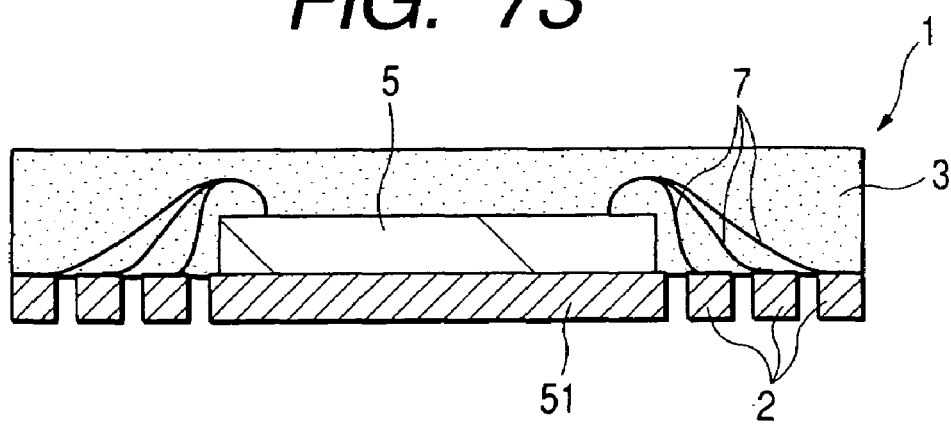
FIG. 73 is a cross-sectional view of a non-leaded semiconductor device manufactured by the semiconductor device manufacturing method according to another embodiment (Embodiment 18) of this invention.
Figure 74:
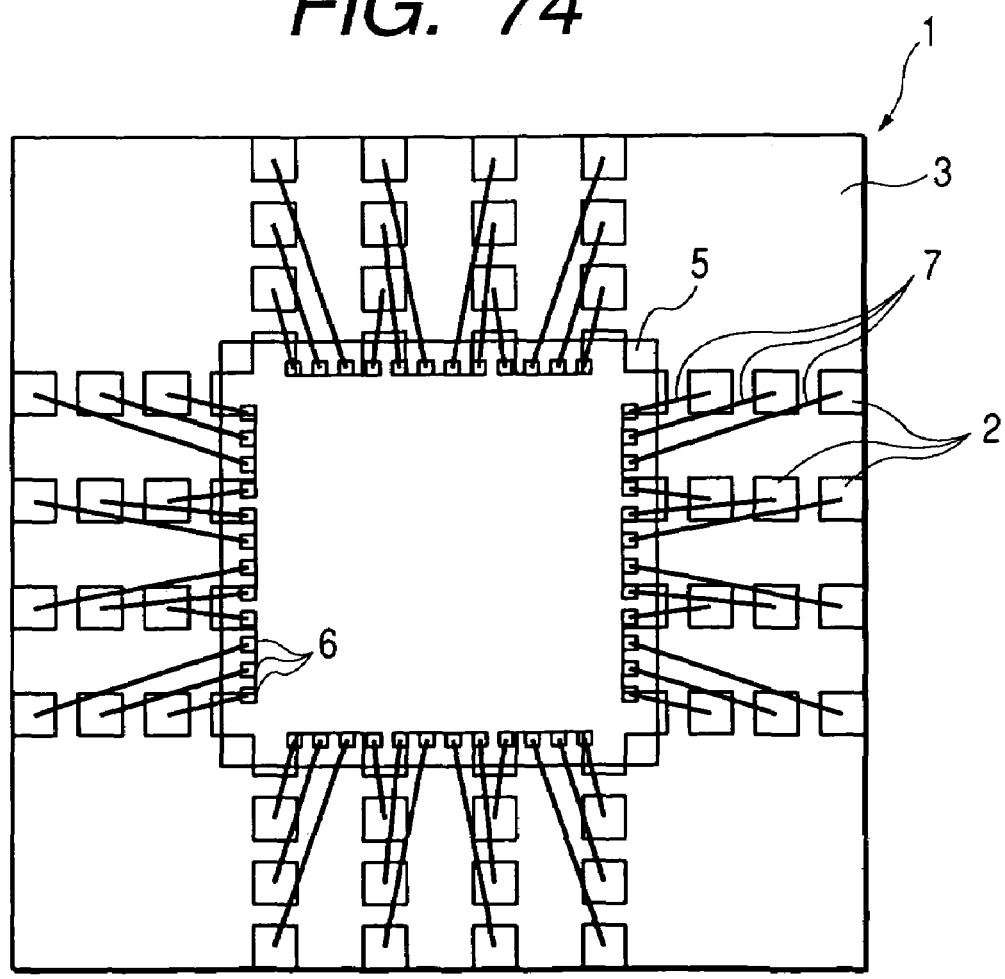
FIG. 74 is a perspective view showing the planar arrangement of the semiconductor device of Embodiment 18.
Figure 75:
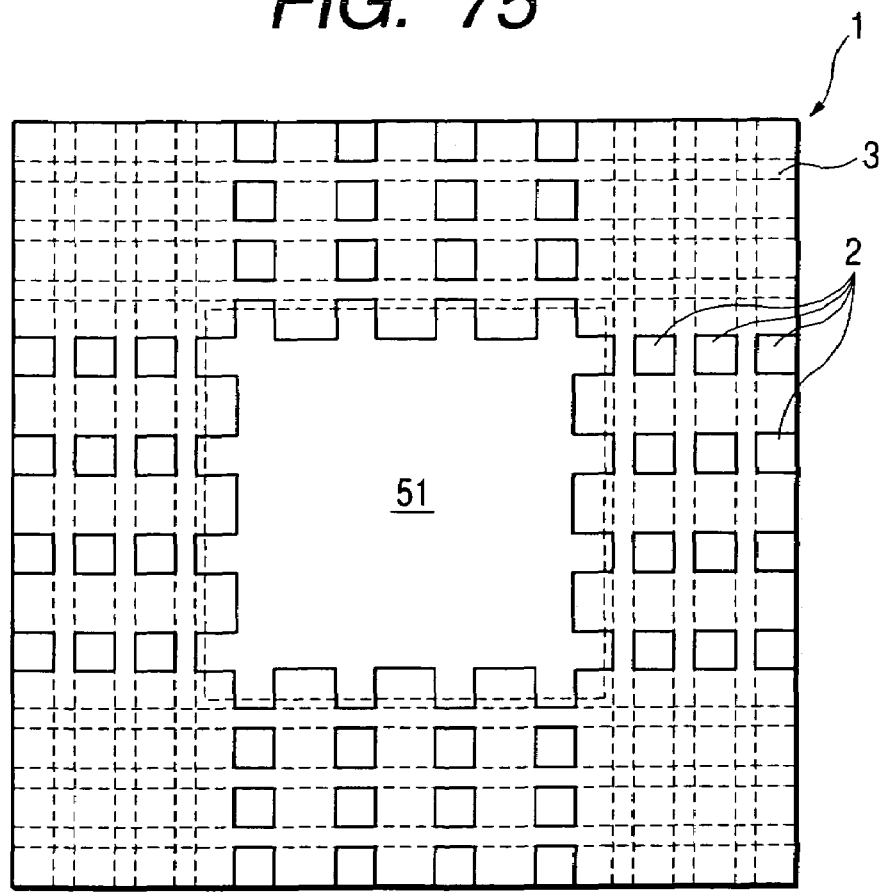
FIG. 75 is a base plan view of the semiconductor device of Embodiment 18.

FIG. 73 to FIG. 75 are diagrams relating to the method of manufacturing a semiconductor device according to another embodiment (Embodiment 18) of this invention. FIG. 73 is a cross-sectional view of the manufactured non-leaded semiconductor device, FIG. 74 is a perspective view showing the planar arrangement of the semiconductor device, and FIG. 75 is a base plan view of the semiconductor device.

Embodiment 18 is an example of application to the manufacture of a semiconductor device having a small tab construction as in Embodiment 17. In Embodiment 18, the external electrode terminals 2 are arranged in three rows along the sides of the resin sealing package 3.

In Embodiment 18, the number of the external electrode terminals 2 can be further increased.

Embodiment 19

Figure 76:
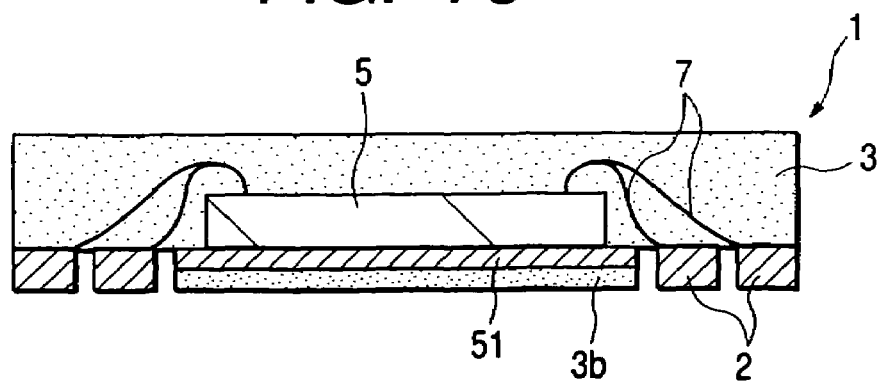
FIG. 76 is a cross-sectional view of a non-leaded semiconductor device manufactured by the semiconductor device manufacturing method according to another embodiment (Embodiment 19) of this invention.
Figure 77:
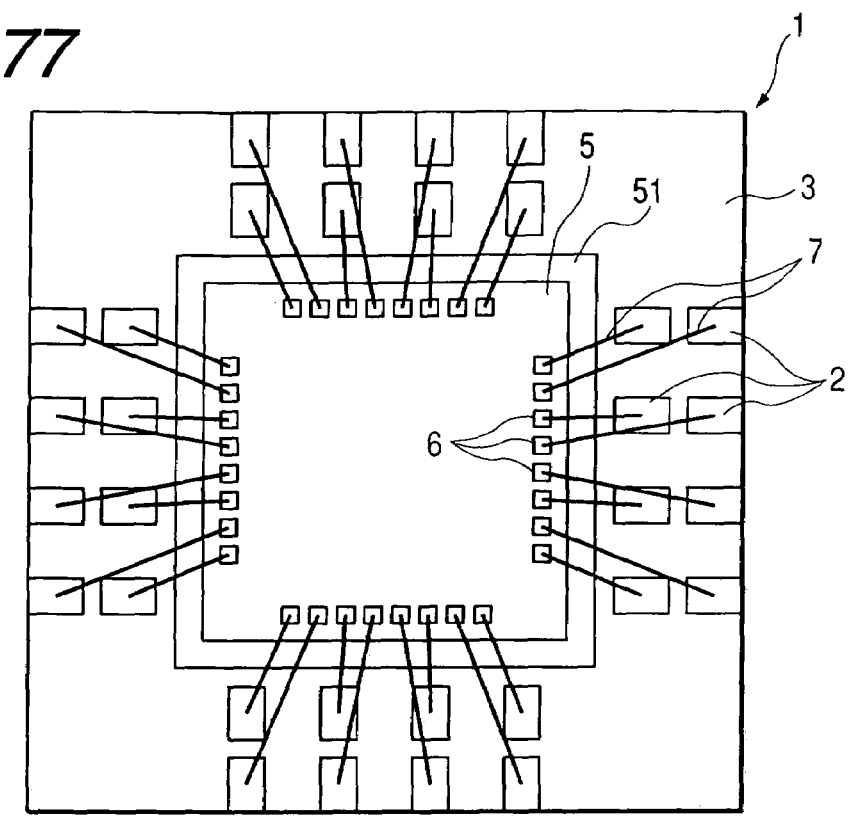
FIG. 77 is a perspective view showing the planar arrangement of the semiconductor device of Embodiment 19.
Figure 78:
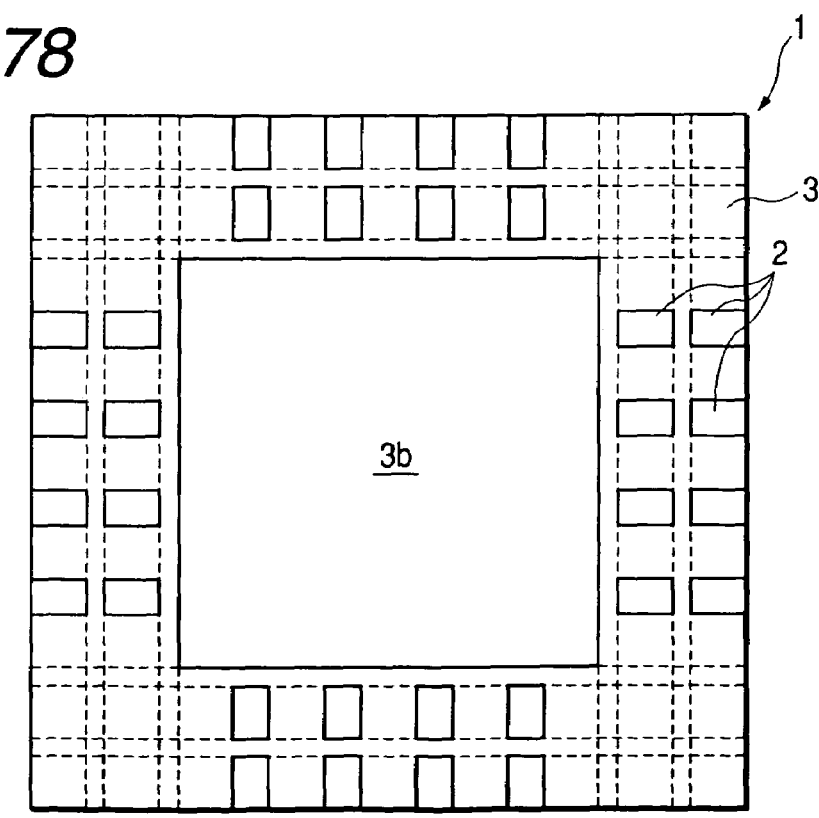
FIG. 78 is a base plan view of the semiconductor device of Embodiment 19.

FIG. 76 to FIG. 78 are diagrams relating to the method of manufacturing the semiconductor device according to another embodiment (Embodiment 19) of this invention. FIG. 76 is a cross-sectional view of the manufactured non-leaded semiconductor device, FIG. 77 is a perspective view showing the planar arrangement of the semiconductor device, and FIG. 78 is a base plan view of the semiconductor device.

Embodiment 19 is an example wherein the tab surface (rear surface) to which the semiconductor element 5 is not fixed, is formed thinner than the leads 52 on the periphery by etching to a predetermined thickness, and a resin layer 3b is also formed on the tab surface to which the semiconductor element 5 is not fixed when the resin layer 3a is formed by transfer molding.

In the semiconductor device 1 of Embodiment 19, during mounting, the resin layer 3b is interposed between the tab 51 and interconnection board, so the tab 51 can be electrically insulated.

Embodiment 20

Figure 79:
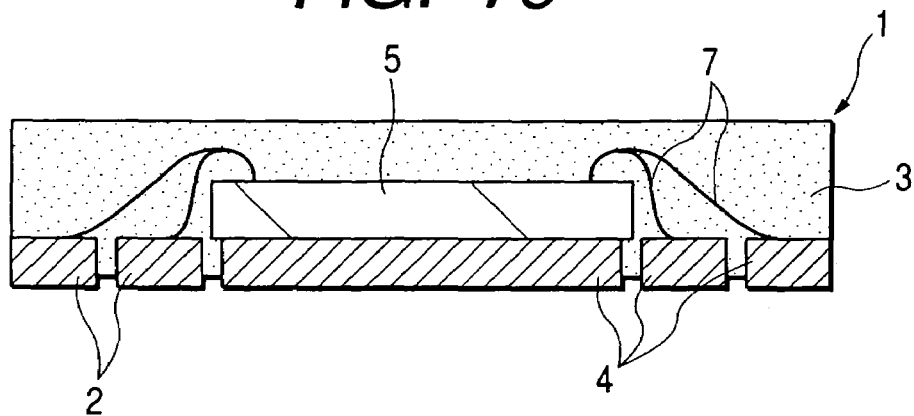
FIG. 79 is a schematic cross-sectional view of a non-leaded semiconductor device according to another embodiment (Embodiment 20) of this invention.
Figure 80:
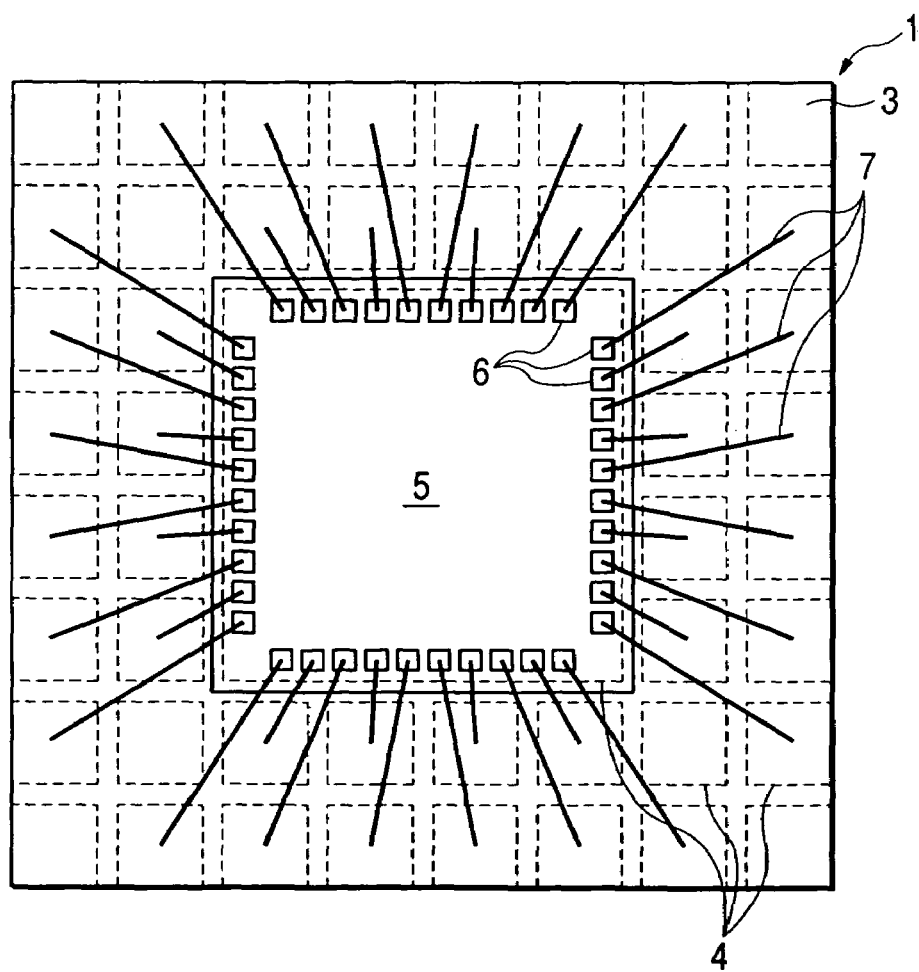
FIG. 80 is a perspective view showing the planar arrangement of the semiconductor device of Embodiment 20.
Figure 81:
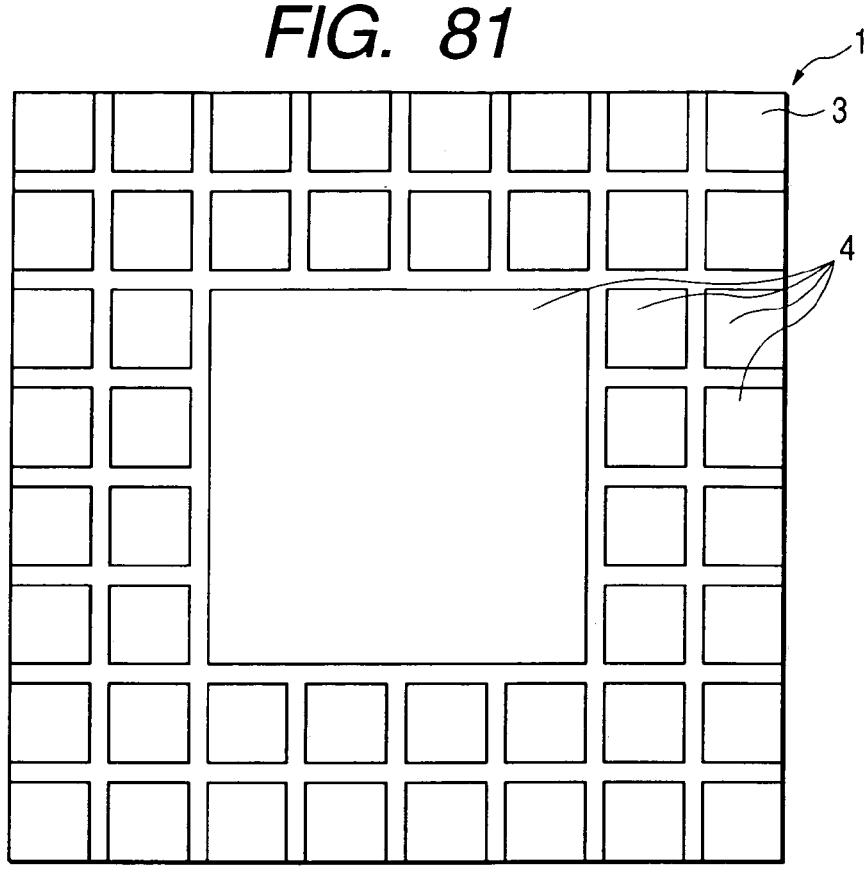
FIG. 81 is a base plan view of the semiconductor device of Embodiment 20.
Figure 82:
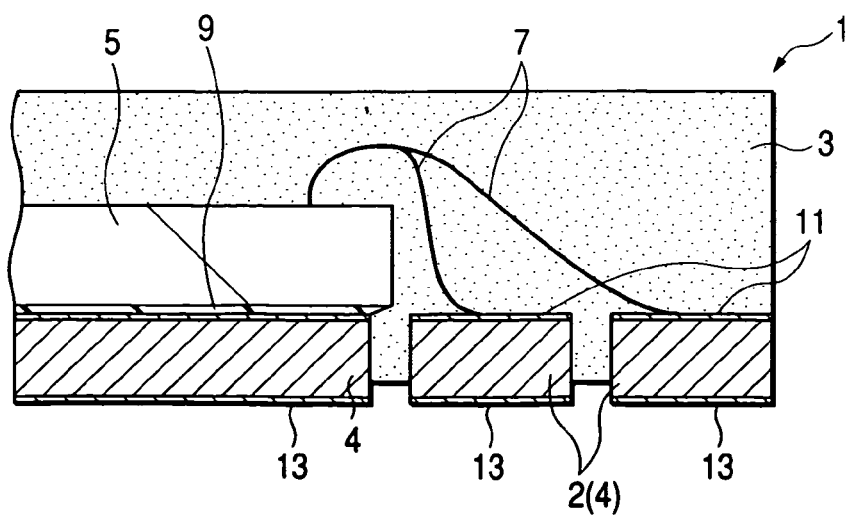
FIG. 82 is an enlarged cross-sectional view of part of the semiconductor device of Embodiment 20.

FIG. 79 to FIG. 82 are diagrams relating to the method of manufacturing the semiconductor device according to another embodiment (Embodiment 20) of this invention. FIG. 79 is a cross-sectional view of the semiconductor device, FIG. 80 is a perspective view showing the planar arrangement of the semiconductor device, FIG. 81 is a base plan view of the semiconductor device, and FIG. 82 is an enlarged cross-sectional view of part of the semiconductor device Embodiment 20, which is a Modification 3 of Embodiment 3, may be applied to the method of forming the partition parts 4 by polishing the undersurface of the substrate 20. Specifically, in this case, when the substrate 20 is patterned, the grooves 25 are not provided in the region to which the semiconductor element 5 is fixed. In this way, the bonding surface area of the semiconductor element 5 increases, the bonding strength increases, and heat which is generated from the semiconductor element 5 can be rapidly dissipated to the outside from the partition parts 4 which have a large surface area. Instead of polishing the lower surface of the substrate 20, the partition parts 4 may be formed by etching.

Embodiment 21

Figure 83:
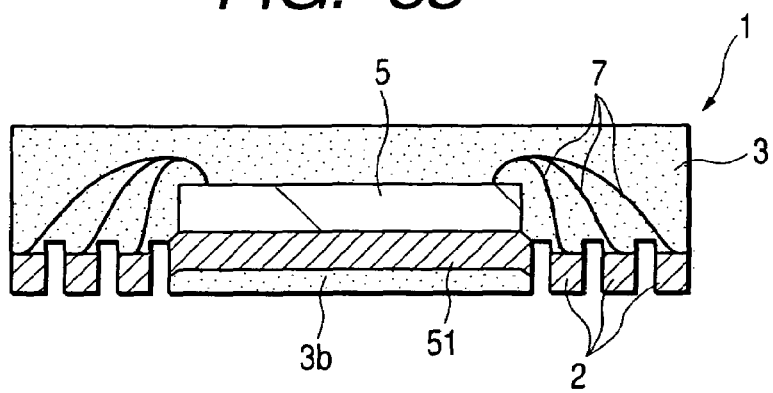
FIG. 83 is a schematic cross-sectional view of a non-leaded semiconductor device according to another embodiment (Embodiment 21) of this invention.

FIG. 83 is a schematic plan view of a semiconductor device manufactured by a method according to another embodiment (Embodiment 21) of this invention.

In Embodiment 21, the tab 51 is made one step higher in the example of Embodiment 15, and during transfer molding, the resin layer 3b is formed on the rear surface of the tab 51. In Embodiment 21, three external electrode terminals 2 are formed from one of the leads 52 by cutting the lead 52 at four positions.

Also in the case of the semiconductor device 1 of Embodiment 21, during mounting, the resin layer 3b is interposed between the tab 51 and interconnection board, so the tab 51 can be electrically insulated.

Embodiment 22

FIG. 84 to FIG. 97 are diagrams relating to the non-leaded semiconductor device according to another embodiment (Embodiment 22) of this invention. In Embodiment 22, a chip fixing partition part 42 which is slightly larger than the semiconductor element 5 is provided as in Embodiment 10, and the substrate 20 has the grooves 25 provided on the chip fixing surface side.

In the semiconductor device 1 of Embodiment 22, the front surfaces of the external electrode terminals 2 project beyond the front surface of the resin layer forming the resin sealing package 3 (stand-off construction).

Further, a notch 26 is provided as a direction identifying part on one side of the chip fixing partition part 42 formed by a single partition part (partition region) 4. As the chip fixing partition part 42 is exposed on the base surface of the resin sealing package 3, i.e., the surface on which it is mounted (mounting surface), the notch 26 is visible and can identify the directionality of the square semiconductor device 1. The identifying effect can also be obtained by beveling a corner of the chip fixing partition part 42.

Hereafter, the semiconductor device 1 of Embodiment 22 and its method of manufacture will be described referring to the drawings. FIG. 84 to FIG. 87 are diagrams relating to the construction of the semiconductor device, and FIG. 88 to FIG. 94 are diagrams relating to the method of manufacturing the non-leaded semiconductor device.

Figure 84:
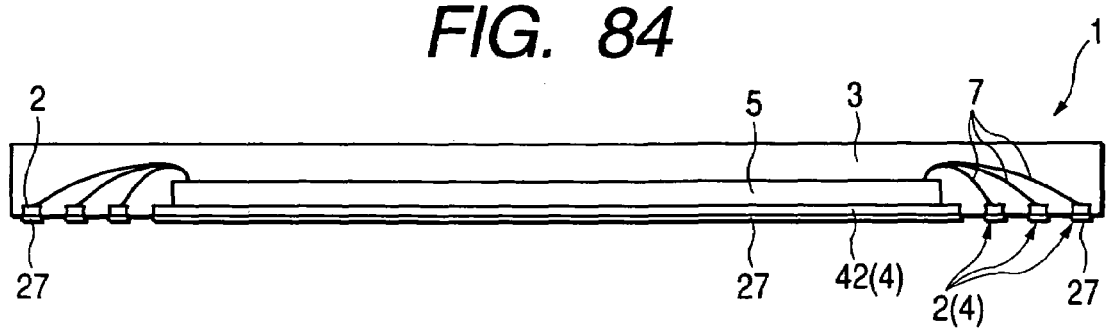
FIG. 84 is a schematic cross-sectional view of a non-leaded semiconductor device according to another embodiment (Embodiment 22) of this invention.
Figure 86:
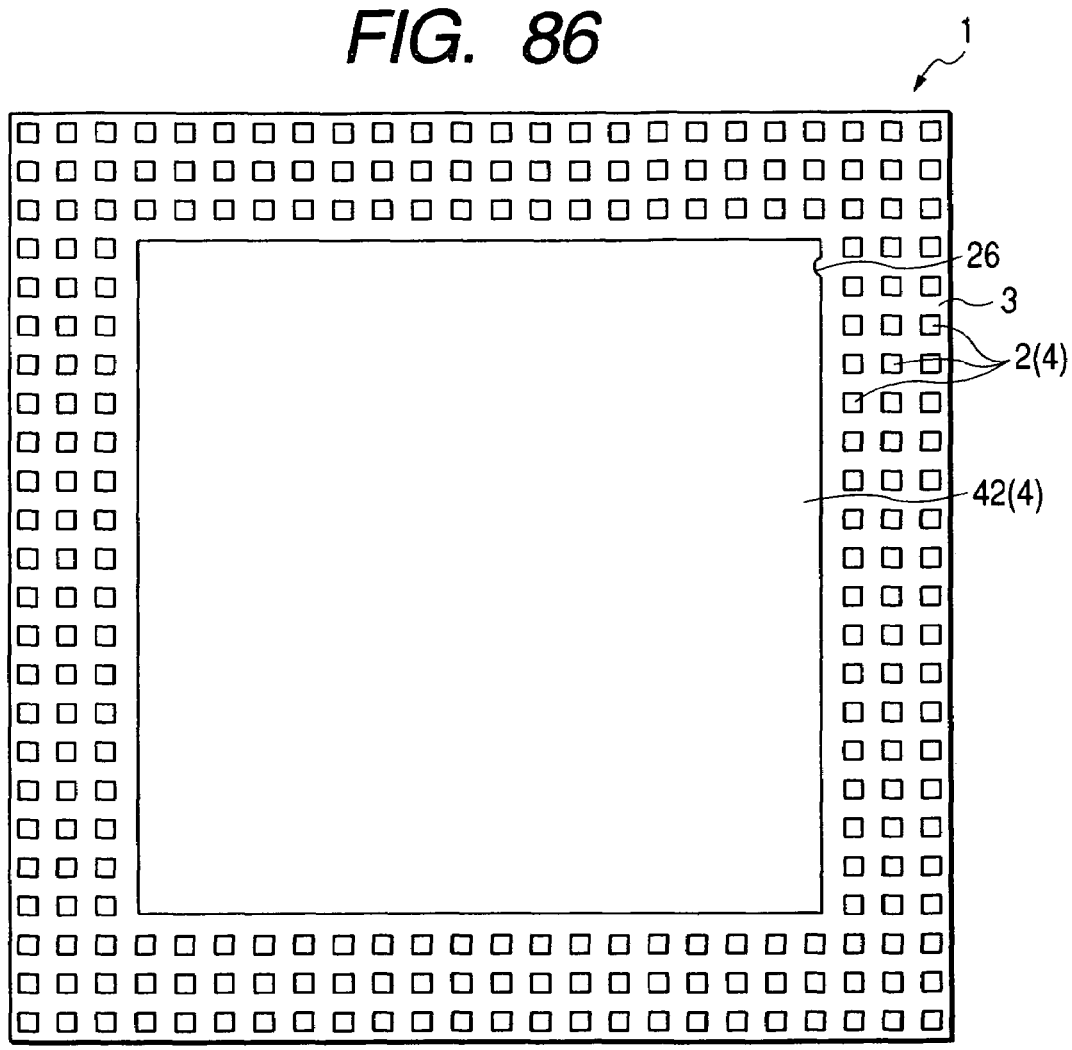
FIG. 86 is a base plan view of the non-leaded semiconductor device of Embodiment 22.

As shown in FIG. 84, the lower surface of the chip fixing partition part 42 is exposed on the lower surface of the resin sealing body 3, and as shown in FIG. 86, the external electrode terminals 2 are arranged in three rows on the outer periphery of the square chip fixing partition part 42.

Figure 85:
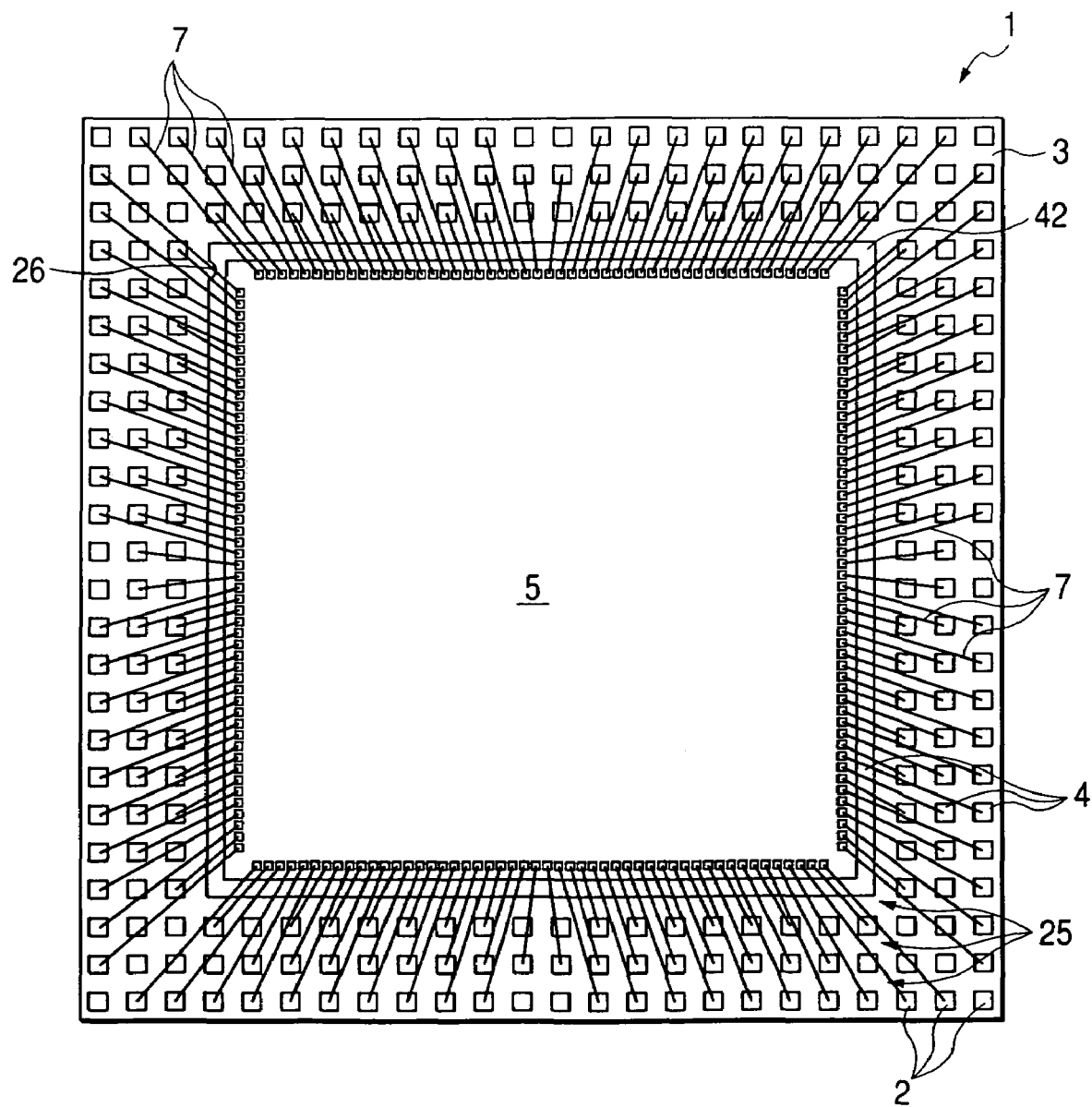
FIG. 85 is a perspective view showing the planar arrangement of external electrode terminals in the non-leaded semiconductor device of Embodiment 22.

A notch 26 is provided on one side of the chip fixing partition part 42. The chip fixing partition part 42 is a partition part (partition region) 4 of large surface area wherein the partition part (partition region) 4 forming the external electrode terminals 2 partly does not have the grooves 25. The chip fixing partition part 42 to which the semiconductor element 5 is fixed by the adhesive 9 (FIG. 87) is slightly larger than the semiconductor element 5. The electrodes on the front surface of the semiconductor element 5 and the external electrode terminals 2 are electrically connected by the conductive wires 7 in the resin sealing package 3 (FIG. 85, FIG. 87).

Figure 87:
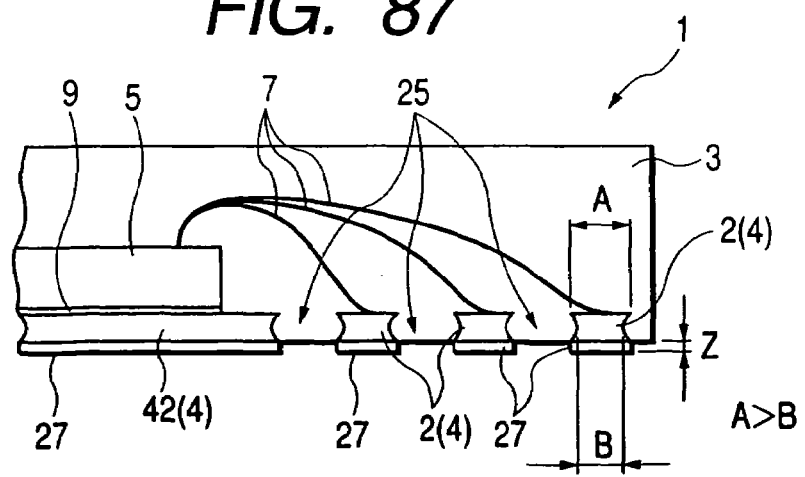
FIG. 87 is an enlarged cross-sectional view of part of the non-leaded semiconductor device of Embodiment 22.
Figure 88:
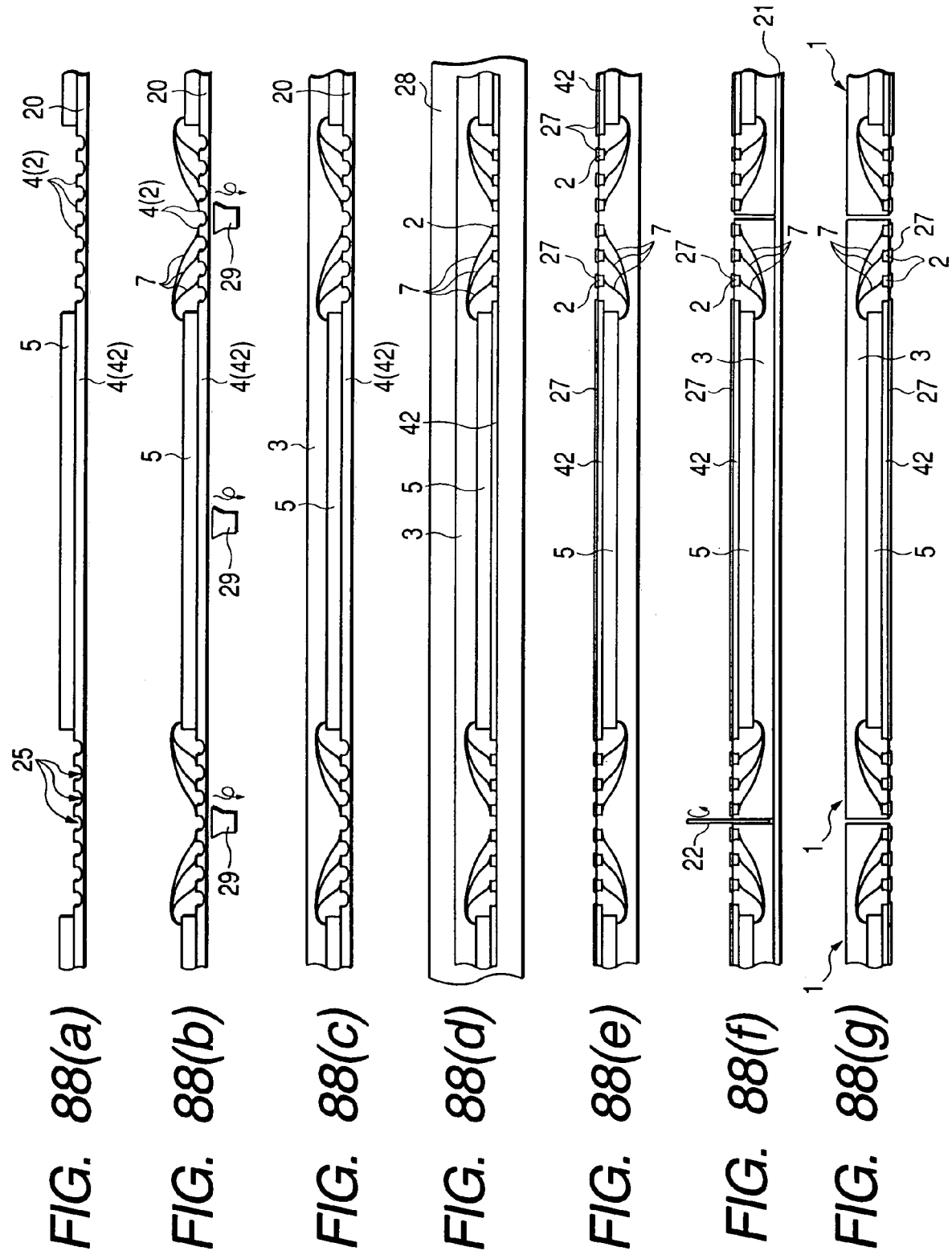
FIGS. 88A to 88G are cross-sectional views of the steps in the method of manufacturing the non-leaded semiconductor device of Embodiment 22.

A particular feature of this invention, as shown in FIG. 87 and FIG. 84, is that the external electrode terminals 2 and chip fixing partition part 42 project slightly from the lower face (mounting surface) of the resin sealing package. This projection is due to a plating film 27 formed on the front surfaces of the external electrode terminals 2 and chip fixing partition part 42 after etching the groove bases of the grooves 25 in the manufacture of the semiconductor device. A projection length z may for example be from several 10-several 100 μm. Due to this projection of the external electrode terminals 2 (stand-off construction), the external electrode terminals 2 and groove can be connected to the interconnections (lands) of the mounting board without fail when the semiconductor device 1 is mounted on the mounting board.

Figure 89:
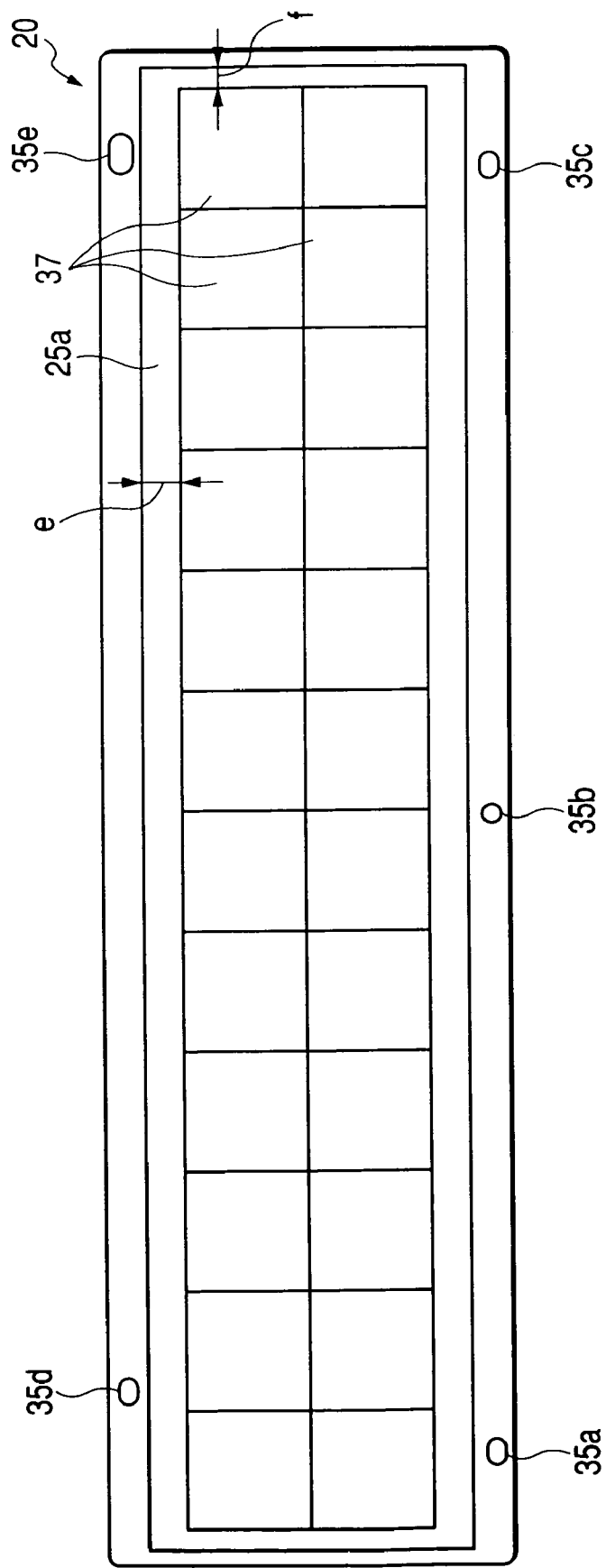
FIG. 89 is a schematic plan view of a substrate used in the method of manufacturing the non-leaded semiconductor device of Embodiment 22.

The semiconductor device 1 according to Embodiment 22 is manufactured via the steps shown in FIGS. 88A to 88G. In the manufacture of the semiconductor device 1 of Embodiment 22, the substrate 20 shown in FIG. 89 is used. The substrate 20 is rectangular, and guide holes 35a, 35b, 35c, 35d, 35e are provided along its long edge. These guide holes 35a, 35b, 35c, 35d, 35e are used as guide holes for transport and position-determining on the assembly line for the substrate 20. Unit substrate parts 37 are disposed in two rows along the short edge and 12 rows along the long edge of the substrate 20. The unit substrate parts 37 finally all become the semiconductor devices 1. A groove 25a having widths e, f is provided outside the rectangular region in which the unit substrate parts 37 are disposed. The outside of this groove 25a is a frame part 38.

Figure 90:
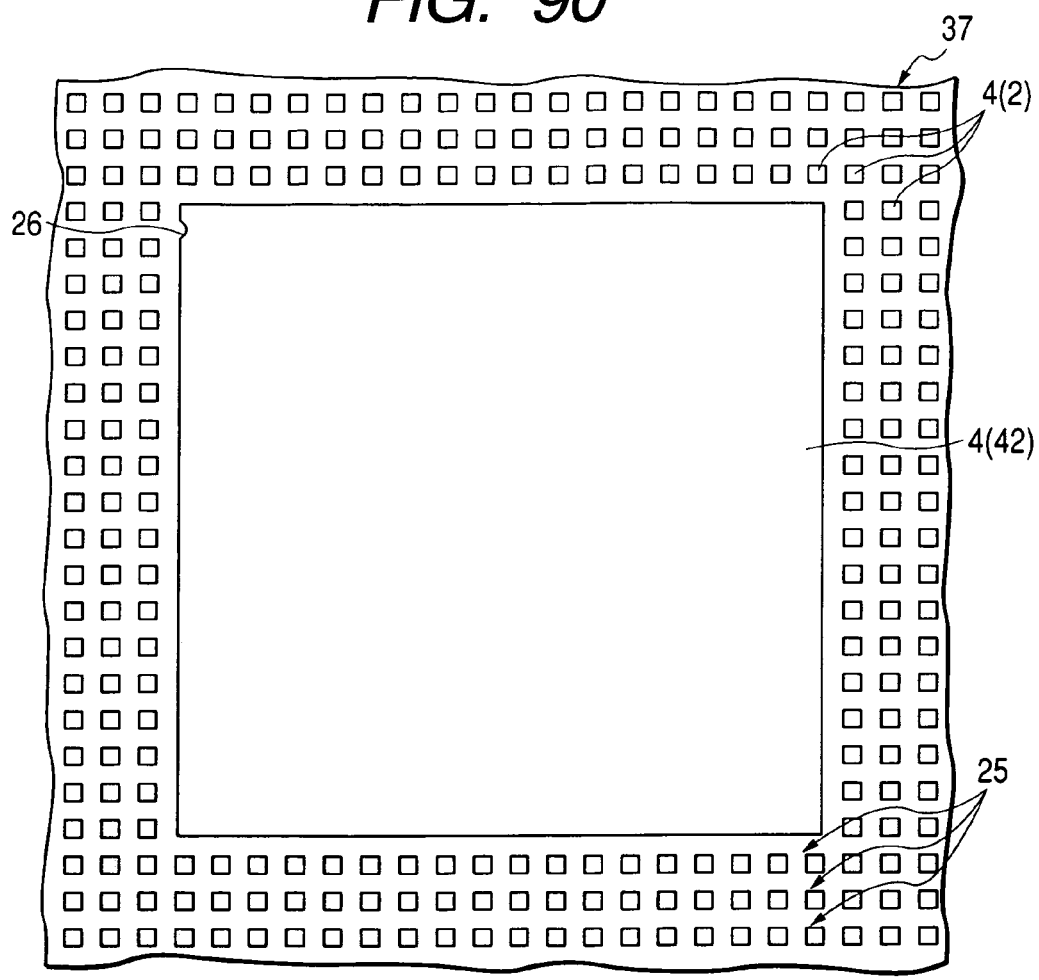
FIG. 90 is a schematic enlarged cross-sectional view showing a unit substrate region of the substrate used in the method of manufacturing the semiconductor device of Embodiment 22.
Figure 91:
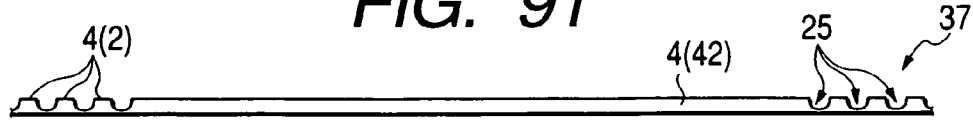
FIG. 91 is an enlarged cross-sectional view showing the unit substrate region of the substrate used in the method of manufacturing the semiconductor device of Embodiment 22.

FIG. 90 is a schematic enlarged plan view showing the unit substrate part 37, and FIG. 91 is an enlarged cross-sectional view showing the unit substrate part 37. As shown in FIG. 90, the notch 26 is provided on one side of the square partition part 4 which is the chip fixing partition part 42. Also, partition parts 4 which are the external electrode terminals 2 are arranged in three rows on the outer periphery of the chip fixing partition part 4. The grooves 25 are formed between the partition parts 4.

In the method of manufacturing the semiconductor device, as shown in FIG. 88A, chip bonding is performed, and the semiconductor element 5 is fixed to the partition part 4 which is the chip fixing partition part 42.

Next, as shown in FIG. 88A, wire bonding is performed, and the partition parts 4 which are the external electrode terminals 2 are connected to the electrodes of the semiconductor element 5 by the conductive wires 7.

Figure 92:
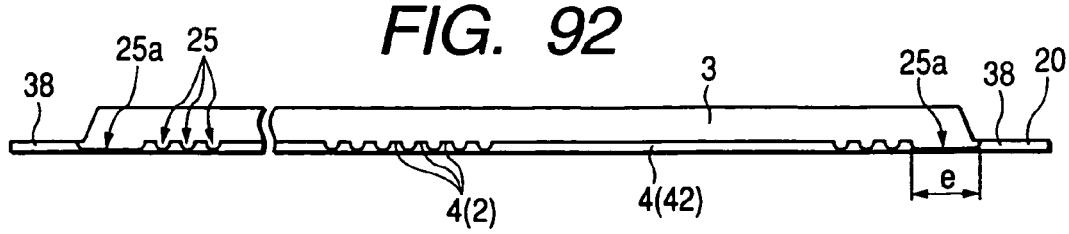
FIG. 92 is a partial cross-sectional view showing the substrate molded by one-side molding in the method of manufacturing the semiconductor device of Embodiment 22.
Figure 93A:
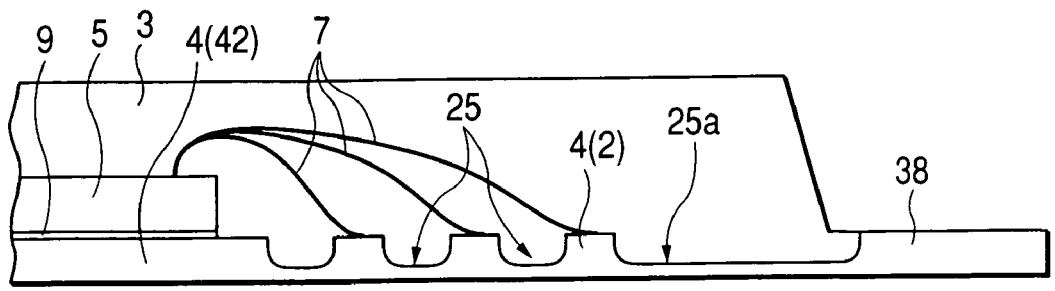
FIGS. 93A to 93C are partial enlarged cross-sectional views of manufacturing steps showing a substrate formed by one-side molding and a substrate whereof the substrate rear surface is etched.

Next, as shown in FIG. 88C, one-side molding is performed using transfer molding, and the semiconductor element 5 and wires 7 are covered in the insulating resin sealing package 3. FIG. 92 and FIG. 93A are partial cross-sectional views showing the substrate 20 which is one-side molded. As shown in these diagrams, the outer circumferential edge of the resin sealing package 3 does not extend to the frame part 38, but finishes midway along the groove 25a. This is so that the frame part 38 can be removed by etching, described later.

Figure 93B:
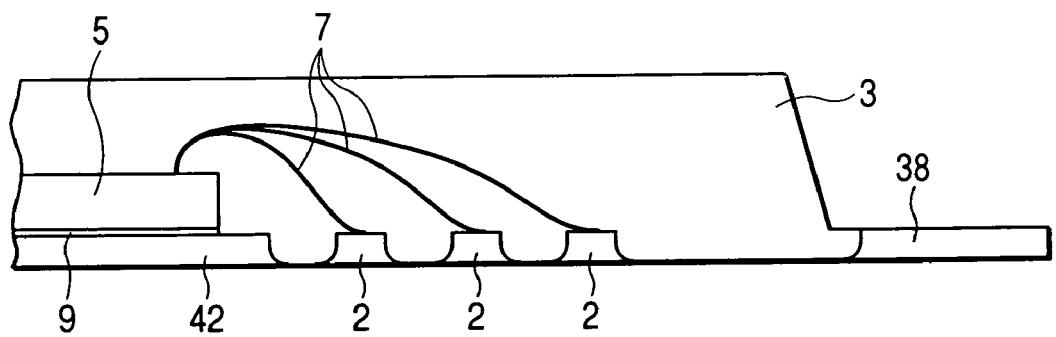

Next, as shown in FIG. 88D, the partition parts 4 are formed as the external electrode terminals 2 and chip fixing partition part 42 by removing the groove bases of the grooves 25, by immersing the substrate 20 in an etching solution 28. FIG. 93B is a partial enlarged cross-sectional view showing the resin sealing package 3 after etching. Due to the etching, the base (lower surface) of the resin sealing package 3 which is filled up to the bases of the grooves 25, 25a, is exposed. The substrate 20 no longer maintains a plate shape, and the frame part 38, external electrode terminals 2 and chip fixing partition part 42 are separated from each other by the etching. If a considerable force is applied to the frame part 38 the frame part 38 easily separates from the resin sealing package 3. Also in the method wherein the substrate 20 is polished to separate the partition parts 4, the frame body 38 can be separated from the resin sealing package 3.

Next, as shown in FIG. 88E, the plating film 27 is formed by plating on the front surfaces of the external electrode terminals 2 and chip fixing partition part 42 exposed on the lower surface of the resin sealing package 3. The plating may for example be PbSn plating, and the thickness of the plating film 27 is of the order of several 10 to several 100 μm. The base surface of the plated external electrode terminals 2 and chip fixing partition part 42 project further than the lower surface of the resin sealing package 3 exposed by etching (stand-off construction).

Figure 93C:
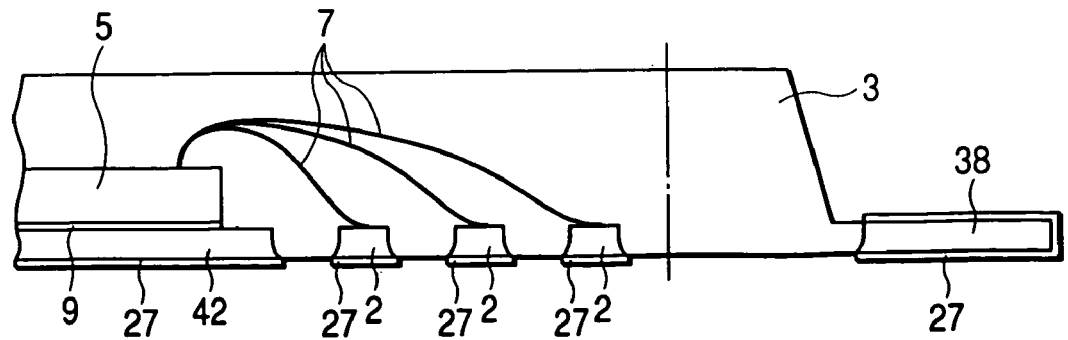
Figure 94:
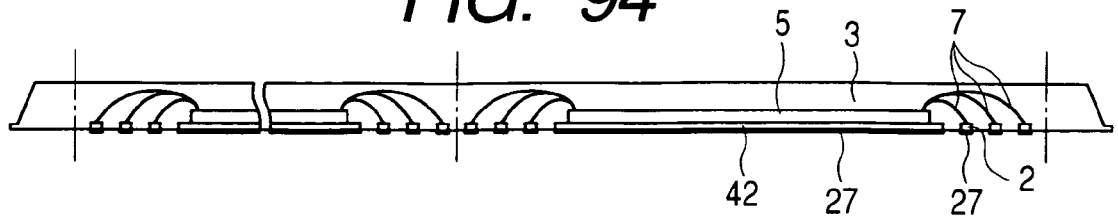
FIG. 94 is a partial cross-sectional view of a resin sealing package wherein a substrate rear surface is etched and the frame part is removed.

FIG. 93C is a partial enlarged cross-sectional view showing the resin sealing package 3 after plating. After plating, the resin sealing package 3 can be removed from the frame body 38 by applying a force to the frame body 38. FIG. 94 is a partial enlarged cross-sectional view showing the resin sealing package 3 with the frame body removed.

Next, as shown in FIG. 88F, cutting is performed, the tape 21 is affixed to the surface of the resin sealing package 3 which is the rear surface relative to the surface on which the chip fixing partition part 42 and the external electrode terminals 2 are present, and the resin sealing package 3 is cut transversely and longitudinally by the dicing blade 22 to fragment the unit substrate parts. The dot-and-dash line parts in FIG. 93C and FIG. 94 are the parts where the resin sealing package 3 is cut. As can be seen from these diagrams, metal is not present in the cut parts, and there is only the resin layer part forming the resin sealing package 3. Therefore, the life of the dicing blade used for cutting is extended.

Next, as shown in FIG. 88G, the tape 21 is peeled off the separated resin sealing package 3 to manufacture plural semiconductor devices 1.

In Embodiment 22, in the chip bonding of FIG. 88A, the chip fixing surface of the partition parts 4 which is the chip fixing partition part 42 is flat, and as it has no grooves, an adhesive used for fixing the semiconductor element does not flow into these grooves, so the amount of adhesive used is less, and the cost of manufacturing the semiconductor device is reduced. Also, as it is flat, chip bonding is more stable.

In the wire bonding of FIG. 88B, as the rear surface (lower surface) of the substrate 20 is flat, the partition part 4 which is the chip fixing partition part 42 to which the semiconductor element 5 is fixed, and the partition parts which are the external electrode terminals 2, can be held by vacuum adsorption with vacuum adsorption pads 29, so the quality of the wire bonding is stable. Specifically, due to the fixing of the substrate by vacuum adsorption, ultrasonic wire bonding can be performed without fail.

In the semiconductor device 1 of this embodiment, as the chip fixing partition part 42 is exposed on the mounting surface of the resin sealing package 3, the heat generated by the semiconductor element 5 can be rapidly dissipated to the outside by the chip fixing partition part 42, which provides for stable operation of the semiconductor device 1.

When the partition parts 4 are formed as the external electrode terminals 2 or chip fixing partition part 42 by removing the groove bases of the grooves 25, a method is used wherein the rear surface of the substrate 20 is removed to a certain thickness by polishing or etching. In the example of the diagram, the separation of the partition parts 4 is effected by etching (FIG. 88D). Also, the plating in FIG. 88E (e.g., external plating by PbSn, etc.) may conveniently be performed by a printing plate wherein the plating film thickness can be easily controlled. By this plating method, the stand-off height can be precisely controlled. A stand-off construction can be formed also by etching, by forming an etching mask on the rear surface of the part of the substrate 20 corresponding to the chip fixing partition part or external electrode terminals.

Figure 95:
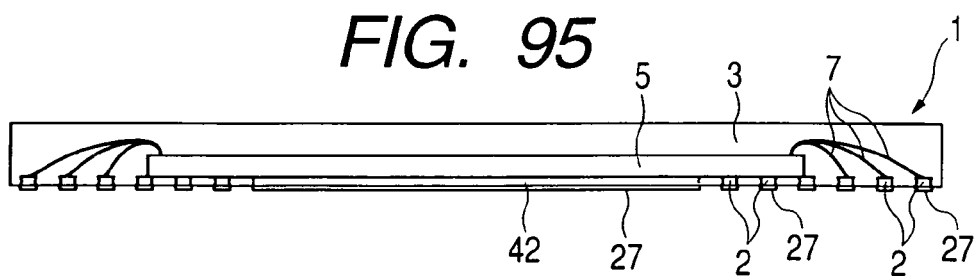
FIG. 95 is a schematic cross-sectional view of a non-leaded semiconductor device according to a modification of Embodiment 22.
Figure 96:
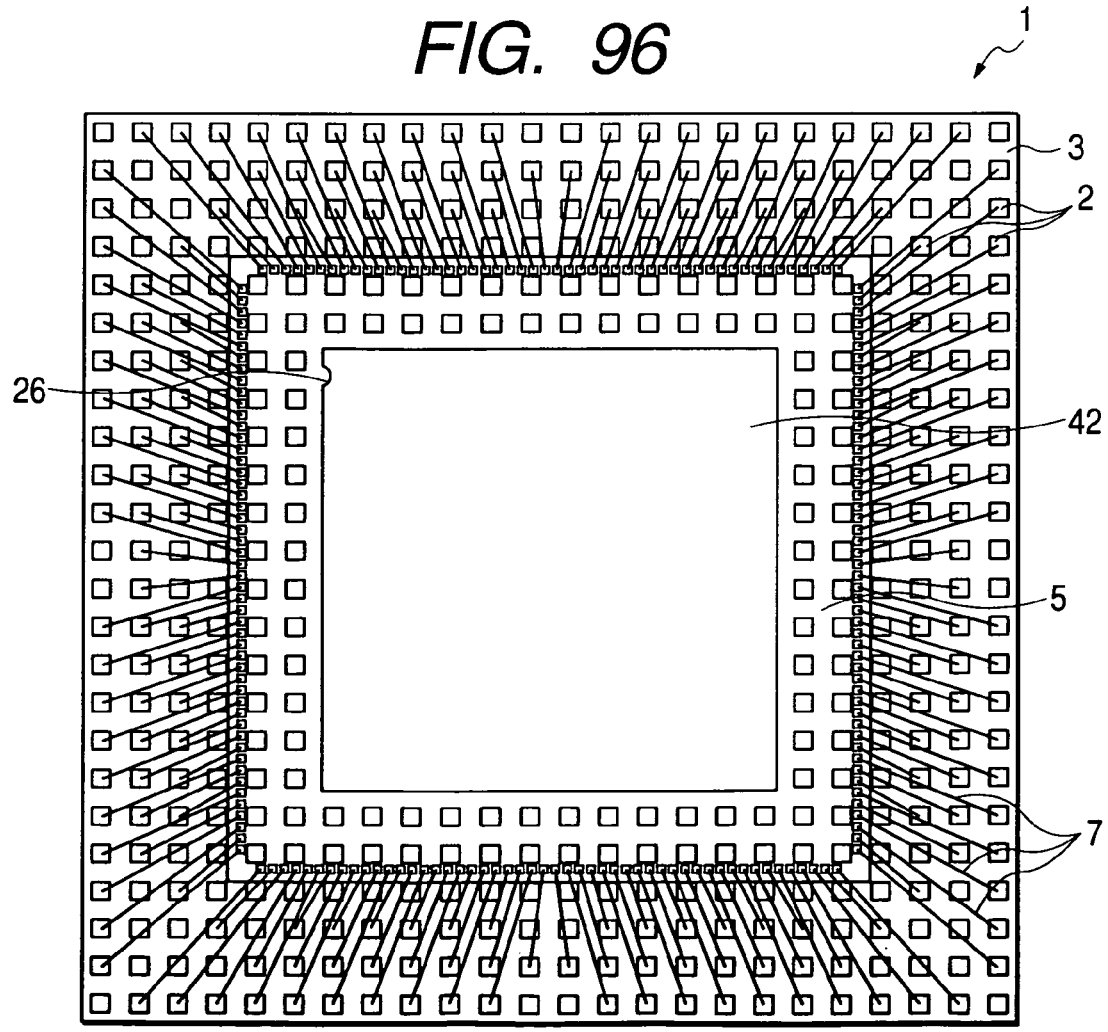
FIG. 96 is a perspective view showing the planar arrangement of external electrode terminals in the semiconductor device of the modification.
Figure 97:
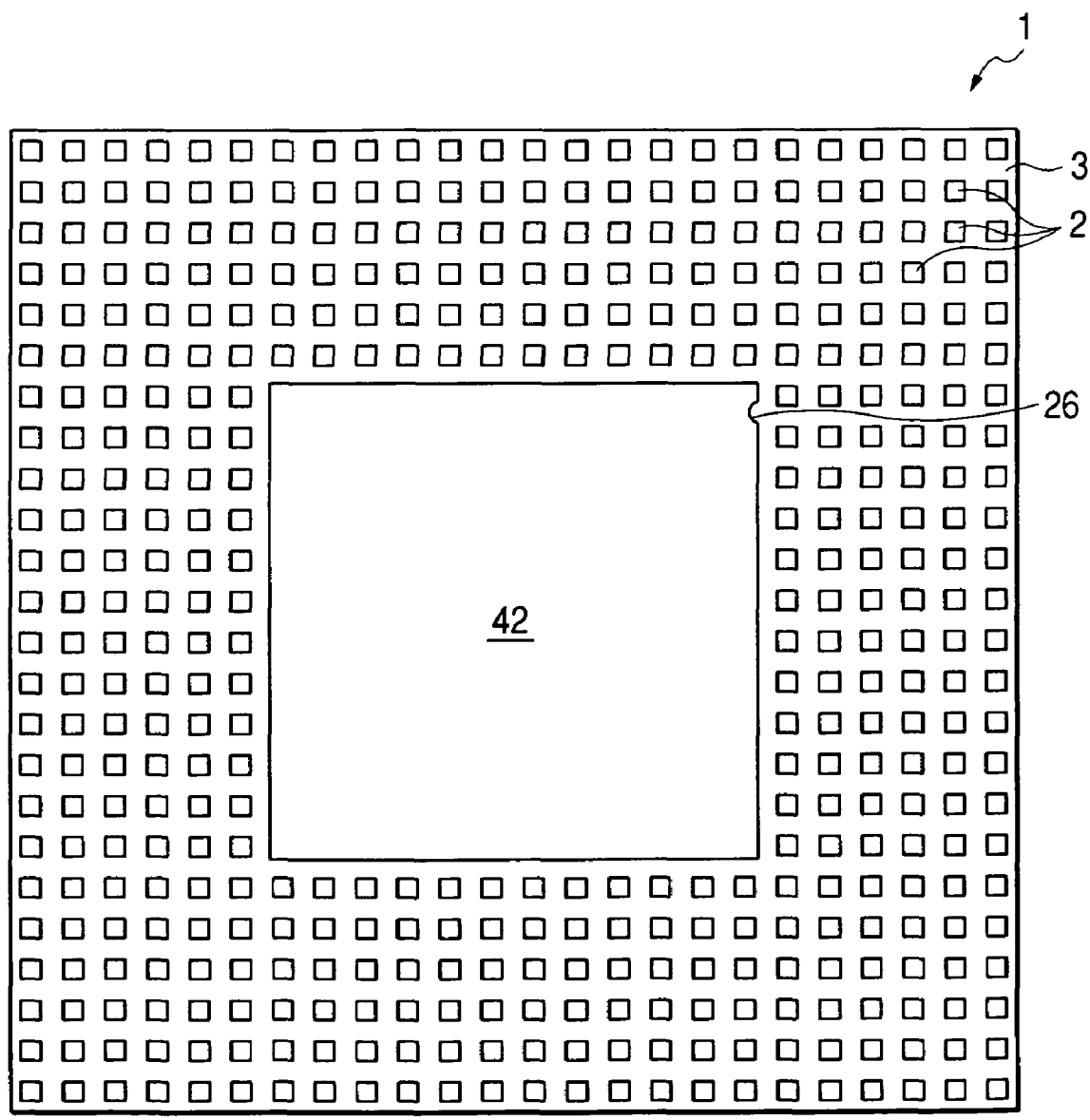
FIG. 97 is a base plan view of the semiconductor device of the modification.
Figure 98A:
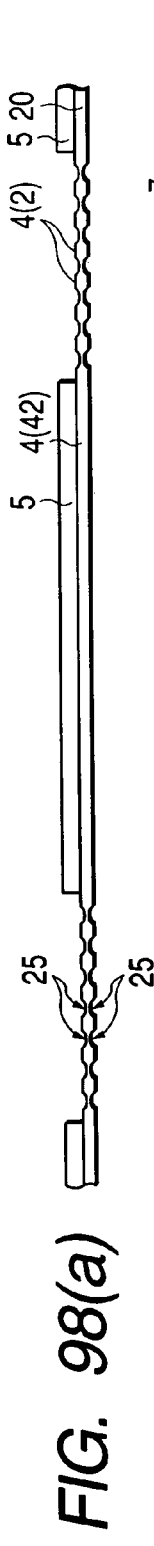
FIGS. 98A to 98G are cross-sectional views of steps showing a method of manufacturing a non-leaded semiconductor device according to another embodiment (Embodiment 23) of this invention.
Figure 98B:
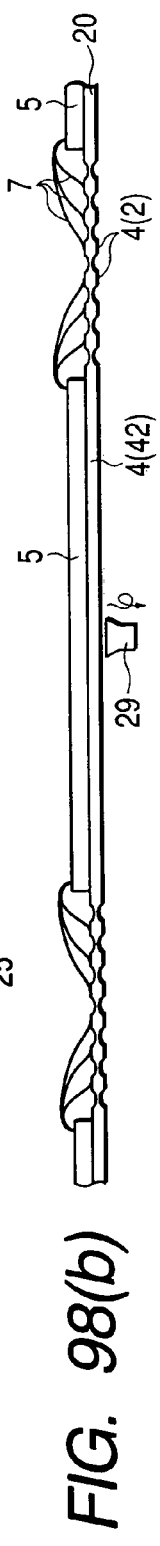
Figure 98C:
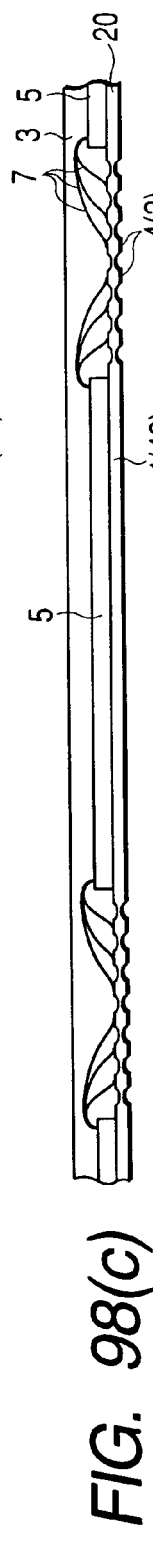
Figure 98D:
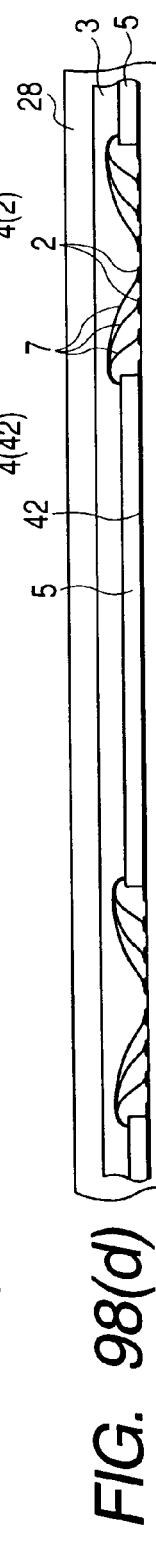
Figure 98E:
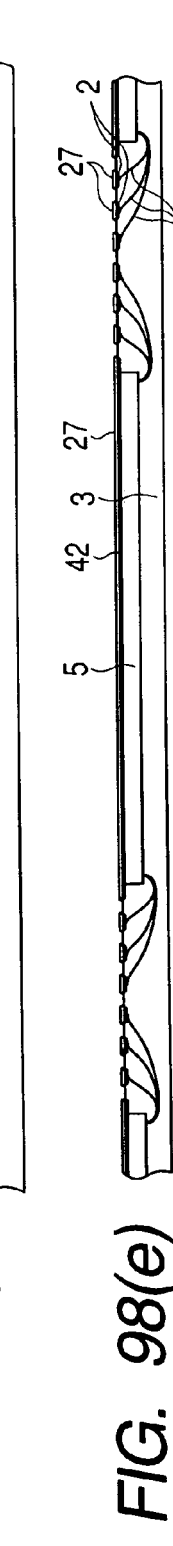
Figure 98F:
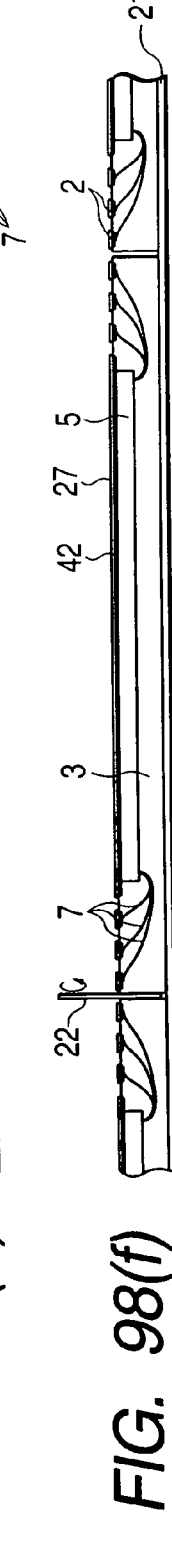
Figure 98G:
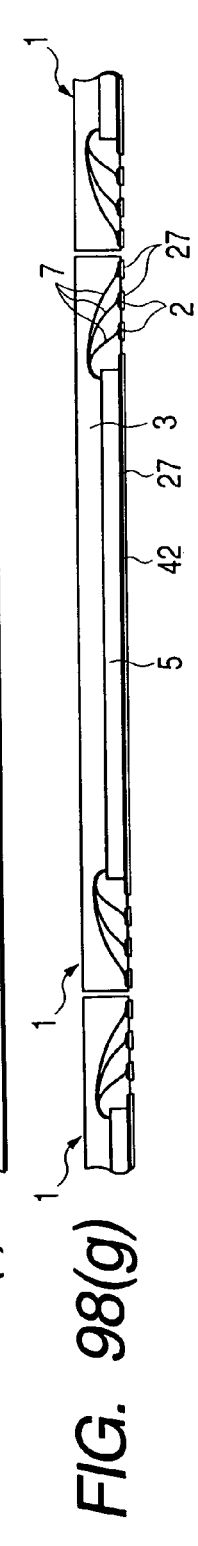

FIG. 95 to FIG. 97 are diagrams relating to a non-leaded semiconductor device in a modification of Embodiment 22. FIG. 95 is a schematic cross-sectional view of the non-leaded semiconductor device, FIG. 96 is a perspective view showing the planar arrangement of the external electrode terminals, and FIG. 97 is a base plan view of the semiconductor device. In this modification, the chip fixing partition part 42 is smaller than the semiconductor element 5. According to this construction, the substrate used for manufacturing the semiconductor device can also be used to manufacture semiconductor elements of different sizes, and therefore the universality of the substrate is increased.

Embodiment 23

Figure 99:
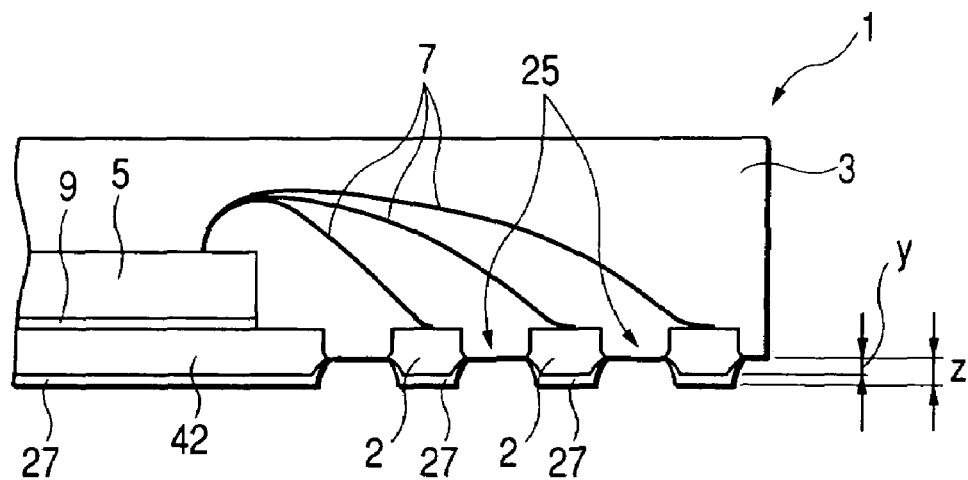
FIG. 99 is an enlarged cross-sectional view showing part of the non-leaded semiconductor device of Embodiment 23.

FIG. 98 is a cross-sectional view of the steps involved in the method of manufacturing a non-leaded semiconductor device according to another embodiment (Embodiment 23) of this invention, and FIG. 99 is an enlarged cross-sectional view showing a part of the non-leaded semiconductor device.

Embodiment 23 is an example wherein, in Embodiment 22, the semiconductor device 1 is manufactured using the substrate 20 which has the grooves 25 and grooves 25a, not shown, in corresponding positions on the front and rear surfaces. FIGS. 98A to 98G in the manufacturing process are identical to FIGS. 88A to 88G. Hence, the semiconductor device of this invention can be manufactured even when grooves are not provided on only one surface.

Embodiment 24

Figure 100:
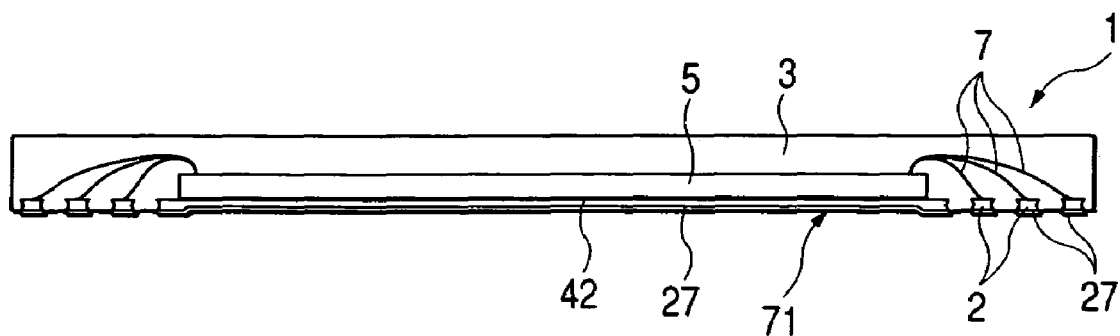
FIG. 100 is a schematic cross-sectional view of a non-leaded semiconductor device according to another embodiment (Embodiment 24) of this invention.
Figure 101:
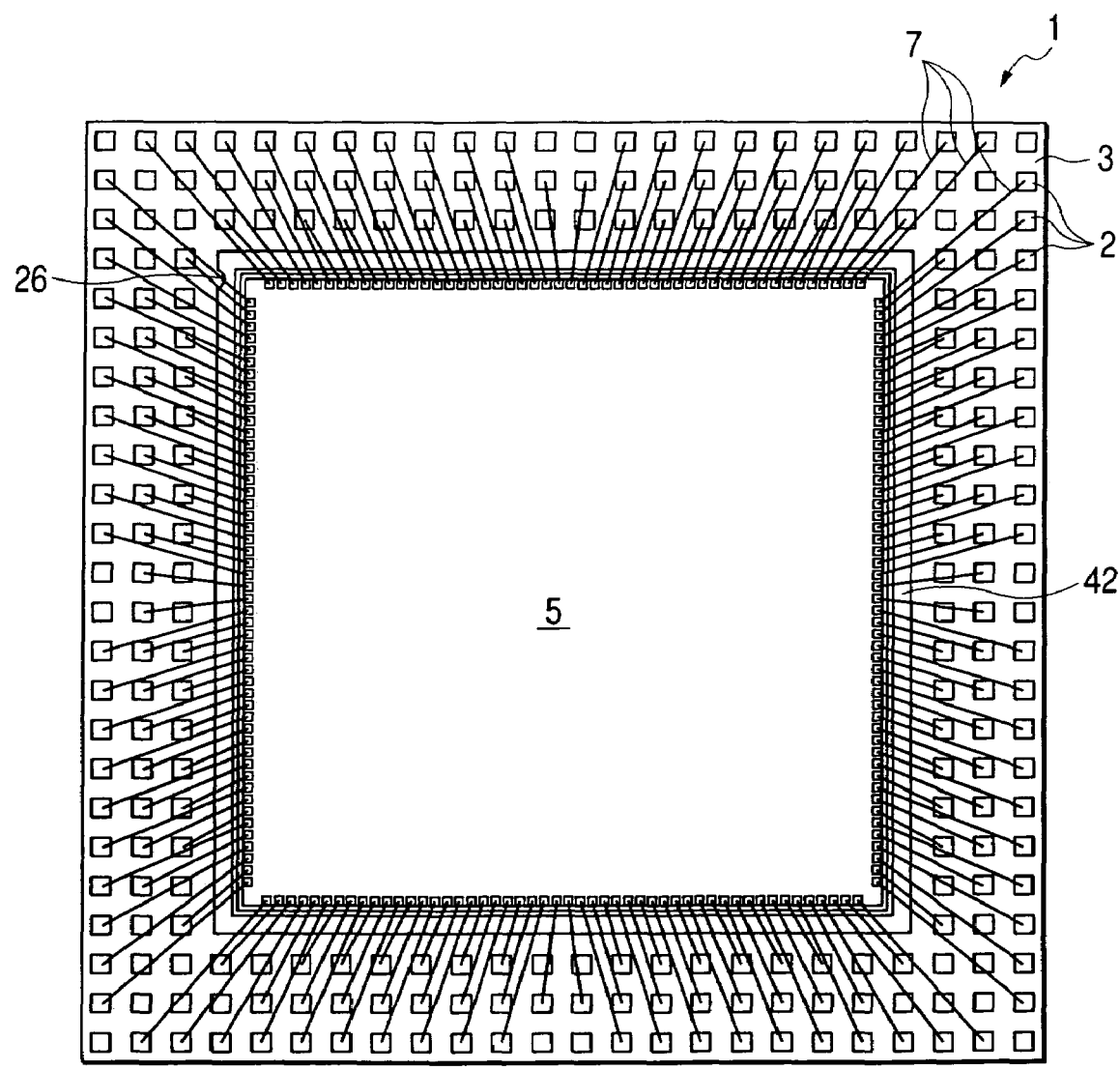
FIG. 101 is a perspective view showing the planar arrangement of external electrode terminals in the non-leaded semiconductor device of Embodiment 24.
Figure 102:
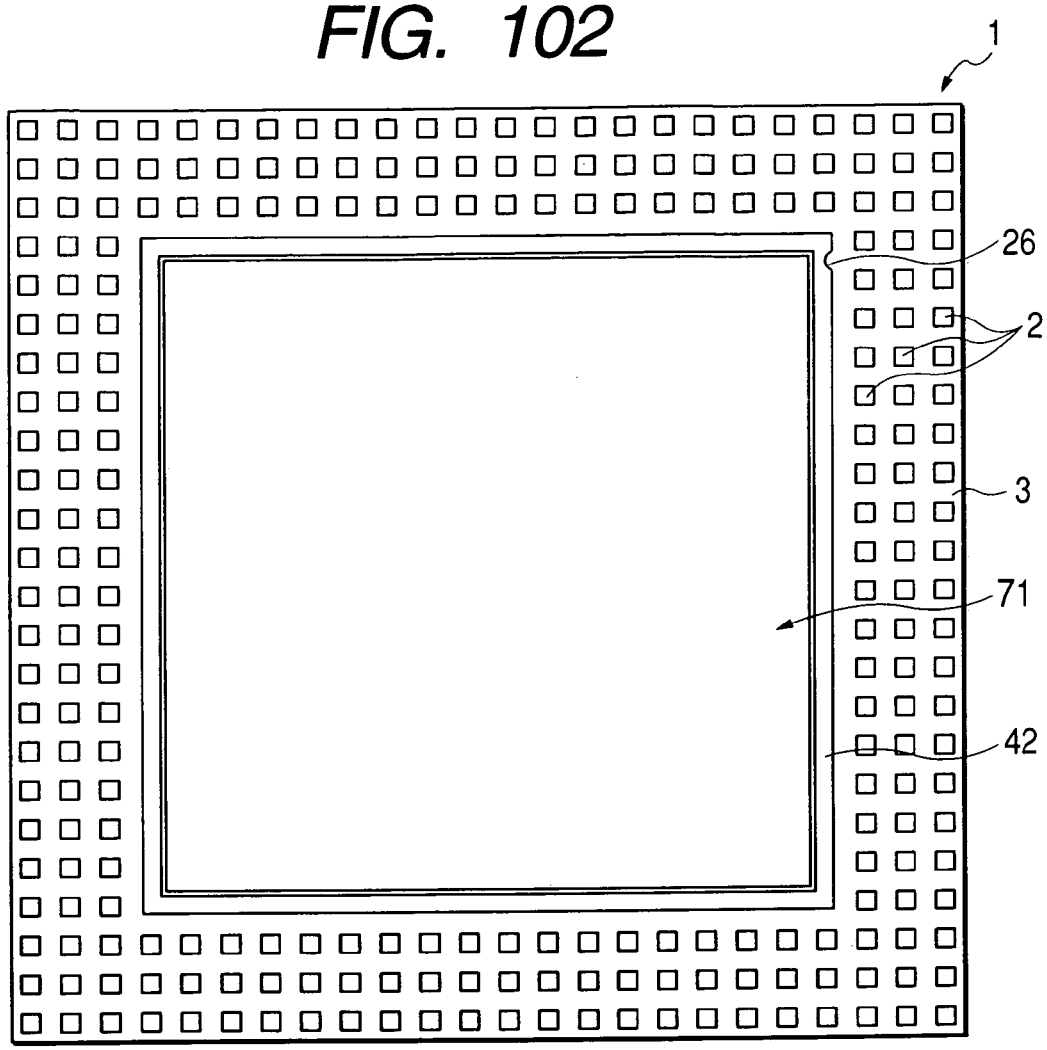
FIG. 102 is a base plan view of the non-leaded semiconductor device of Embodiment 24.
Figure 103:
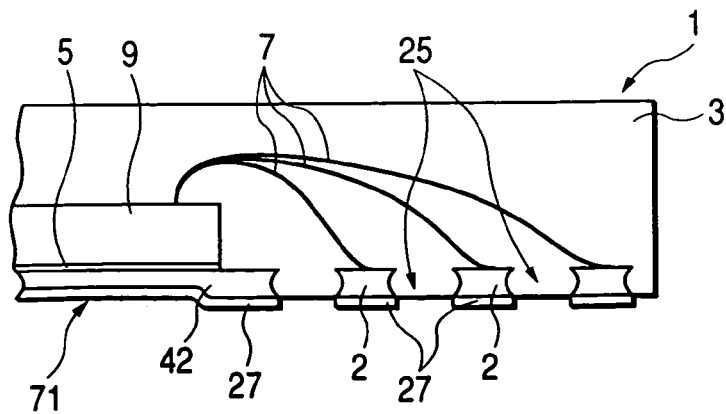
FIG. 103 is an enlarged cross-sectional view of part of the non-leaded semiconductor device of Embodiment 24.

FIG. 100 to FIG. 105 are diagrams relating to the non-leaded semiconductor device according to another embodiment (Embodiment 24) of this invention. FIG. 100 to FIG. 103 are diagrams relating to the manufacture of the non-leaded semiconductor device, FIG. 100 is a cross-sectional view of the semiconductor device 1, FIG. 101 is a perspective view of the semiconductor device 1, FIG. 102 is a base plan view of the semiconductor device 1, and FIG. 103 is a partial enlarged cross-sectional view.

Figure 105A:
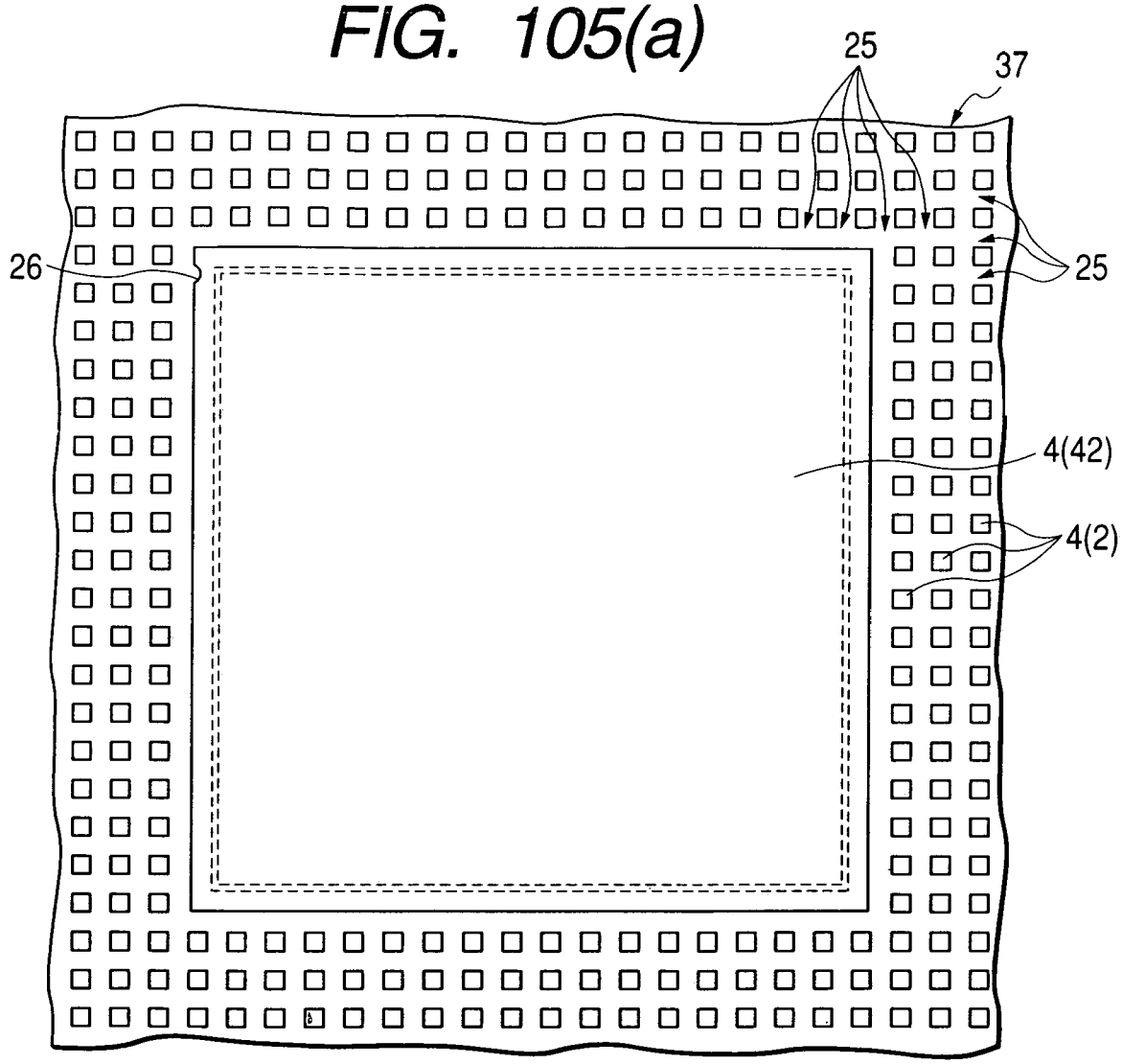
FIGS. 105A and 105B are schematic enlarged views showing a unit substrate region in a substrate used to manufacture the non-leaded semiconductor device of Embodiment 24.
Figure 105B:
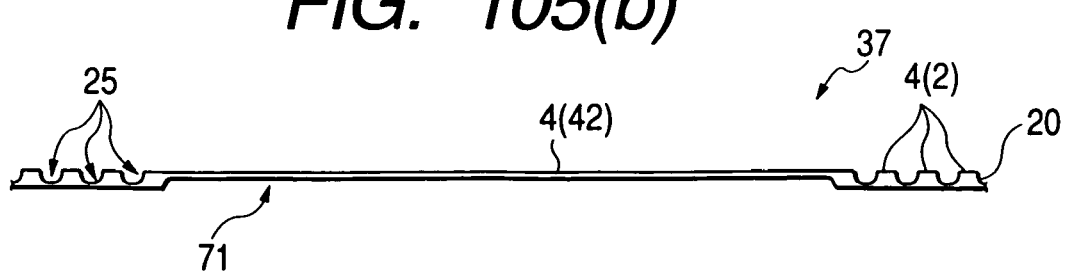

FIGS. 104A to 104G are cross-sectional views of steps showing the method of manufacturing the semiconductor device, FIGS. 105A and 105B are schematic views showing the unit substrate part 37 of the substrate 20 used in the manufacture of the semiconductor device, FIG. 105A is a perspective plan view, and FIG. 105B is a cross-sectional view.

In Embodiment 24, as shown in FIG. 105, in the unit substrate part 37 of the substrate 20, there is a depression 71 without an edge on the rear surface (mounting surface) of the chip fixing partition part 42. The manufacture of the semiconductor device according to this example shown in FIGS. 104A to 104G is identical to that of Embodiment 22 shown in FIGS. 88A to 88G, except that the separation of the partition parts 4 is achieved by polishing using a grinder 30 (FIG. 104D) instead of etching.

As shown in FIGS. 105A and 105B, by providing the depression 71 on the rear surface of the chip fixing partition part 42, the surface area to be polished is largely reduced, the life of the grinder 30 is extended, the polishing time is shortened and the manufacturing cost is reduced.

When the device becomes a product, even if a foreign object adheres to the chip fixing partition part 42 and has adhered to the depression 71 separate from the edge, in the case of a small foreign object, it no longer causes interference with the mounting board, so the semiconductor device 1 can be mounted without fail.

When the isolation of the partition parts 4 is performed by etching, in the case of this embodiment, as the depression 71 is present on the rear surface of the chip fixing partition part 42, the amount of the substrate part dissolved can be controlled by etching, by selecting the size of the depression 71. Only the edge of the depression 71 need be etched, and the flatness of the edge of the rear surface of the chip fixing partition part 42 can be maintained.

Embodiment 25

Figure 108:
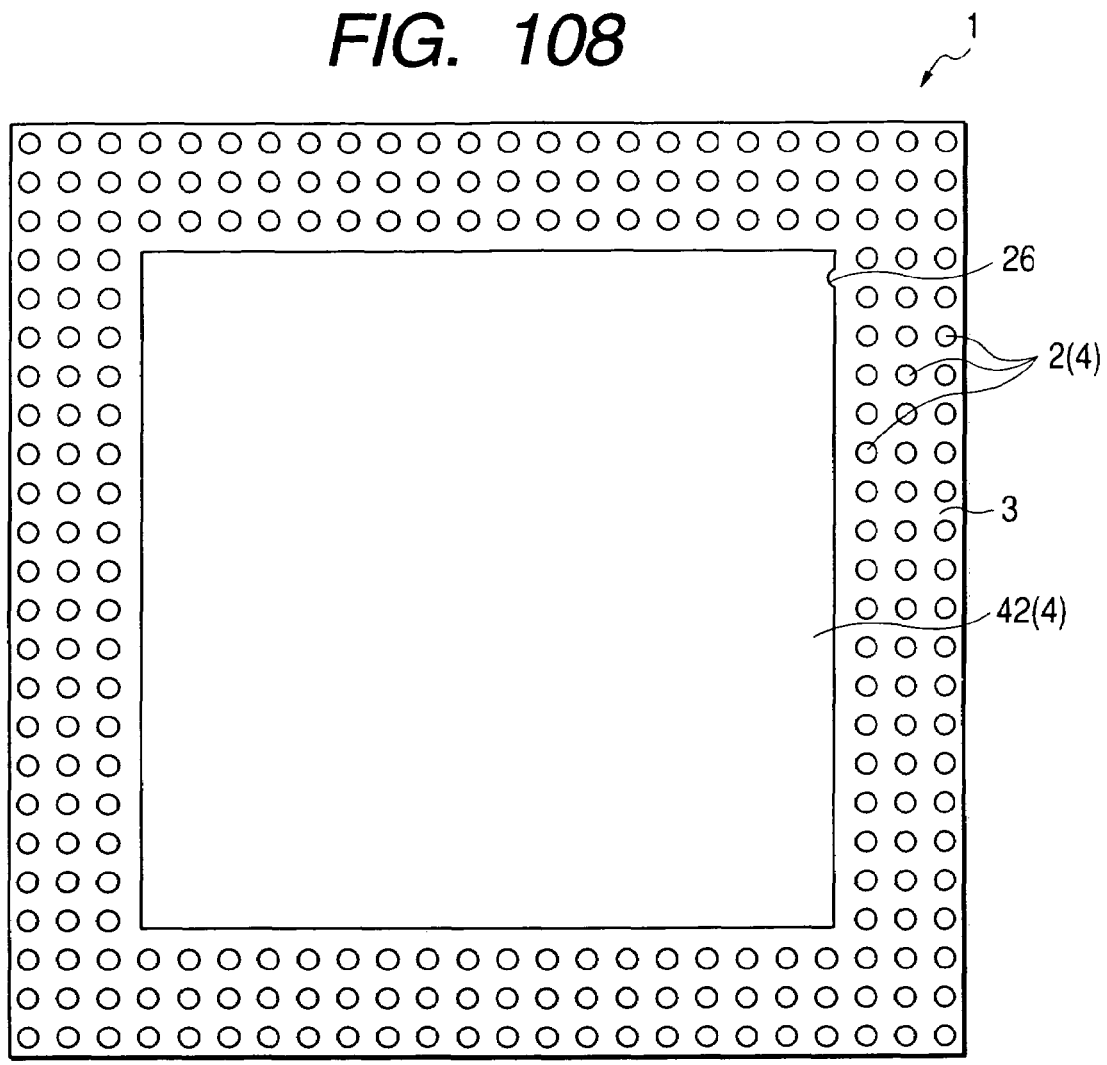
FIG. 108 is a base plan view of the non-leaded semiconductor device of Embodiment 5.
Figure 109:
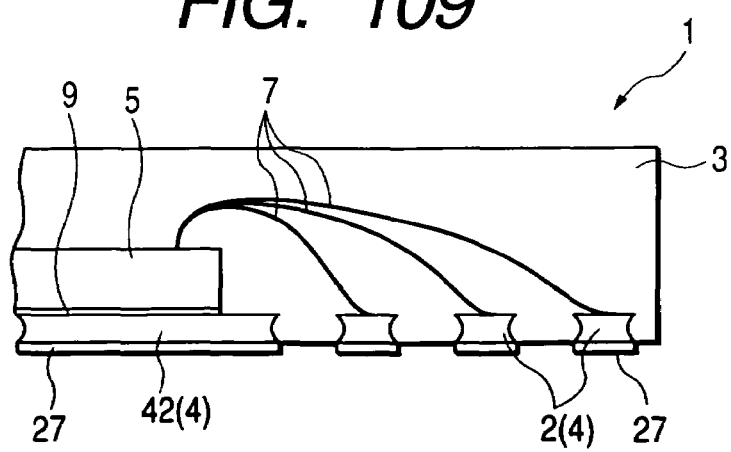
FIG. 109 is an enlarged cross-sectional view of part of the non-leaded semiconductor device of Embodiment 25.
Figure 110:
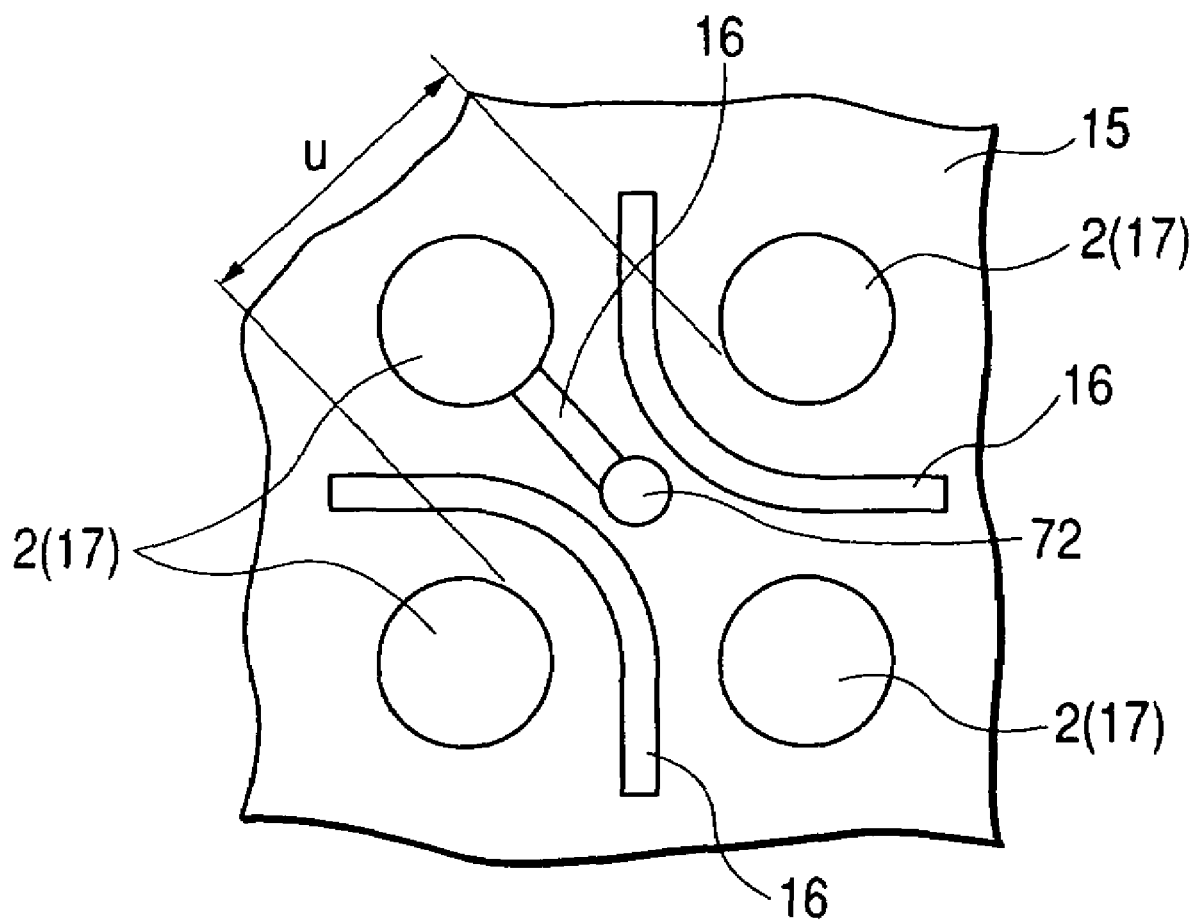
FIG. 110 is a descriptive diagram showing the relation between the interconnections on the mounting board and the external electrode terminals of the non-leaded semiconductor device during the mounting of the non-leaded semiconductor device of Embodiment 25.

FIG. 106 to FIG. 110 are diagrams relating to a non-leaded semiconductor device according to another embodiment (Embodiment 25) of this invention. FIG. 106-FIG. 109 are diagrams relating to the manufacture of the non-leaded semiconductor device, FIG. 106 is a schematic cross-sectional view of the semiconductor device, FIG. 107 is a perspective view showing the planar arrangement of external electrode terminals, FIG. 108 is a base plan view of the semiconductor device, and FIG. 109 is an enlarged cross-sectional view of part of the semiconductor device. FIG. 110 is a descriptive diagram describing the relation between the interconnections of the mounting board of the non-leaded semiconductor device and the external electrode terminals of the non-leaded semiconductor device of Embodiment 25.

In Embodiment 25, as shown in FIG. 107 and FIG. 108, the external electrode terminals 2 in Embodiment 22 are circular. Consequently, a gap u between the edges of the external electrode terminals 2 in the diagonal direction is wider than in the case where they are rectangular. As a result, as shown in FIG. 110, in the mounting board (interconnection board) 15 on which the semiconductor device 1 is mounted, interconnections 16 can be disposed also between the lands 17 for mounting the external electrode terminals 2, there is more freedom in the layout of interconnections on the mounting board 15, and design of interconnections is easier. In FIG. 110, 72 is a through hole 72, and it is a part filled by a conductor which connects upper and lower interconnections on the interconnection board 15. Thus, by making the external electrode terminals 2 circular, the pitch between adjacent external electrode terminals 2 in the diagonal direction is wider, so the interconnections 16 and through hole 72 can also be disposed between the external electrode terminals 2.

The shape of the external electrode terminals 2 is not necessarily circular, and can be any shape which allows a wider pitch between diagonally adjacent external electrode terminals.

In the non-leaded semiconductor devices described in Embodiment 22 to Embodiment 25, at least part of the lateral surface of the external electrode terminals 2 can be supported by the resin sealing package 3, also, by performing a step which separates the external electrode terminals 2 by etching which causes less damage to the external electrode terminals 2 than dicing, the external electrode terminals 2 are prevented from falling out of the resin sealing package 3.

In particular, the external electrode terminals 2 shown in FIG. 87 have a part of narrower width (part of width B) than the width of their upper surface, and as the part of width B is supported by the resin sealing package 3, the external electrode terminals 2 are definitively prevented from falling out of the resin sealing package 3.

When the grooves 25 are formed in the substrate 20, the external electrode terminals 2 having the part of narrower width can be formed by controlling the etching rate on the upper surface of the substrate 20 to be slower than the etching rate in the part of width B. To control the etching rate, wet etching is effective.

By using wet etching wherein the substrate 20 is immersed in an etching solution with an etching mask on the upper surface of the substrate, the refresh rate of etching solution in the vicinity of the substrate upper surface can be made slower than the refresh rate of the etching solution in the vicinity of the part of width B, and by using the difference in etching rates due to the difference in the refresh rates of the etching solution, the electrode shapes shown in FIG. 87 can easily be formed.

This invention as conceived by the Inventor has been described in detail based on the embodiments, but it should be understood that the invention is not limited by these embodiments, various modifications being possible within the scope and spirit of the appended claims.

In the embodiments, an example was described where this invention was applied to the manufacture of a QFN semiconductor device, but this invention may also be applied for example to the manufacture of a SON semiconductor device in which case an identical effect is obtained.

Typical advantages of the invention as disclosed in this application may be summarized as follows. This invention is not limited to a construction providing all the effects described, and also includes constructions which provide some of the effects described.

(1) A compact non-leaded semiconductor device can be provided.

(2) A non-leaded semiconductor device having plural external electrode terminals can be provided.

(3) A method of manufacturing a non-leaded semiconductor device having at least two rows of external electrode terminals along the sides of the semiconductor device, can be provided.

(4) A method of manufacturing a non-leaded semiconductor device wherein the external electrode terminals are formed to a high precision of shape and dimensions, can be provided.

(5) A non-leaded semiconductor device having a high mounting reliability, can be provided.

The invention claimed is:

1. A method of manufacturing a semiconductor device comprising the steps of:

providing a metal substrate comprising a front surface, a rear surface opposite to the front surface, a chip fixing partition part on the front surface thereof, a depression formed into the rear surface thereof, grooves formed over the front surface, and partition parts surrounded by the grooves, the grooves being formed around the chip fixing partition part, a dimension of each of the partition parts being smaller than a dimension of the chip fixing partition part, and a bottom surface of the depression is substantially the same size as the chip fixing partition part which corresponds to the bottom surface of the depression across the metal substrate;

forming a notch as a direction identifying part on one side of the chip fixing partition part;

providing a semiconductor chip comprising a front surface, a rear surface, electrodes formed on the front surface thereof;

fixing the semiconductor chip over the chip fixing partition part on the front surface of the metal substrate;

electrically connecting the electrodes of the semiconductor chip with the partition parts of the metal substrate by conductive wires, respectively;

forming a resin body which seals the semiconductor chip, the conductive wires, each of the grooves, and the partition parts of the metal substrate;

after the resin body forming step, etching the rear surface of the metal substrate so that the partition parts are separated from each other and a part of the resin body formed in the each of the grooves is protruded from a level of the etched rear surface of each of the partition parts, a height of each of the partition parts being lower than a height of the resin body formed in the grooves; and after the etching step, forming a solder plating film on the etched rear surface of each of the partition parts by a print-plating method, the solder plating film being thicker than a height of the part of the resin body protruded from the level of the etched rear surface of each of the partition parts.

2. A method of manufacturing a semiconductor device according to claim 1, wherein the metal substrate providing step, the rear surface of the metal substrate, which is opposite to the front surface having the grooves and the partition parts formed thereon, has no grooves formed thereon.

3. A method of manufacturing a semiconductor device according to claim 1, wherein the front surface of the partition parts has a square shape.

4. A method of manufacturing a semiconductor device according to claim 1, wherein each dimension of said each partition part is smaller than a corresponding dimension of the chip fixing partition part.

* * * * *